(12) United States Patent
Tanaka et al.

(10) Patent No.: US 10,354,735 B2
(45) Date of Patent: *Jul. 16, 2019

(54) SEMICONDUCTOR DEVICE

(71) Applicant: Renesas Electronics Corporation, Koutou-ku, Tokyo (JP)

(72) Inventors: Toshihiro Tanaka, Akiruno (JP); Yukiko Umemoto, Kodaira (JP); Mitsuru Hiraki, Kodaira (JP); Yutaka Shinagawa, Iruma (JP); Masamichi Fujito, Kodaira (JP); Kazufumi Suzukawa, Ichikawa (JP); Hiroyuki Tanikawa, Akishima (JP); Takashi Yamaki, Kodaira (JP); Yoshiaki Kamigaki, Takamatsu (JP); Shinichi Minami, Kodaira (JP); Kozo Katayama, Tokyo (JP); Nozomu Matsuzaki, Kokubunji (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/116,893

(22) Filed: Aug. 29, 2018

(65) Prior Publication Data

US 2018/0374542 A1 Dec. 27, 2018

Related U.S. Application Data

(63) Continuation of application No. 15/796,193, filed on Oct. 27, 2017, now Pat. No. 10,115,469, which is a (Continued)

(30) Foreign Application Priority Data

Jul. 27, 2001 (JP) .................................. 2001-227203
Jul. 30, 2001 (JP) .................................. 2001-228870

(51) Int. Cl.
*G11C 16/26* (2006.01)
*G11C 16/04* (2006.01)
(Continued)

(52) U.S. Cl.
CPC ............... *G11C 16/26* (2013.01); *G11C 5/025* (2013.01); *G11C 8/08* (2013.01); *G11C 16/04* (2013.01);
(Continued)

(58) Field of Classification Search
CPC ....................................................... G11C 16/10
(Continued)

(56) References Cited

U.S. PATENT DOCUMENTS 4,659,828 A   4/1987 Fong
5,357,134 A   10/1994 Shimoji
(Continued)

FOREIGN PATENT DOCUMENTS

EP   0 582 991 A2   2/1994
JP   56-135973 A   10/1981
(Continued)

OTHER PUBLICATIONS

T.Y. Luo et al., "Effect of H2 Content on Reliability of Ultrathin In-Situ Steam Generated (ISSG) Si02," *IEEE Electron Device Letters* vol. 21, No. 9, Sep. 2000, pp. 430 to 432.
(Continued)

*Primary Examiner* — Hoai V Ho
*Assistant Examiner* — Muna A Techane
(74) *Attorney, Agent, or Firm* — Shapiro, Gabor and Rosenberger, PLLC

(57) ABSTRACT

A semiconductor device includes a plurality of nonvolatile memory cells (1). Each of the nonvolatile memory cells comprises a MOS type first transistor section (3) used for information storage, and a MOS type second transistor
(Continued)

section (4) which selects the first transistor section. The second transistor section has a bit line electrode (16) connected to a bit line, and a control gate electrode (18) connected to a control gate control line. The first transistor section has a source line electrode (10) connected to a source line, a memory gate electrode (14) connected to a memory gate control line, and a charge storage region (11) disposed directly below the memory gate electrode. A gate withstand voltage of the second transistor section is lower than that of the first transistor section. Assuming that the thickness of a gate insulating film of the second transistor section is defined as tc and the thickness of a gate insulating film of the first transistor section is defined as tm, they have a relationship of tc<tm.

6 Claims, 42 Drawing Sheets

Related U.S. Application Data continuation of application No. 15/224,669, filed on Aug. 1, 2016, now Pat. No. 9,812,211, which is a continuation of application No. 14/214,969, filed on Mar. 16, 2014, now Pat. No. 9,412,459, which is a continuation of application No. 13/867,055, filed on Apr. 20, 2013, now Pat. No. 8,698,224, which is a continuation of application No. 13/223,380, filed on Sep. 1, 2011, now Pat. No. 8,426,904, which is a continuation of application No. 12/718,111, filed on Mar. 5, 2010, now Pat. No. 8,017,986, which is a continuation of application No. 12/142,506, filed on Jun. 19, 2008, now Pat. No. 7,700,992, which is a continuation of application No. 11/415,129, filed on May 2, 2006, now Pat. No. 7,414,283, which is a continuation of application No. 10/484,578, filed as application No. PCT/JP02/07371 on Jul. 22, 2002, now Pat. No. 7,057,230.

(51) Int. Cl.
| | | |
|---|---|---|
| *H01L 21/28* | (2006.01) | |
| *H01L 27/105* | (2006.01) | |
| *H01L 27/115* | (2017.01) | |
| *H01L 27/11521* | (2017.01) | |
| *H01L 27/11526* | (2017.01) | |
| *H01L 27/11546* | (2017.01) | |
| *H01L 29/423* | (2006.01) | |
| *H01L 29/66* | (2006.01) | |
| *H01L 29/788* | (2006.01) | |
| *H01L 29/792* | (2006.01) | |
| *G11C 16/24* | (2006.01) | |
| *G11C 5/02* | (2006.01) | |
| *G11C 8/08* | (2006.01) | |
| *G11C 16/08* | (2006.01) | |
| *G11C 16/30* | (2006.01) | |

(52) U.S. Cl.
CPC .......... *G11C 16/0433* (2013.01); *G11C 16/08* (2013.01); *G11C 16/24* (2013.01); *G11C 16/30* (2013.01); *H01L 21/28* (2013.01); *H01L 21/28273* (2013.01); *H01L 27/105* (2013.01); *H01L 27/115* (2013.01); *H01L 27/11521* (2013.01); *H01L 27/11526* (2013.01); *H01L 27/11546* (2013.01); *H01L 29/4234* (2013.01); *H01L 29/42328* (2013.01); *H01L 29/42332* (2013.01); *H01L 29/66825* (2013.01); *H01L 29/7885* (2013.01); *H01L 29/792* (2013.01); *G11C 16/0425* (2013.01)

(58) Field of Classification Search
USPC .................................................. 365/185.18
See application file for complete search history.

(56) References Cited

U.S. PATENT DOCUMENTS

| | | |
|---|---|---|
| 5,408,115 A | 4/1995 | Chang |
| 5,691,939 A | 11/1997 | Chang et al. |
| 5,703,388 A | 12/1997 | Wang et al. |
| 5,852,578 A | 12/1998 | Hoang |
| 5,991,204 A | 11/1999 | Chang |
| 6,044,015 A | 3/2000 | Van Houdt et al. |
| 6,046,936 A | 4/2000 | Tsujikawa et al. |
| 6,048,766 A | 4/2000 | Gardner |
| 6,057,575 A | 5/2000 | Jenq |
| 6,091,104 A | 7/2000 | Chen |
| 6,097,636 A | 8/2000 | Nojima |
| 6,255,166 B1 | 7/2001 | Ogura et al. |
| 6,316,317 B1 | 11/2001 | Kawata et al. |
| 6,329,247 B1 | 12/2001 | Ito |
| 6,388,293 B1 | 5/2002 | Ogura |
| 6,469,341 B1 | 10/2002 | Sung et al. |
| 6,493,262 B1 | 12/2002 | Wald et al. |
| 6,531,735 B1 | 3/2003 | Kamigaki |
| 6,563,168 B2 | 5/2003 | Lee |
| 6,567,315 B2 | 5/2003 | Takase |
| 7,057,230 B2 | 6/2006 | Tanaka et al. |
| 2001/0000625 A1 | 5/2001 | Yaegashi et al. |
| 2001/0002884 A1 | 6/2001 | Hiraki et al. |
| 2002/0041527 A1 | 4/2002 | Tanaka et al. |
| 2002/0060947 A1 | 5/2002 | Hatae |
| 2003/0198086 A1 | 10/2003 | Shukuri |
| 2004/0155234 A1 | 8/2004 | Ishimaru et al. |
| 2004/0196695 A1 | 10/2004 | Tanaka |
| 2004/0202020 A1 | 10/2004 | Fujito et al. |
| 2004/0208056 A9 | 10/2004 | Sim et al. |
| 2009/0212351 A1 | 8/2009 | Chen |

FOREIGN PATENT DOCUMENTS

| | | |
|---|---|---|
| JP | 61-131484 A | 6/1986 |
| JP | 61-172375 A | 8/1986 |
| JP | 1-133364 | 5/1989 |
| JP | 3-228377 A | 10/1991 |
| JP | 5-28786 A | 2/1993 |
| JP | 5-82798 A | 4/1993 |
| JP | 5-136422 | 6/1993 |
| JP | 06-181319 A | 6/1994 |
| JP | 9-326487 | 12/1997 |
| JP | 10-22404 A | 1/1998 |
| JP | 11-177047 A | 7/1999 |
| JP | 11-220044 A | 8/1999 |
| JP | 11-232886 | 8/1999 |
| JP | 2000-269361 A | 9/2000 |
| JP | 2001-15613 A | 1/2001 |
| JP | 2001-44395 A | 12/2001 |
| WO | WO 99/16077 | 4/1999 |

OTHER PUBLICATIONS

Kianian et al., "A Novel 3 Volts-only, Small Sector Erase, High Density Flash E2PROM", 1994 Symposium on VLSI Technology, Digest of Technical Papers, pp. 71-72.
Office Action dated May 10, 2012 in Japanese Appln. No. 2009-100471.
Chang et al., "A New SONOS Memory Using Source-Side Injection for Programming", IEEE Electron Device Letters, Jul. 1998, vol. 19, No. 7, pp. 253-255.
Office Action dated Feb. 13, 2012, in Chinese Patent Application No. 200810166448.5.
Office Action issued Jun. 24, 2015, in European Patent Application No. EP02749325.3.

(56) References Cited

OTHER PUBLICATIONS

Extended European Search Report for European Patent Application No. 16001382.7, Feb. 9, 2017.

(a) CELL STRUCTURE (b) OPERATING VOLTAGE (V)

| | | Vd | Vcg | Vmg | Vs | Vsub |
|---|---|---|---|---|---|---|
| | Read | 1.5 | 1.5 | 1.5 | 0 | 0 |
| | Erase | 0 | 1.5 | 12 | 0 | 0 |
| | Program | 0.8 | 1.5 | 12 | 6 | 0 |

(c) HIERARCHICAL BIT LINE STRUCTURE

HIGH-VOLTAGE MOS

HIGH-VOLTAGE MOS DRIVER

|  | Vsg | Vmg | Vd | Vs | Vwell | TECHNIQUE |
|---|---|---|---|---|---|---|
| WRITE (INJECTION) | ~Vt | 10 | 5 | 0 | 0 | SOURCE SIDE INJECTION |
| ERASE (EJECTION) | 10 | −10 | 0 | 0 | 10 | TUNNEL EJECTION TO P WELL |
|  | 0 | −20 | 0 | 0 | 0 |  |
| READ | 1.8 | 0 | 0 | 1.8 | 0 | READ IN DIRECTION OPPOSITE TO SOURCE/DRAIN AT WRITE |
|  | 1.8 | 0 | 1.8 | 0 | 0 | READ IN SAME DIRECTION AS SOURCE/DRAIN AT WRITE |

|  | Vsg | Vmg | Vd | Vs | Vwell | TECHNIQUE |
|---|---|---|---|---|---|---|
| WRITE (INJECTION) | ~Vt | 10 | 5 | 0 | 0 | SOURCE SIDE INJECTION |
| ERASE (EJECTION) | 0 | 12 | 0 | 0 | 0 | TUNNEL EJECTION TO MEMORY GATE |
|  | 0 | −12 | 0 | 0 | 0 | TUNNEL EJECTION TO P WELL |
| READ | 1.8 | 0 | 0 | 1.8 | 0 | READ IN DIRECTION OPPOSITE TO SOURCE/DRAIN AT WRITE |
|  | 1.8 | 0 | 1.8 | 0 | 0 | READ IN SAME DIRECTION AS SOURCE/DRAIN AT WRITE |

SEMICONDUCTOR DEVICE

TECHNICAL FIELD

The present invention relates to a semiconductor device having a nonvolatile memory, and particularly to a technology for reading memory information at high speed, e.g., a technology effective if applied to a flash memory or a microcomputer or the like including the flash memory provided on-chip.

BACKGROUND ART

As nonvolatile memory cells, may be mentioned, a split gate type memory cell and a stack gate type memory cell. The split gate type memory cell comprises two transistors of a memory MOS type transistor that constitutes a memory section, and a selection MOS type transistor for selecting its memory section to thereby fetch information therefrom. As a known document, there is known a technology described in 1994-Proceedings of IEEE, VLSI, Technology Symposium, pp 71-72. A structure and operation of a memory cell described therein will be explained in brief. This split gate type memory cell comprises a source, a drain, a floating gate and a control gate. As the injection of electrical charges into the floating gate, may be mentioned a source side injection system using the generation of hot electrons. The charges stored in the floating gate are ejected from a pointed end of the floating gate to the control gate. At this time, there is a need to apply a high voltage of 12 volts to the control gate. The control gate that functions as a charge ejection electrode, serves even as a gate electrode of a reading selection MOS type transistor. A gate oxide film for a selection MOS type transistor section is a deposited oxide film, which functions even as a film for electrically isolating the floating gate and a gate electrode of the selection MOS type transistor. As other known technologies related to the split gate type memory cell, there are known, for example, U.S. Pat. Nos. 4,659,828 and 5,408,115, Japanese Unexamined Patent Publication No. Hei 5(1993)-136422, etc.

The stack gate type memory cell comprises a source, a drain, and a floating gate and a control gate stacked on a channel forming region. The generation of hot electrons is used for the injection of electrical charges into the floating gate. The electrical charges stored in the floating gate are ejected toward a substrate. At this time, there is a need to apply a negative high voltage of −10 volts to the control gate. Reading is performed by applying a read voltage like 3.3 volts to the control gate. The stack gate type memory cell has been described in Japanese Unexamined Patent Publication No. Hei 11(1999)-232886, etc.

In terms of the speeding up of data processing, the speeding up of a read operation of a nonvolatile memory device becomes important even to the nonvolatile memory device. In the split gate type memory cell, the gate electrode of the selection MOS transistor is configured so as to function even as an erase electrode. Therefore, a gate insulating film had no other choice but to set its thickness to the same thickness as that of a write/erase-voltage control high-voltage MOS transistor in order to ensure a withstand voltage therefor. Thus, Gm (mutual conductance defined as current supply capacity) of the selection MOS transistor becomes small, so the split gate type memory cell is hardly a structure wherein a read current can be obtained sufficiently. If nothing is done, then the split gate type memory cell is not fit for a high-speed operation under a low voltage. Since a thick gate oxide film for realizing a high withstand voltage is adopted for the control gate to which a high voltage is applied upon write/erase operations, it reduces Gm at a read operation, so the stack gate type cell is hardly a structure wherein a read current can be ensured sufficiently.

U.S. Pat. Nos. 4,659,828 and 5,408,115 of the known documents respectively describe the invention related to the write/erase operations but do not refer to an improvement in the performance of the read operation. Further, although Japanese Unexamined Patent Publication No. Hei 5(1993)-136422 of the known document discloses a shape most analogous to that of the present invention, it shows the invention related to a method of insulating two gate electrodes adjacent to each other, and does not disclose read performance. A nonvolatile memory device unprovided for the prior art is needed which is adapted to a logical operation device brought to high performance.

A structure has been adopted wherein bit lines are hierarchized into main and sub bit lines, only a sub bit line connected with a memory cell to be operated and selected is selected and connected to its corresponding main bit line, and the parasitic capacity of the bit line by the memory cell is apparently reduced, whereby a high-speed read operation is realized. However, it has been found out by the present inventors that there is a fear that where it is necessary to apply a high voltage even to a bit line upon writing as in the stack gate type memory cell, a MOS transistor for selectively connecting a sub bit line to its corresponding main bit line must be brought to high withstanding, whereby Gm of a read path is further reduced and the speeding up by a hierarchized bit line structure based on the main/sub bit lines will not function sufficiently.

An object of the present invention is to eliminate a thick-film high-voltage MOS transistor that impairs speeding up, from a memory information read path.

Another object of the present invention is to provide a semiconductor device capable of reading memory information from a nonvolatile memory cell at high speed.

The above, other objects and novel features of the present invention will become apparent from the description of the present Specification and the accompanying drawings.

DISCLOSURE OF THE INVENTION

Summaries of representative ones of the inventions disclosed in the present application will be explained in brief as follows:

[1] A semiconductor device includes a plurality of nonvolatile memory cells (1). Each of the nonvolatile memory cells comprises a MOS type first transistor section (3) used for information storage, and a MOS type second transistor section (4) which selects the first transistor section. The second transistor section has a bit line electrode (16) connected to a bit line (EL), and a control gate electrode (18) connected to a control gate control line (CL). The first transistor section has a source line electrode (10) connected to a source line, a memory gate electrode (14) connected to a memory gate control line (ML), and a charge storage region (11) disposed directly below the memory gate electrode. A gate withstand voltage of the second transistor section is lower than that of the first transistor section. In other words, assuming that the thickness of a gate insulating film (17) of the control gate electrode of the second transistor section is defined as tc and the thickness of a gate insulating film (11, 12, 13) of the memory gate electrode of the first transistor section is defined as tm, they have a relationship of tc<tm. Here, MOS is a generic name for an insulated gate field effect type transistor structure.

According to the above, when the second transistor section of the nonvolatile memory cell is brought to an on state upon a data read operation, memory information is read out to the corresponding bit line according to whether the current flows in accordance with a threshold voltage state of the first transistor section. The second transistor section is thinner than the first transistor section in gate oxide-film thickness and lower than it in gate withstand voltage too. Therefore, as compared with a case in which both a memory holding MOS transistor section and a selection MOS transistor section are formed at a high withstand voltage, a relatively large Gm can be easily obtained at a relatively low gate voltage with respect to the selection MOS transistor section, and the current supply capacity of the entire nonvolatile memory cell, i.e. Gm can be relatively increased, thereby contributing to the speeding up of a read speed.

Upon the operation of setting a relatively high threshold voltage to the first transistor section, for example, a high voltage is applied to its memory gate electrode to turn on the second transistor section, thereby allowing a current to flow from the source line to the bit line, whereby hot electrons generated in the vicinity of the charge storage region on the control gate side may be retained in the charge storage region. Upon the operation of setting a relatively low threshold voltage to the first transistor section, for example, a high voltage is applied to its memory gate electrode to turn on the second transistor section, thereby setting the bit line electrode and the source line electrode to a circuit's ground potential, whereby the electrons retained in the charge storage region may be ejected toward the memory gate electrode. Thus, the operation of setting the relatively low threshold voltage or the relatively high threshold voltage to the first transistor section can be realized without applying the high voltage to the control gate control line and the bit line. This guarantees that the gate withstand voltage of the second transistor section may be relatively low.

It is desired that in order to make it hard for the charges stored in the charge storage region to leak into the control gate electrode, a relationship of tm≤ti is established assuming that the thickness of an insulating film (9) between the control gate electrode and the charge storage region is defined as ti, for example.

In order to assure a low gate withstand voltage of the second transistor section on a device structure basis, for example, a high-density impurity region (30) may be prevented from being formed between the bit line electrode and the source line electrode formed in a well region. The high-density impurity region is a diffused region of an impurity. In the case of a nonvolatile memory cell comprising a series circuit of a memory holding MONOS section and a selection MOS transistor section, series-connected nodes of both transistor sections are configured as a diffusion region (source-drain region) common to both. When the common diffusion region common to both the transistor sections is interposed therebetween, a high voltage is applied to the MONOS section at writing to form a channel, so that the high voltage on the MONOS side is applied to the selection MOS transistor section from the channel via the diffusion region common to both the transistor sections. It is thus essential that the selection MOS transistor section is at a high withstand voltage in the case of the MONOS type memory cell.

The charge storage region may adopt a conductive floating gate electrode covered with an insulating film, or may adopt a charge trap insulating film covered with an insulating film, a conductive fine particle layer covered with an insulating film, or the like.

A switch MOS transistor (19) is provided which is capable of connecting the bit line to its corresponding global bit line (GL), and a divided bit line structure (hierarchical bit line structure) may be adopted therefor. The divided bit line structure contributes to the fact that upon a read operation, only some nonvolatile memory cells are connected to the corresponding global bit line to thereby apparently reduce the parasitic capacity of the bit line and further speed up the read operation. Since, at this time, the high voltage may not be applied to the bit line upon erase/write operations, the gate oxide-film thickness of the switch MOS transistor may be formed thinner than that of the first transistor section. In short, it is easy to give a relatively large current supply capacity to the switch MOS transistor. Further, it is possible to ensure the speeding up of the read operation by the divided bit line structure.

[2] As a further detailed aspect, the semiconductor device includes a first driver (21) which drives the control gate control line, a second driver (22) which drives the memory gate control line, a third driver (23) which drives the switch MOS transistor to an on state, and a fourth driver (24) which drives the source line. The first driver and the third driver use a first voltage as an operating power supply, and the second driver and the fourth driver use a voltage higher than the first voltage as an operating power supply.

The semiconductor device has a control circuit (76) which when the threshold voltage of the first transistor section is taken high, sets the operating power supply of the first driver to a first voltage, sets the operating power supply of the fourth driver to a second voltage higher than the first voltage, and sets the operating power supply of the second driver to a third voltage higher than the second voltage, thereby enabling injection of hot electrons into the corresponding charge storage region from the bit line electrode side.

When the threshold voltage of the first transistor section is taken low, the control circuit sets the operating power supply of the second driver to a fourth voltage higher than the third voltage, thereby ejecting electrons from the charge storage region to the corresponding memory gate electrode.

The first transistor section whose threshold voltage has been lowered, may be set to, for example, a depletion type. The first transistor section whose threshold voltage has been rendered high, may be set to, for example, an enhancement type. The memory gate electrode at the read operation may be set to a circuit's ground voltage. Since the second transistor section that selects the first transistor section is provided with respect to the first transistor section, a selection free of a verify operation strict on writing and erasure is also enabled.

When information stored in the nonvolatile memory cell is read, the control circuit may set the operating power supply of the first driver to a first voltage and set the memory gate electrode and the source line electrode to a circuit's ground potential. The direction of current at the read operation results in the direction thereof from the bit line to the source line.

When the information stored in the nonvolatile memory cell is read, the control circuit may set the operating power supply of the first driver to a first voltage and set the memory gate electrode and the bit line electrode to a circuit's ground potential. The direction of current at the read operation results in the direction thereof from the source line to the bit line contrary to the above.

The semiconductor device described above may be not only the discrete nonvolatile memory but also a semiconductor device such as a microcomputer with the nonvolatile memory provided on-chip, a data processor. For example, the semiconductor device further has a logic operation unit (61) which performs a logical operation with the first voltage as an operating power supply.

When viewed from a layout standpoint, each of the first driver and the third driver may receive an address decode signal (51) so that an operation thereof is selected, and each of the second driver and the fourth driver may receive the output (52) of the first driver so that an operation thereof is selected.

The first driver and the third driver may be disposed on one side and the second driver and the fourth driver may be disposed on the other side, with at least one the nonvolatile memory cell array (50) being interposed therebetween. It is possible to separate drivers each operated with a high voltage as an operating power supply and circuits each operated with a relatively low voltage as an operating power supply from one another.

In the memory array, memory gate control lines (ML) are formed integrally with memory gate electrodes, and low resistance metal layers (MGmt) may be configured so as to be laminated over polysilicon layers (MGps), respectively. Control gate control lines (CL) may also be configured integrally with their corresponding control gate electrodes. Further, low resistance metal layers (CGmt) may be configured so as to be laminated over their corresponding polysilicon layers (CGps). Thus, the resistance of wiring can be reduced.

Discharge MOS transistors 53 for respectively causing the memory gate control lines to be conducted to the circuit's ground potential in response to a read operation may be provided at different positions of the memory gate control lines. It is possible to make rapid transition to a read operation enable state.

As the switch MOS transistor placed under the divided bit line structure, may be adopted a p channel type MOS transistor (19p). It is thus possible to prevent a signal level from being reduced by the threshold voltage of the switch MOS transistor and satisfactorily cope with a voltage reduction in read signal level to the corresponding bit line. However, even if an attempt to set the bit line to the circuit' ground potential is made when the threshold voltage of the corresponding nonvolatile memory cell is made high, the potential of the bit line does not reach a level lower than the threshold voltage of the p channel type switch MOS transistor. In order to solve it, the switch MOS transistor may be made up of CMOS transfer gates (19p, 19n).

n channel type discharge MOS transistors (20n) each switch-operated complementarily to the switch MOS transistor may be provided at their corresponding bit lines. Thus, when the corresponding bit line is selected via the switch MOS transistor, the bit line is perfectly discharged by its corresponding discharge MOS transistor, so that the level of a global bit line precharged prior to the start of reading can be prevented from undesirably varying, thereby contributing to stabilization of a sense operation of a read signal and speeding up of a read operation.

[3] The present invention will be grasped from the viewpoint slightly different from the above. A semiconductor device has nonvolatile memory cells (1) arranged in a semiconductor substrate (2) in matrix form. Each of the nonvolatile memory cells includes in the semiconductor substrate a source line electrode (10) connected to a source line (SL), a bit line electrode (16) connected to a bit line (BL), and channel regions interposed between the source line electrode and the bit line electrode. Further, the nonvolatile memory cell includes over the channel regions a control gate electrode (18) disposed near the bit line electrode via a first insulating film (17) and connected to a control gate control line (CL), and a memory gate electrode (14) disposed via a second insulating film (12, 13) and a charge storage region (11), electrically separated from the control gate electrode (18) and connected to a memory gate control line (ML). The withstand voltage of the first insulating film is lower than that of the second insulating film.

It becomes easy to obtain a relatively large Gm at a relatively low gate voltage with respect to a selection MOS transistor having the control gate electrode. Current supply capacity of the whole nonvolatile memory cell, i.e., Gm can be relatively made large, thereby contributing to the speeding up of a read speed.

In order to relatively set high a threshold voltage of the nonvolatile memory cell as viewed from the memory gate thereof, for example, a high voltage is applied to its memory gate electrode to turn on the control gate electrode side, thereby allowing a current to flow from the source line to the bit line, whereby electrons generated in the vicinity of the charge storage region on the control gate electrode side may be retained in the charge storage region. In order to set a relative low threshold voltage in reverse, for example, a high voltage is applied to its memory gate electrode to turn on the control gate electrode side, thereby setting the bit line electrode and the source line electrode to a circuit's ground potential, whereby the electrons retained in the charge storage region may be ejected toward the memory gate electrode. Thus, the operation of setting the relatively low threshold voltage or the relatively high threshold voltage to the nonvolatile memory cell can be realized without applying the high voltage to the control gate control line and the bit line. This guarantees that the gate withstand voltage on the control gate electrode side may be relatively low.

A semiconductor device according to a further specific aspect, having the nonvolatile memory cells includes control gate drivers each of which drives the control gate control line, memory gate drivers each of which drives the memory gate control line, and source drivers each of which drives the source line. At this time, the control gate driver may use a first voltage as an operating power supply, and each of the memory gate driver and the source driver may use a voltage higher than the first voltage as an operating power supply.

The semiconductor device has a control circuit which sets an operating power supply of the control gate driver to a first voltage, sets an operating power supply of the source driver to a second voltage higher than the first voltage, and sets an operating power supply of the memory gate driver to a third voltage greater than or equal to the second voltage when a threshold voltage of the nonvolatile memory cell as viewed from the memory gate electrode is rendered high, thereby enabling injection of electrons into the corresponding charge storage region from the bit line electrode side.

The control circuit sets the operating power supply of the memory gate driver to a fourth voltage greater than or equal to the third voltage when the threshold voltage of the nonvolatile memory cell as viewed from the memory gate electrode is rendered low, thereby ejecting electrons from the charge storage region to the corresponding memory gate electrode.

When information stored in the nonvolatile memory cell is read, the control circuit sets the operating power supply of the control gate driver to a first voltage and sets the memory gate electrode and the source line electrode to a circuit's ground potential. The direction of current at this read operation results in the direction thereof extending from the bit line to the source line. Incidentally, at this time, the memory gate electrode may be a voltage higher than the ground potential.

When information stored in the nonvolatile memory cell is read, the control circuit sets the operating power supply of the control gate driver to a first voltage and sets the memory gate electrode and the bit line electrode to a circuit's ground potential. The direction of current at this read operation results in the direction thereof from the source line to the bit line contrary to the above. In a manner similar to the above, the memory gate electrode at this time may be a voltage higher than the ground potential.

The semiconductor device may be not only the discrete nonvolatile memory but also a microcomputer with the nonvolatile memory provided on-chip, a data processor or the like. For example, the semiconductor device has a logic operation unit which performs a logical operation with the first voltage as an operating power supply.

The control gate driver may be one inputted with an address decode signal so that an operation thereof is selected, and each of the memory gate driver and the source driver may be one based on the output of the control gate driver so that an operation thereof is selected.

The control gate drivers may be disposed on one side and the memory gate drivers and the source drivers may be disposed on the other side, with at least one array of the nonvolatile memory cells being interposed therebetween. It becomes easy to separate drivers each operated with a high voltage as an operating power supply and circuits each operated with a relatively low voltage as an operating power supply from one another.

In the array of the nonvolatile memory cells, memory gate control lines may be formed integrally with memory gate electrodes, and low resistance metal layers may be formed with being laminated over polysilicon layers respectively. Thus, the resistance of wiring can be reduced.

Attention is paid to a reduction in chip occupied area formed by the memory gate driver and the source driver. In the array of the nonvolatile memory cells, the memory gate drivers (22A) may preferably be shared in plural units of the memory gate control lines paired with the control gate control lines, and the source drivers (24) may preferably be shared in plural units of the source lines paired with the control gate control lines. At this time, the number of the memory gate control lines shared by the corresponding memory gate driver may preferably be less than or equal to the number of the source lines shared by the corresponding source driver. For instance, when the current is caused to flow between the source and drain to thereby apply a high voltage to the memory gate as a write format relative to the nonvolatile memory cell, the electric field between the source and memory gate of a write non-selected nonvolatile memory cell that shares the memory gate control lines between the write non-selected nonvolatile memory cell and a write selected memory cell does not increase in particular if the source potential for causing the current to flow between the source and drain of the write selected memory cell is supplied via the corresponding source line. If the source potential is of a low source potential for write non-selection, then there is a possibility that a large electric field comparable to at erasure will act between the source and memory gate of the write non-selected memory cell that shares the memory gate control lines between the write non-selected memory cell and the write selected memory cell. A disturbance occurs that such a large electric field undesirably changes the threshold voltage of a memory cell placed in a write state. The above relationship between the number of the memory gate control lines shared by the memory gate driver and the number of source lines shared by the source driver is of use in preventing the fear of such a disturbance beforehand.

The memory gate driver and the source driver may be driven based on the output of an OR circuit which forms the OR of selected states with respect to their corresponding plural control gate control lines. At this time, an input stage of the OR circuit may be used with transistors using extended portions of the control gate control lines as gate electrodes thereof in order to reduce a layout area of the OR circuit.

In terms of the speeding up of a read operation, a plurality of charge MOS transistors for respectively causing the memory gate control lines to be conducted to the first power supply voltage in response to the read operation may be provided at different positions of the memory gate control lines. The time necessary to cause each memory gate control line to transition to a desired level in terms of the read operation can be shortened.

Further, in order to control the threshold voltage of the corresponding memory cell so as to fall within a predetermined voltage distribution, a write verify operation may be performed after a write operation, and an erase verify operation may be carried out after an erase operation.

[4] The essential points of the present invention will be listed here in terms of the device structure of each memory cell. All the essential points may not be necessarily provided and are effective singly or in various combinations. Incidentally, a prerequisite for the present invention is that a gate electrode to which a high voltage is applied upon writing/ erasure, and a gate electrode of a selection MOS type transistor are configured with being separated from each other. (1) The thickness of a gate insulating film of each selection MOS type transistor is set thinner than that of a high-voltage MOS transistor which handles write/erase voltages to thereby increase Gm of the selection MOS type transistor. The thickness of the gate insulating film of the selection MOS type transistor is set so as to be equal to that of a gate oxide film of a MOS type transistor having charge of a logical operation unit (core-logic) or an I/O MOS type transistor which handles the input/output of a signal from and to the outside, in the case where the thickness of the gate insulating film is thinnest. Further, the gate electrode of the selection MOS type transistor is driven by its corresponding core-logic MOS type transistor operated at high speed. (2) A diffusion layer of each selection MOS type transistor constituting a cell is shared with a diffusion layer of the core-logic or I/O MOS type transistor having its gate oxide film to thereby suppress a short channel effect. Further, a diffusion layer of a memory holding MOS type transistor is caused to have a junction withstand voltage higher than that for the diffusion layer of the selection MOS type transistor. (3) A p type density of a channel impurity for determining the threshold value of the selection MOS type transistor is set so that the threshold value of the transistor becomes positive, and set thicker than that of the memory holding MOS type transistor. In the memory holing MOS type transistor, a neutral threshold value thereof is made negative such that the threshold value at erasure becomes sufficiently low and a read current is obtained on a large scale. The p type density of the channel impurity is set lower than that of the selection MOS type transistor. Alternatively, in order to set the neutral threshold value of the memory holding MOS type transistor to be negative, an n type impurity density of its channel is made higher than an n type impurity density of a channel of the selection MOS type transistor whose threshold value is positive.

Thus, an improvement in read speed of a semiconductor nonvolatile memory device can be achieved. Accordingly, the semiconductor nonvolatile memory device can be provided for high-speed program reading. If a semiconductor integrated circuit device using the technology of the present invention is used, then a high-performance information apparatus can be realized at low cost. The present invention is effective for a portable device or the like free of space in which a temporary storage memory device capable of high-speed reading is built in.

BRIEF DESCRIPTION OF THE DRAWINGS

FIG. 5 is an explanatory view showing, as comparative examples, several connection forms related to the nonvolatile memory cell shown in FIG. 2, prior to its optimization;

FIG. 31 is an explanatory view illustrating by way of example other write voltage conditions and the like with respect to the nonvolatile memory cell;

BEST MODE FOR CARRYING OUT THE INVENTION

Figure 1:
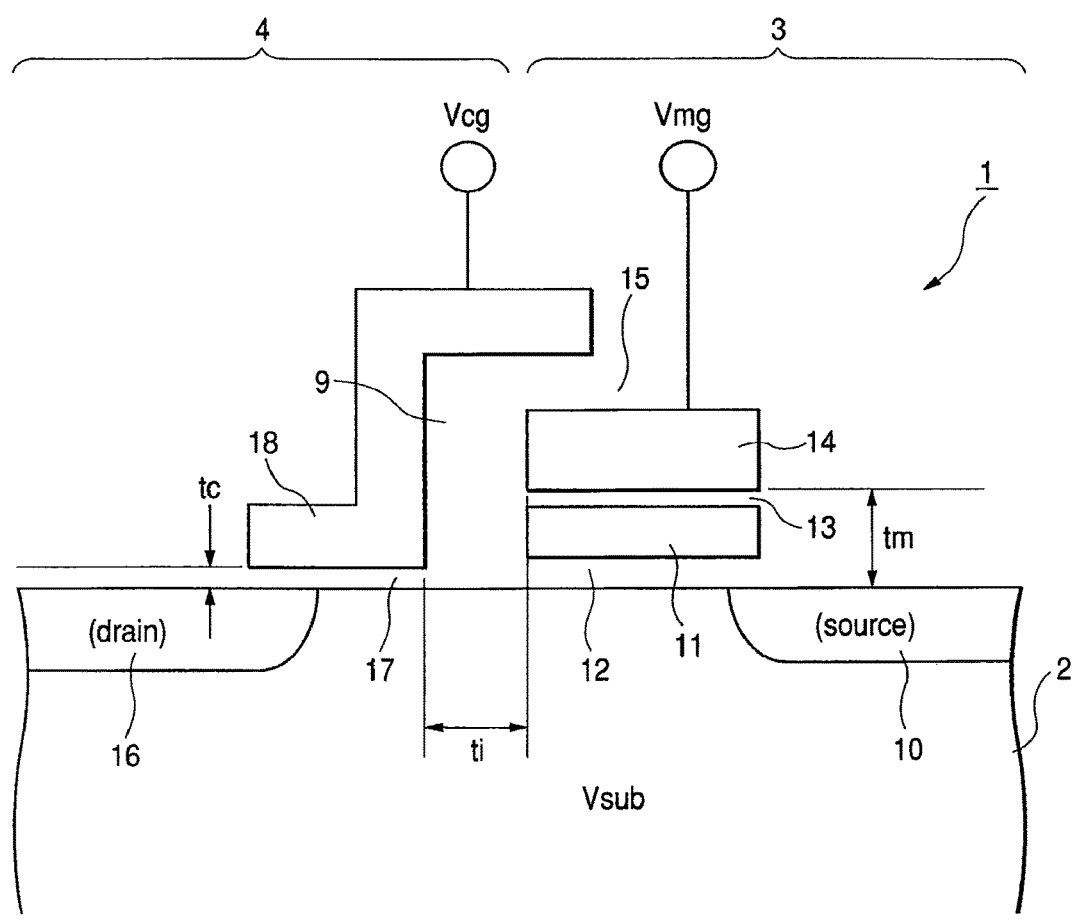
FIG. 1 is a cross-sectional view showing one example of a nonvolatile memory cell used in the present invention.

FIG. 1 shows one example of a nonvolatile memory cell (hereinafter also simply called memory cell). The nonvolatile memory cell 1 includes within a p type well region 2 provided over a silicon substrate, a MOS type first transistor section 3 used for information storage, and a MOS type second transistor section 4 (selection MOS transistor section) which selects the first transistor section 3. The first transistor section 3 includes an n type diffusion layer (n type impurity region) 10 which serves as a source line electrode connected to a source line, a charge storage region (e.g., silicon nitride film) 11, insulating films (e.g., silicon oxide film) 12 and 13 disposed over the front and back surfaces of the charge storage region.11, a memory gate electrode (e.g., n type polysilicon layer) 14 for applying a high voltage upon writing and erasure, and an oxide film (e.g., silicon oxide film) 15 for protection of the memory gate electrode. The insulating film 12 is formed 5 nm thick, the charge storage region 11 is formed 10 nm thick (silicon oxide film conversion), and the oxide film 13 is formed 3 nm thick. The second transistor section 4 has an n type diffusion layer (n type impurity region) 16 which serves as a bit line electrode connected to a bit line, a gate insulating film (e.g., silicon oxide film) 17, a control gate electrode (e.g., n type polysilicon layer) 18 and an insulating film (e.g., silicon oxide film) 9 which insulates the control gate electrode 18 and the memory gate electrode 14 from each other.

Figure 12:
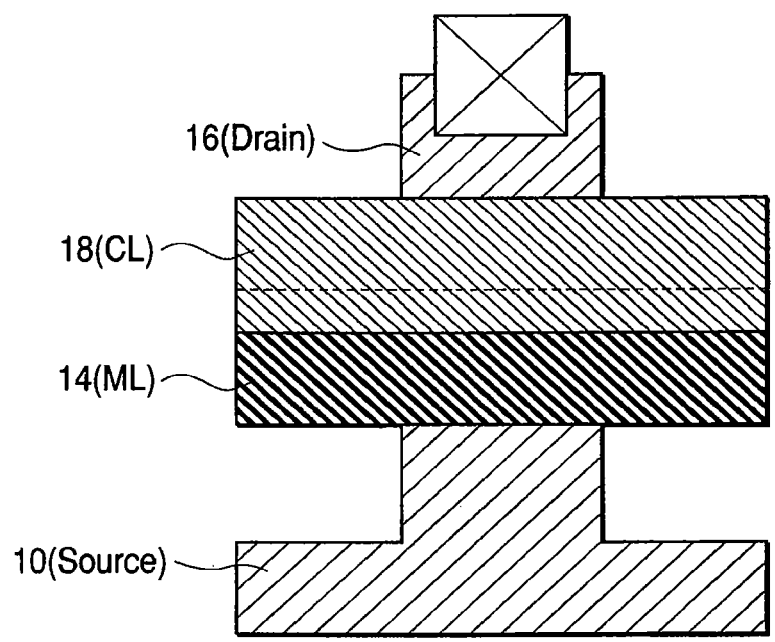
FIG. 12 is a plan view illustrating by way of example a planar configuration of the nonvolatile memory cell shown in FIG. 1.

Assuming that the sum of the thickness of the charge storage region 11 of the first transistor section 3 and the thicknesses of the insulating film 12 and the insulating film 13 disposed over the front and back surfaces thereof (called memory gate insulating films 11, 12, 13 together) is represented as tm, the thickness of the gate insulating film 17 of the control gate electrode 18 is represented as tc, and the thickness of the insulating film between the control gate electrode 18 and the charge storage region 11 is represented as ti, the relationship of tc<tm≤ti is realized. A gate withstand voltage of the second transistor section 4 is set lower than that of the first transistor section 3 by the difference in dimension between the gate insulating film 17 and the memory gate insulating films 11, 12 and 13. A planar configuration of the nonvolatile memory cell 1 shown in FIG. 1 is illustrated by way of example in FIG. 12.

Incidentally, the term of the drain (drain) described in part of the diffusion layer 16 means that the diffusion layer 16 functions as a drain electrode of a transistor upon a data read operation, whereas the term of the source (source) described in part of the diffusion layer 10 means that the diffusion layer 10 functions as a source electrode of the transistor upon the data read operation. Upon erase/write operations, the functions of the drain electrode and the source electrode might be counterchanged with respect to the notation of the drain (drain) and source (source).

Figure 2:
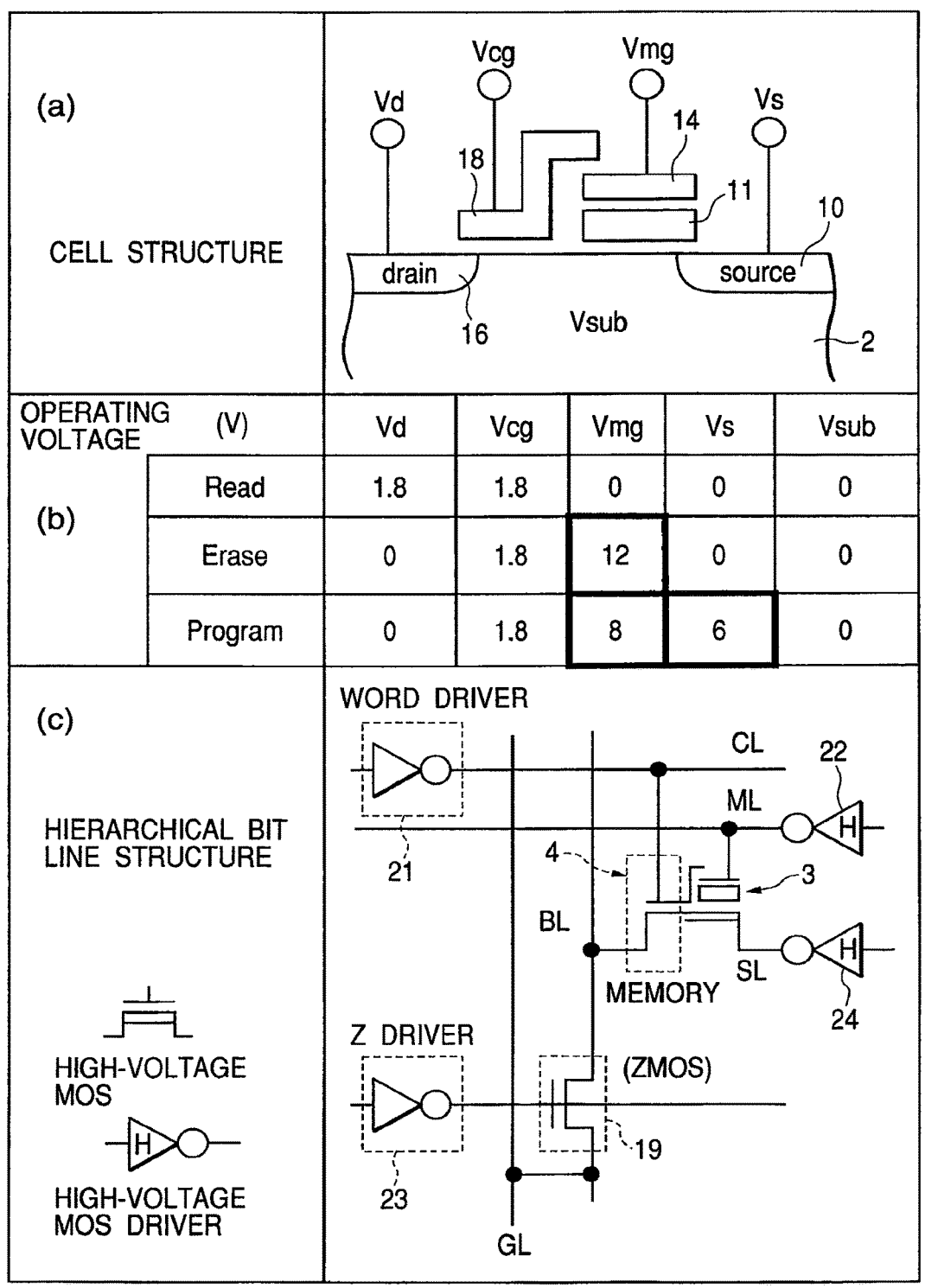
FIG. 2 is an explanatory view typically depicting characteristics with respect to the nonvolatile memory cell shown in FIG. 1.

FIG. 2 typically shows characteristics with respect to the nonvolatile memory cell shown in FIG. 1. A connection form of the nonvolatile memory cell 1 in a hierarchical bit line structure is illustrated by way of example in FIG. 2. The diffusion layer 16 is connected to a sub bit line BL (hereinafter also simply called bit line BL), the diffusion layer 10 is connected to a source line SL, the memory gate electrode 14 is connected to a memory gate control line ML, and the control gate electrode 18 is connected to a control gate control line CL. The sub bit line BL is connected to a main bit line (also called global bit line) GL via an n channel type switch MOS transistor (ZMOS) 19. Although not shown in the figure in particular, a plurality of the nonvolatile memory cells 1 are connected to the sub bit line BL, and a plurality of the bit lines BL are connected to one main bit line GL via the ZMOSs 19.

A first driver (word driver) 21 which drives the control gate control line CL, a second driver 22 which drives the memory gate control line ML, a third driver (Z driver) 23 which switch-drives the ZMOS 19, and a fourth driver 24 which drives the source line SL, are typically shown in FIG. 2. The drivers 22 and 24 are constituted by high voltage MOS drivers using MOS transistors whose gate withstand voltages are high voltages. The drivers 21 and 23 are constituted by drivers using MOS transistors whose gate withstand voltage are relatively low.

Upon a write operation for setting a relatively high threshold voltage to the first transistor section 3 of the nonvolatile memory cell 1, for example, a memory gate voltage Vmg and a source line voltage Vs are respectively set to high voltages, 1.8V is supplied as a control gate voltage Vcg, a write selection bit line is set to 0V (circuit's ground potential) and a write non-selection bit line is set to 1.8V. In this state, the second transistor section 4 for the write selection bit line is turned on to cause current to flow from the diffusion layer 10 to the diffusion layer 16. Hot electrons developed in the vicinity of the charge storage region 11 on the control gate electrode 18 side by the current may be retained in the charge storage region 11. When wiring is carried out using a constant current ranging from about a few microamperes to about several tens of microamperes as the write current, the potential of the write selection bit line is not limited to the ground potential. For example, about 0.8V may be applied thereto to feed a channel current. Upon the write operation, the diffusion layer 10 functions as the drain and the diffusion layer 16 functions as the source in the n channel type memory cell. Such a write format results in source side injection of the hot electrons.

Upon an erase operation for setting a relatively low threshold voltage to the first transistor section 3, for example, a high voltage is applied as the memory gate voltage Vmg to discharge the electrons retained in the charge storage region 11 into the memory gate electrode 14. At this time, the diffusion layer 10 is set to the circuit's ground potential. At this time, the second transistor section 4 may be brought to an on state.

As apparent from the above write/erase operations effected on the first transistor section 3, the above operation can be realized without applying the high voltage to the control gate control line CL and the bit line BL. This guarantees that the gate withstand voltage of the second transistor section 4 may be relatively low. The ZMOS 19 needs not to have a high withstand voltage either As illustrated by way of example in FIG. 3, although not restricted in particular, the first transistor section 3 held in an erase state in which its threshold voltage is rendered low, is set to a depletion type, and the first transistor section 3 held in a write state in which its threshold voltage is made high, is set to an enhancement type. In the erase and write states of FIG. 3, the memory gate electrode 14 at a read operation may be set to the circuit's ground potential. Further, for example, a power supply voltage Vdd may be added to the memory gate electrode 14 when the read operation is speeded up. On the other hand, when both of erase and write states are set to an enhancement type as shown in FIG. 4, for example, a power supply voltage Vdd is added to the memory gate electrode 14 at a read operation. Under both the threshold states of FIGS. 3 and 4, the MOS type second transistor section 4 that selects the first transistor section 3, is provided in association with the MOS type first transistor section 3 used for information storage in the case of the present invention. Therefore, there is no need to perform a verify (verification) operation for writing and erasure. When it is necessary to relax stress to the memory cell due to the write and erase operations, e.g., the number of times that writing is carried out is increased, the verify operation may be allowed.

Figure 3:
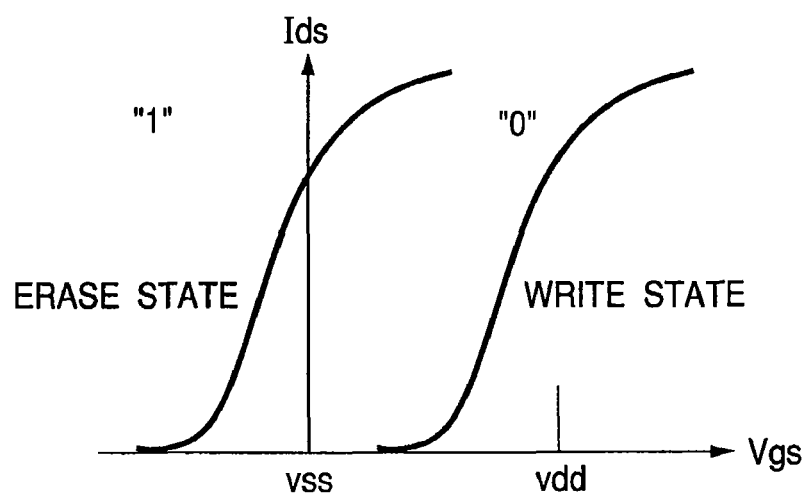
FIG. 3 is an explanatory view illustrating by way of example threshold voltage states where erase and write states of the nonvolatile memory cell are set to depletion and enhancement types.
Figure 4:
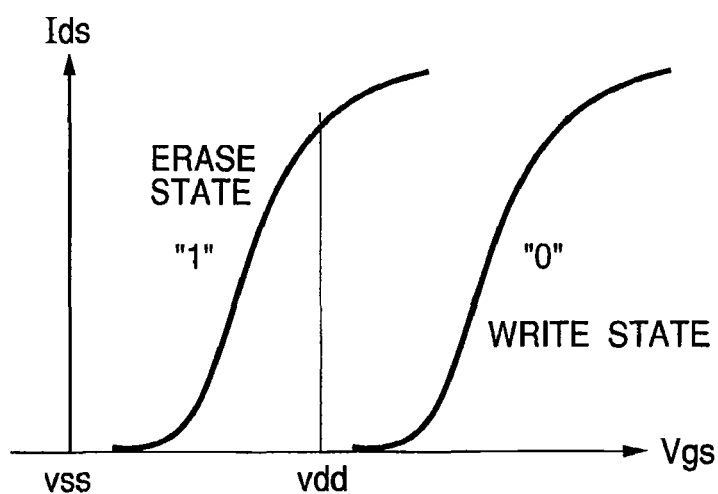
FIG. 4 is an explanatory view illustrating by way of example threshold voltage states where the erase and write states of the nonvolatile memory cell are both set to the enhancement type.

Upon the read operation for the nonvolatile memory cell 1 of FIG. 2 in the threshold state of FIG. 3, the source line voltage Vs and the memory gate voltage Vmg may be set to 0V, and the control gate voltage Vcg of each memory cell to be read and selected may be set to a select level of 1.8V. When the second transistor section 4 is brought to an on state, memory information is read into the corresponding bit line BL according to whether current flows in accordance with the threshold voltage state of the first transistor section 3. Since the second transistor section 4 is thinner than the first transistor section 3 in gate oxide film thickness and also lower than it in gate withstand voltage, the whole current supply capacity of the nonvolatile memory cell 1 can be relatively enlarged as compared with the case in which both the memory holding MOS transistor and selection MOS transistor are formed at a high withstand voltage, thus making it possible to speed up a data read speed.

Figure 23:
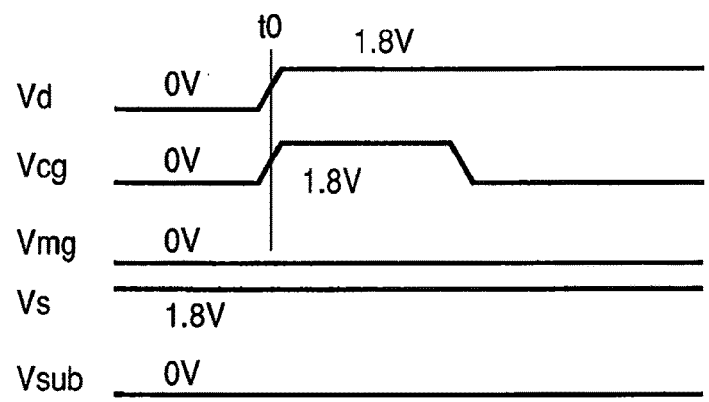
FIG. 23 is a timing chart illustrating by way of example operation timings at the time that the direction of current at a read operation of a nonvolatile memory cell extends from a source line to a bit line.

Upon the read operation for the nonvolatile memory cell 1, the direction of current can be set to the direction (backward direction) opposite to the forward direction. As illustrated by way of example in FIG. 23, a source line voltage Vs is set to 1.8V and a bit line voltage Vd is set to 0V. A control gate voltage Vcg is set to a select level (1.8V) at a time t0 of FIG. 23 with respect to each read and selected memory cell. Since the memory cell is rendered low in threshold voltage because it is in the erase state in the case of this example, the bit line voltage Vd rises. A change in this voltage is detected by an unillustrated sense amplifier.

Figure 26:
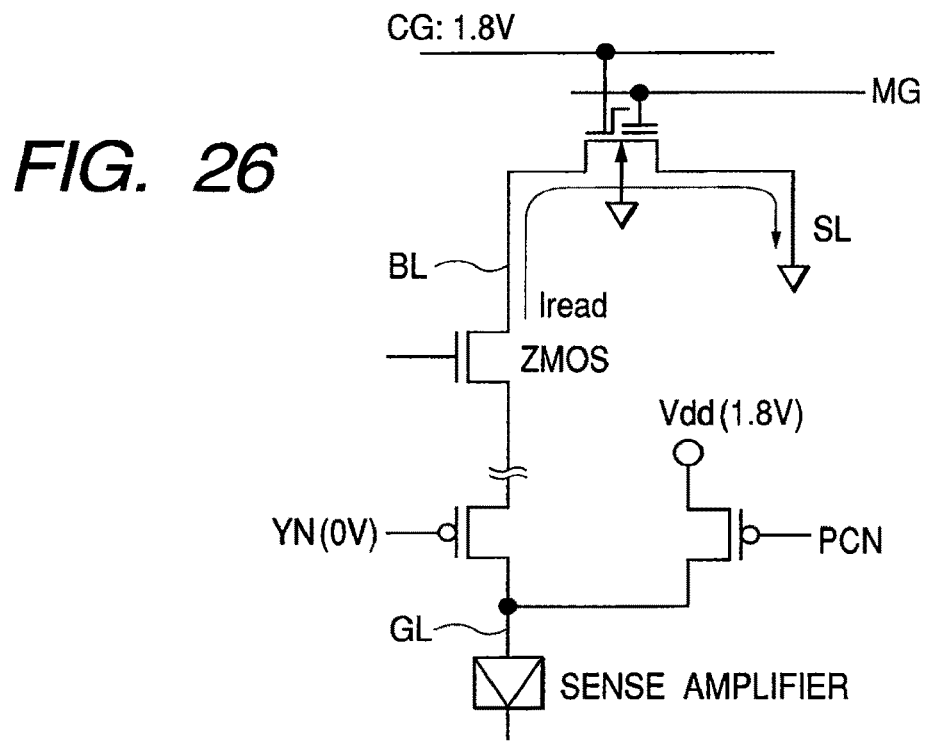
FIG. 26 is a circuit diagram illustrating by way of example a form of a forward read operation with respect to a nonvolatile memory cell.
Figure 27:
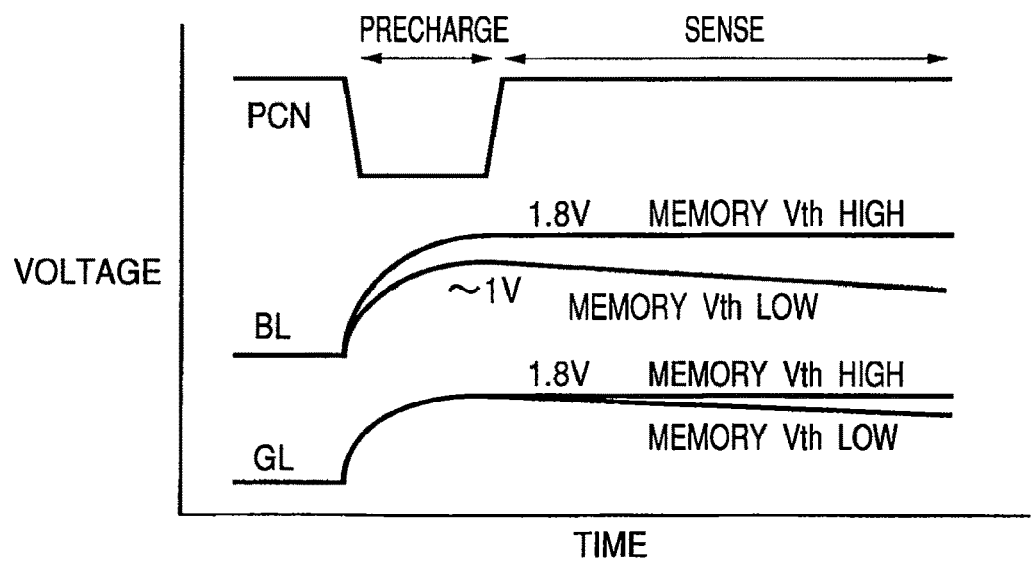
FIG. 27 is a timing chart illustrating by way of example main signal waveforms at the forward read operation of FIG. 26.
Figure 28:
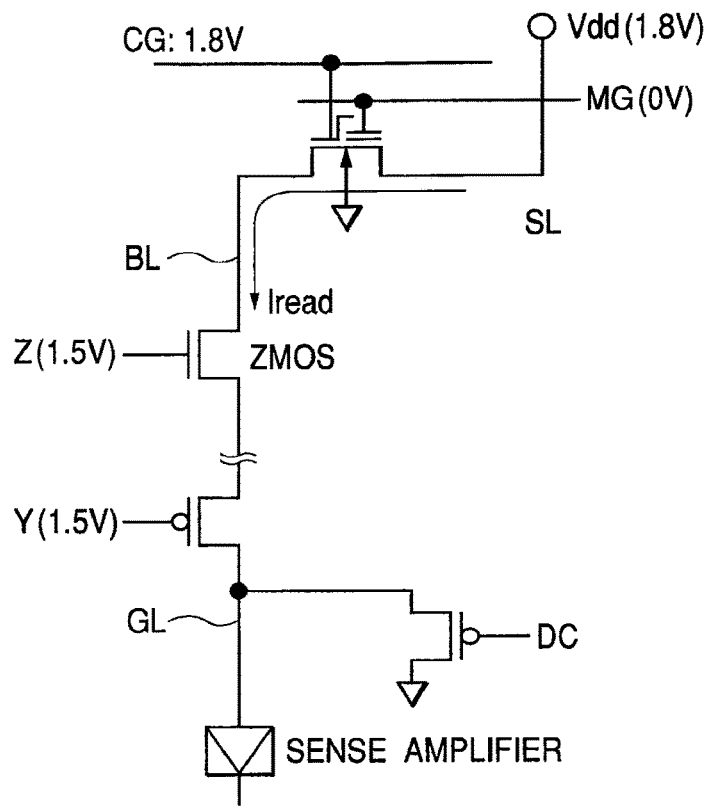
FIG. 28 is a circuit diagram illustrating by way of example a form of a backward read operation with respect to a nonvolatile memory cell.
Figure 29:
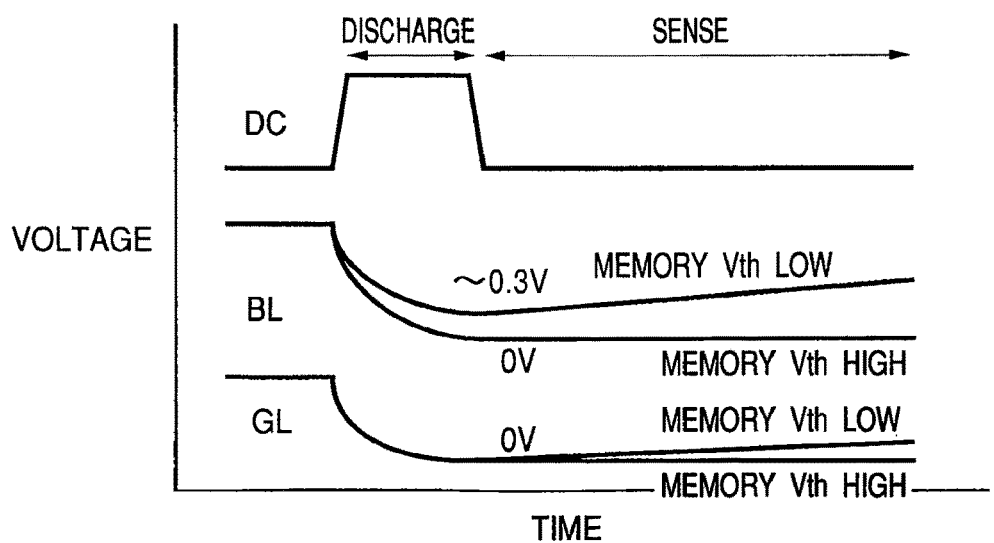
FIG. 29 is a timing chart illustrating by way of example main signal waveforms where a read operation is started as the backward read operation of FIG. 28 after a main bit line on the input side of a sense amplifier has been precharged.
Figure 30:
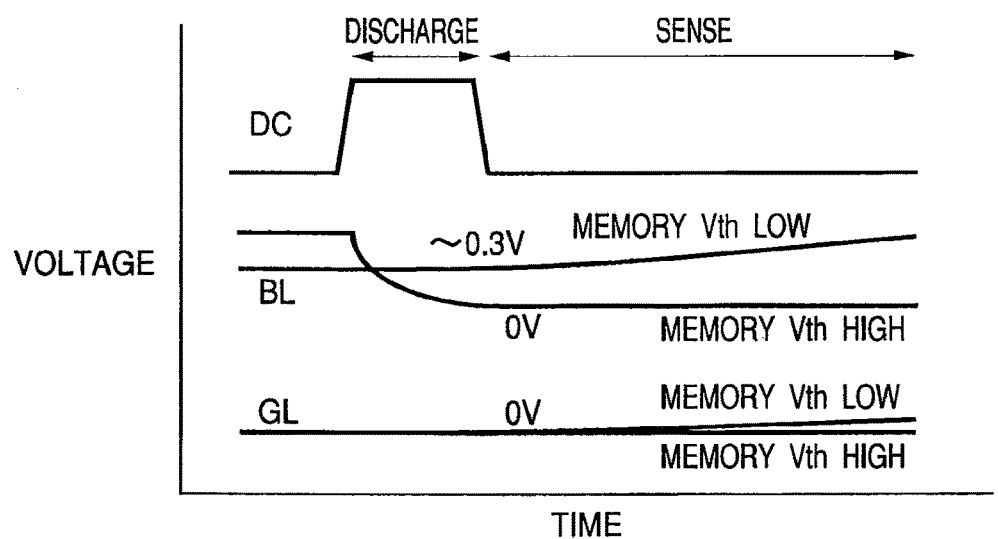
FIG. 30 is a timing chart illustrating by way of example main signal waveforms where a read operation is started as the backward read operation of FIG. 28 without precharging the main bit line on the input side of the sense amplifier.

A form of a forward read operation with respect to the nonvolatile memory cell 1 is illustrated by way of example in FIG. 26 in the form of a circuit diagram. Iread indicates the direction of a read current. Main signal waveforms at the time of feeding of Iread are illustrated by way of example in FIG. 27. A form of a backward read operation with respect to the nonvolatile memory cell 1 is illustrated by way of example in FIG. 28 in the form of a circuit diagram. Main signal waveforms at this time are illustrated by way of example in FIGS. 29 and 30. FIG. 29 shows a case in which GL on the input side of a sense amplifier is precharged and thereafter the read operation is started, and FIG. 30 shows a case in which the read operation is started without precharging GL on the input side of a sense amplifier. The sense amplifiers shown in FIGS. 26 and 28 may be a differential input type. In this case, a reference input of each sense amplifier is a voltage between the high voltage side and the low voltage side of a memory Vth on the data input side in each of FIGS. 27, 29 and 30.

Figure 5:
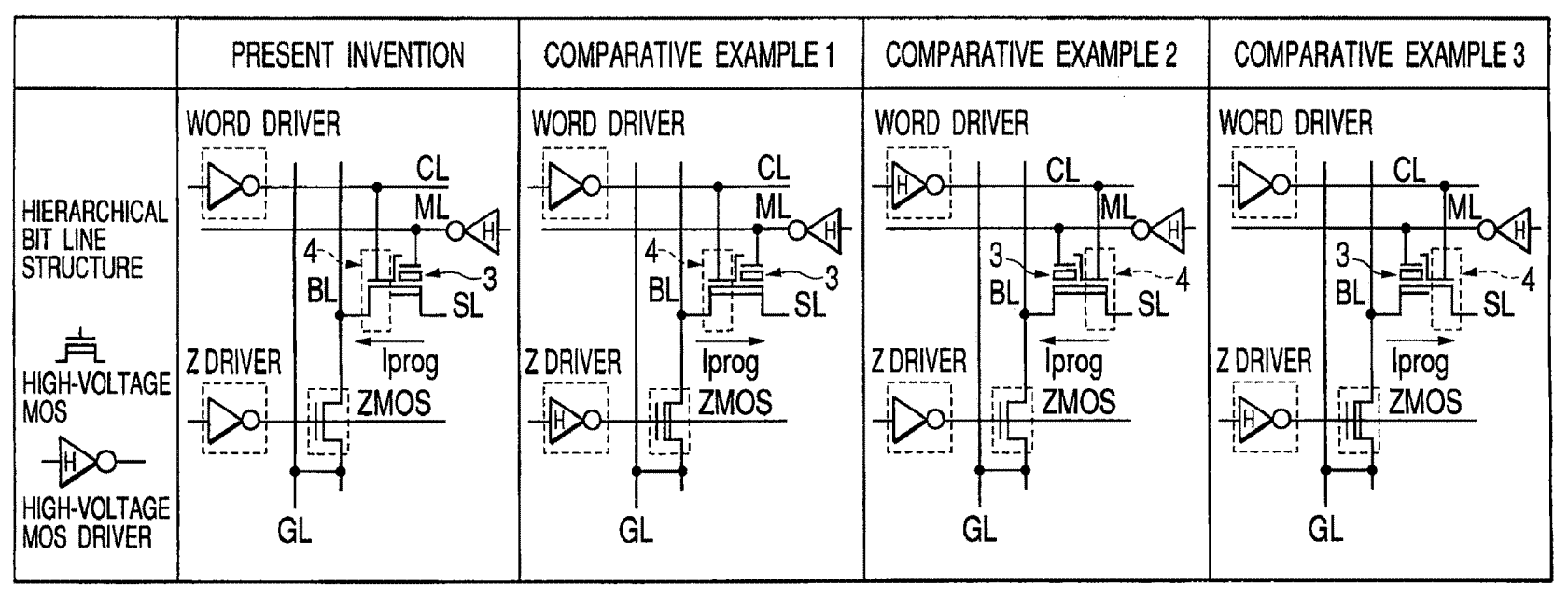

Several connected states related to the nonvolatile memory cell 2 shown in FIG. 2, prior to its optimization are shown in FIG. 5 as comparative examples. A comparative example 1 relative to the present invention shows a mode in which the direction (Iprog) of a write current is made opposite to the present invention. Since, in this case, a write high voltage 6V must be applied to a sub bit line BL, there is a need to set ZMOS as a high-voltage MOS transistor and set a Z driver as a high-voltage MOS driver. In the hierarchical bit line structure, the operation of reading memory information becomes slow as compared with the form of the present invention.

A comparative example 2 shows a configuration wherein a first transistor section 3 is connected to a sub bit line BL and a second transistor section 4 is connected to a source line SL to thereby cause a write current to flow from the source line SL side to the sub bit line BL side. Since a write high voltage is applied to the source line SL side in this case, there is a need to configure the second transistor section 4 as a high withstand-voltage structure and configure a word driver as a high-voltage MOS driver. In this respect, the present example is unfit for speeding up of the read operation.

A comparative example 3 shows a configuration wherein a first transistor section 3 is connected to a bit line BL and a second transistor section 4 is connected to a source line SL to thereby cause a write current to flow from the bit line BL side to the source line SL side. There is a need to configure a ZMOS and Z driver as high-voltage MOS transistors in a manner similar to the comparative example 1 even in this case. In this respect, the present example is unfit for speeding up of a read operation.

In order to speed up the read operation of the nonvolatile memory cell 1, as apparent from FIG. 5, the first transistor section 3 is connected to the source line SL, the second transistor section 4 is connected to the bit line BL, and the direction of the write current is set so as to extend from the source line SL side to the bit line BL side. This results in the optimum condition.

Figure 6:
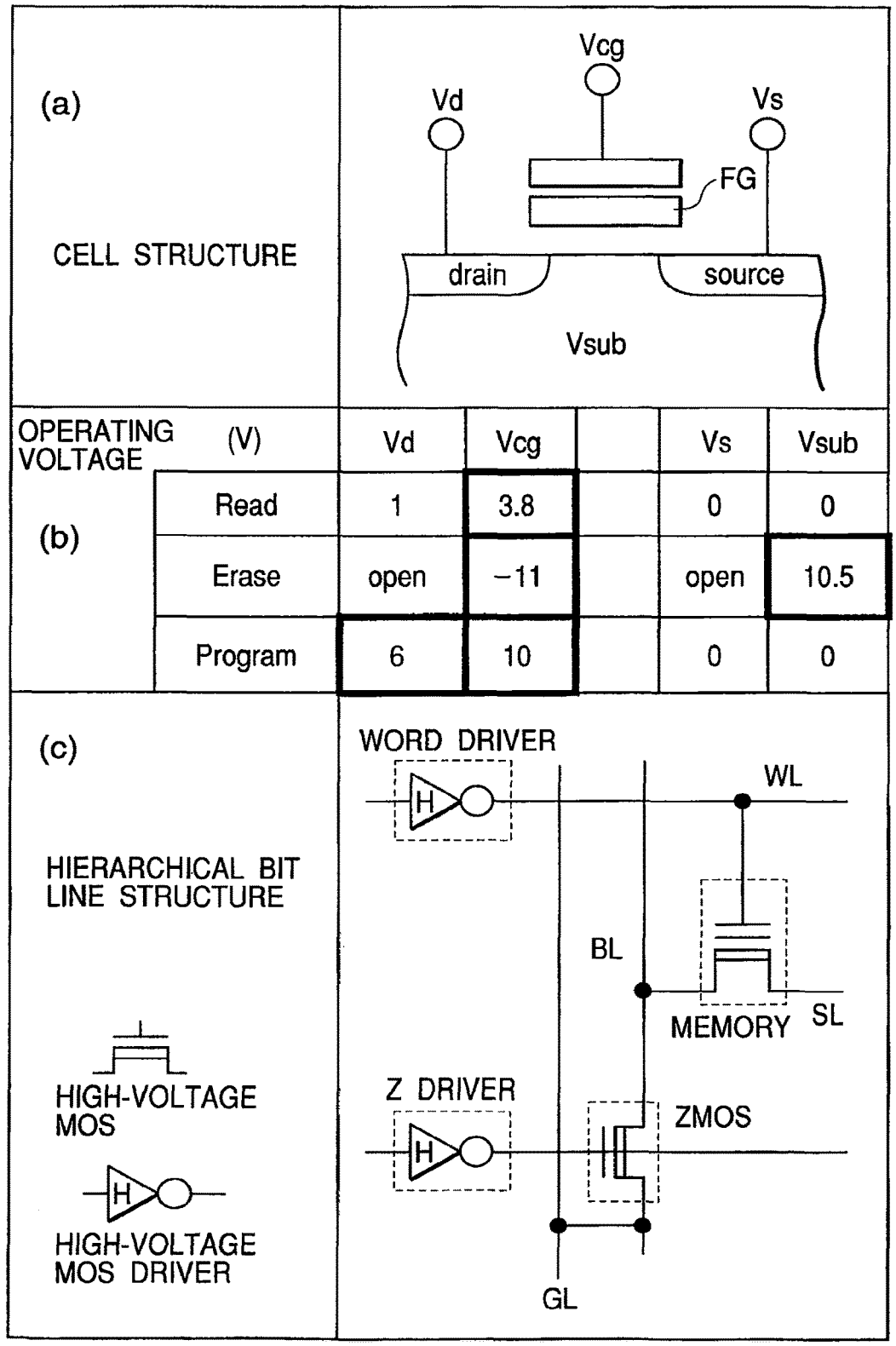
FIG. 6 is an explanatory view illustrating by way of example a device section, operating voltages and a hierarchical bit line structure related to a stack gate type flash memory cell having a floating gate.
Figure 7:
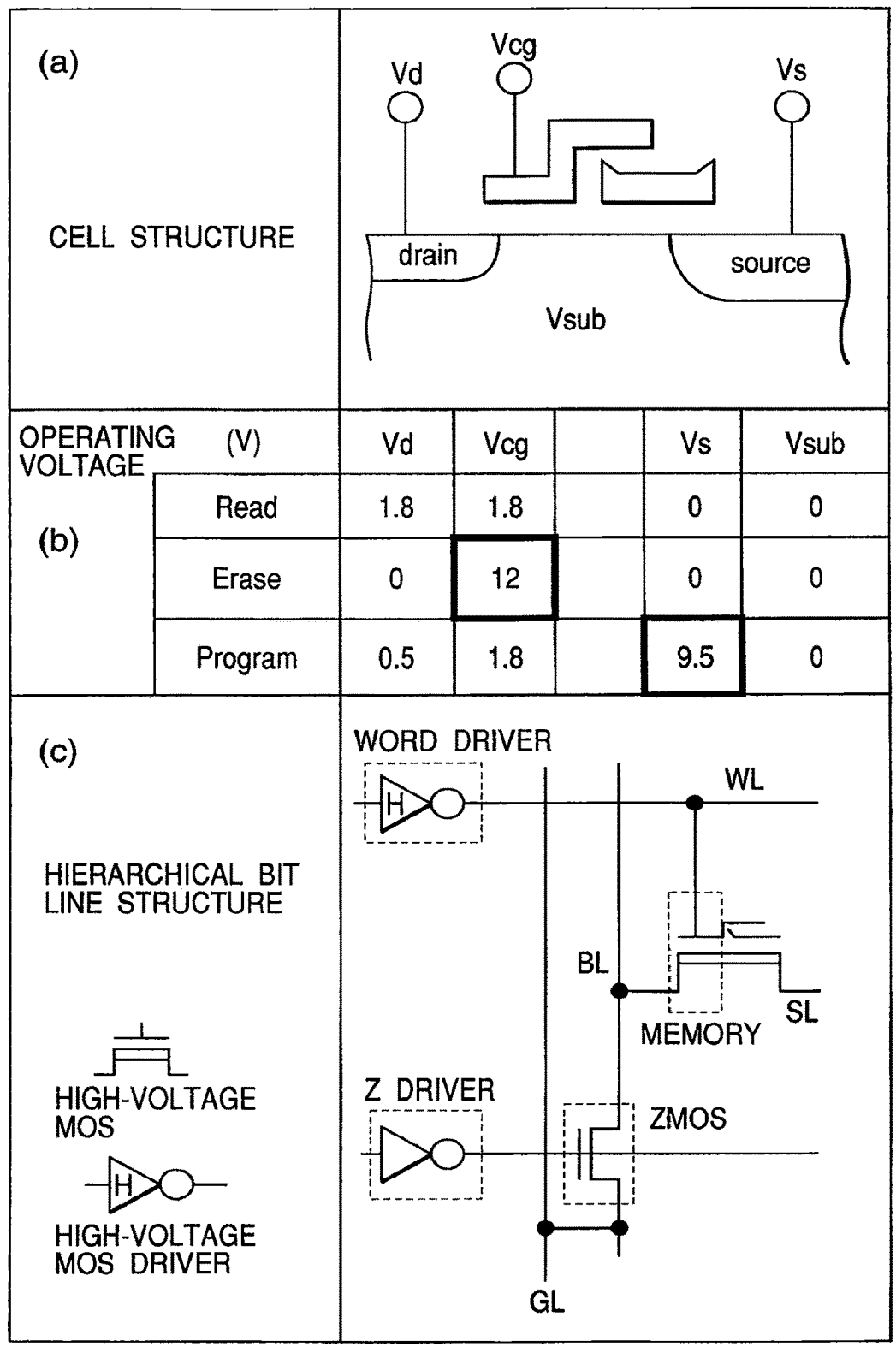
FIG. 7 is an explanatory view illustrating by way of example a device section, operating voltages and a hierarchical bit line structure related to a split gate type flash memory cell.
Figure 8:
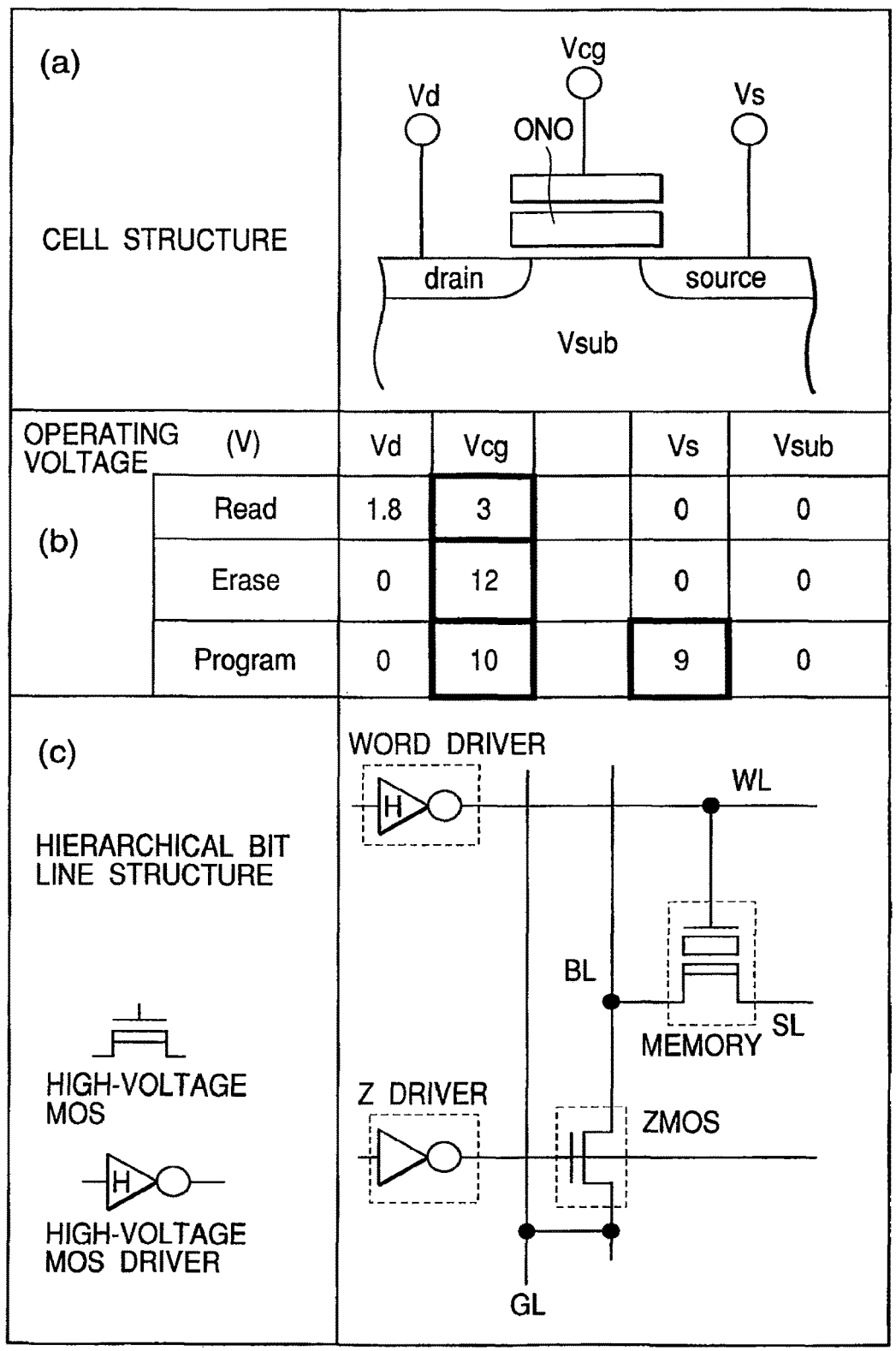
FIG. 8 is an explanatory view illustrating by way of example a device section, operating voltages and a hierarchical bit line structure related to a MONOS-stack gate type memory cell of one-transistor/one-memory cell.
Figure 9:
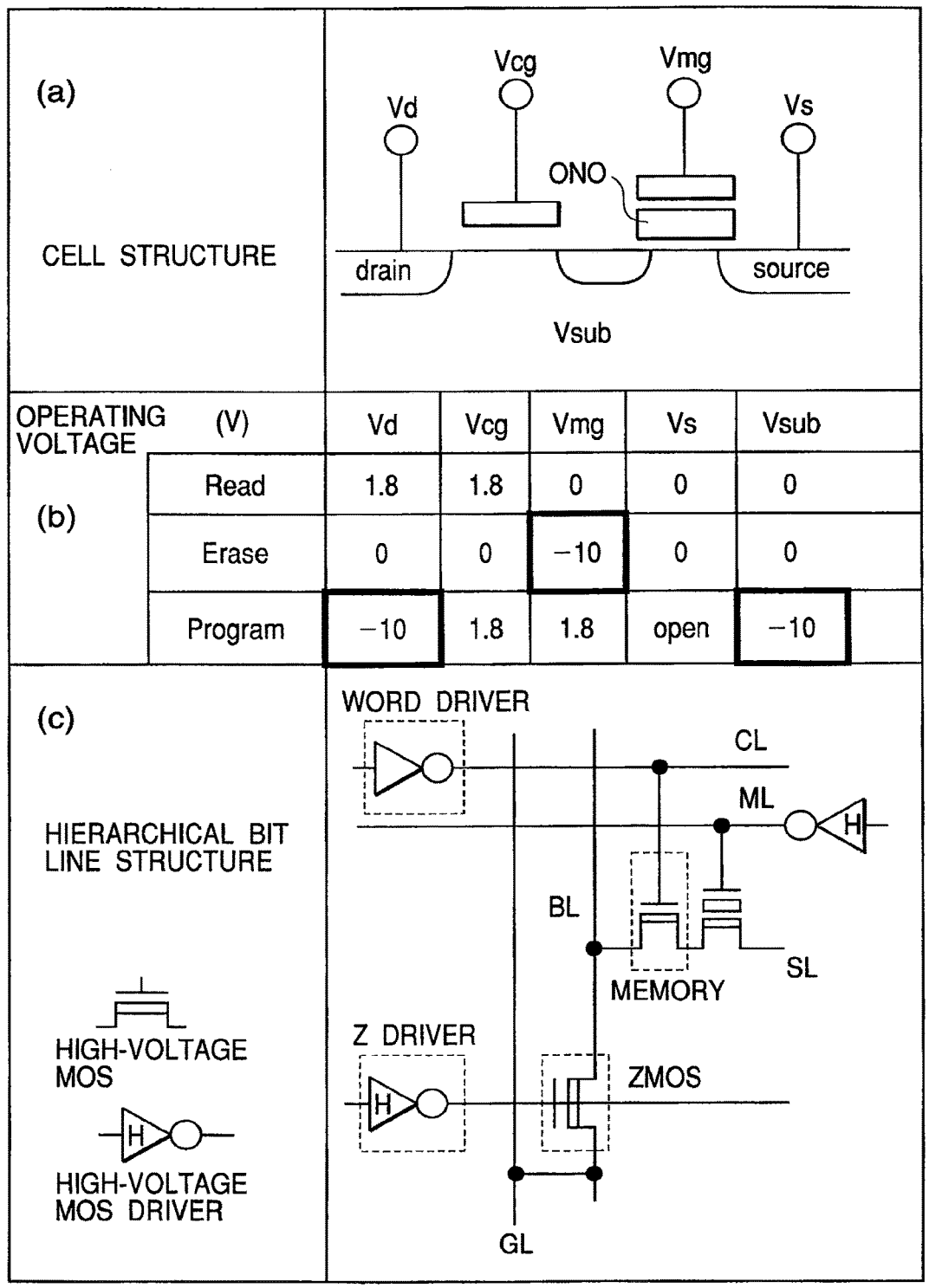
FIG. 9 is an explanatory view illustrating by way of example a device section, operating voltages and a hierarchical bit line structure related to a NONOS type memory cell of two-transistor/one-memory cell.
Figure 13:
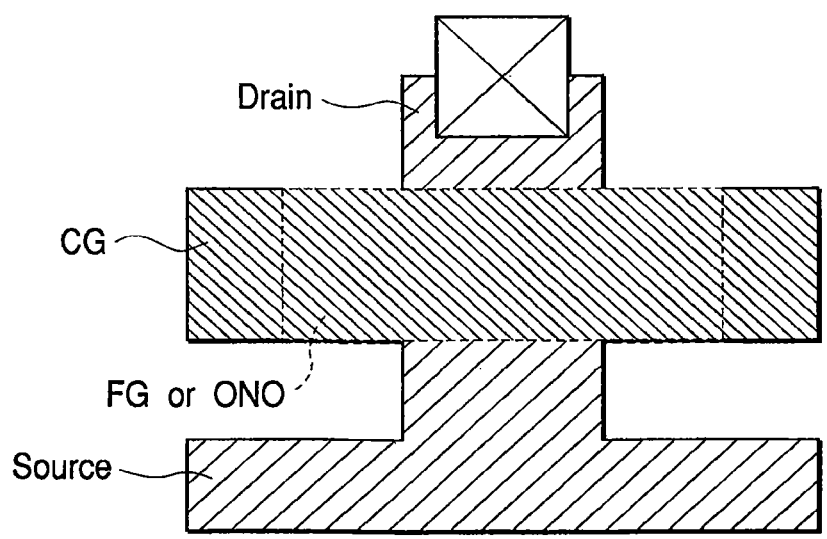
FIG. 13 is a plan view illustrating by way of example a planar configuration of each of the nonvolatile memory cells shown in FIGS. 6 and 8.
Figure 14:
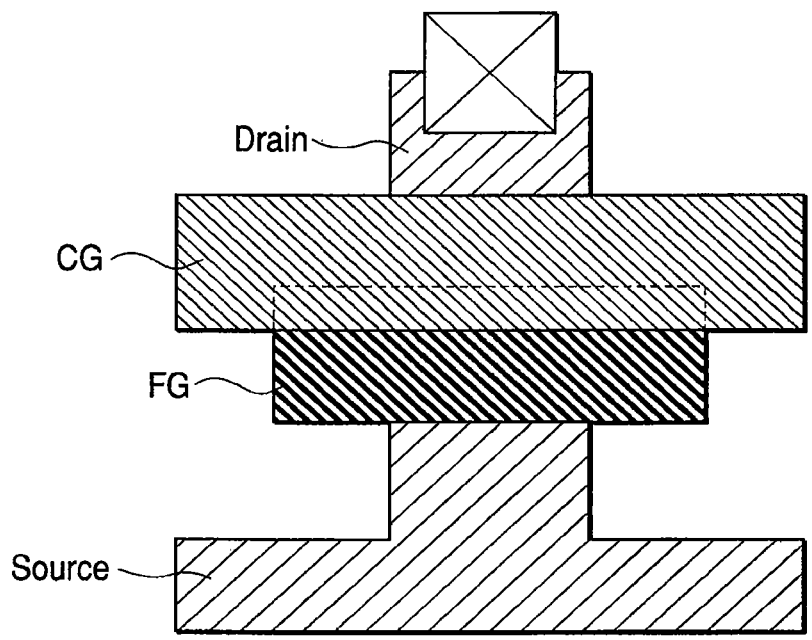
FIG. 14 is a plan view illustrating by way of example a planar configuration of the nonvolatile memory cell shown in FIG. 7.
Figure 15:
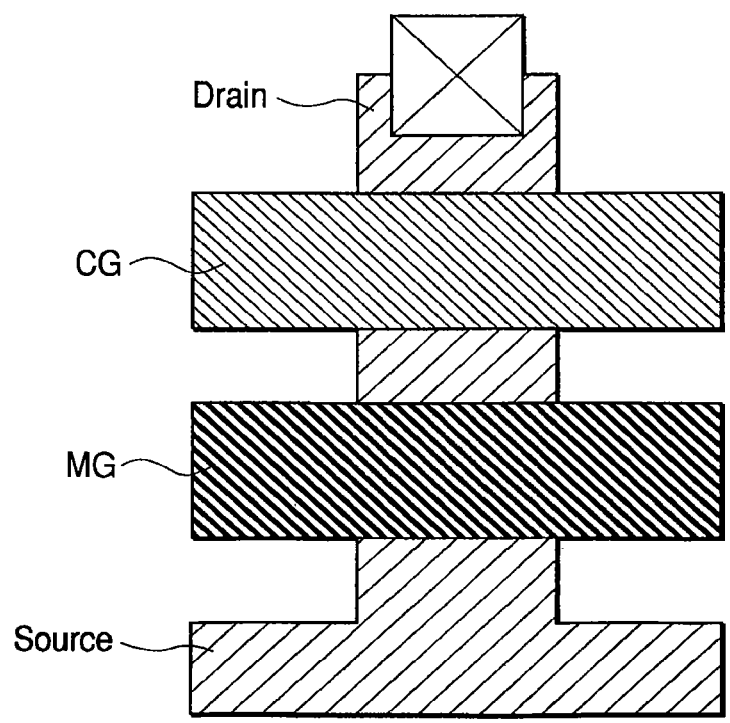
FIG. 15 is a plan view illustrating by way of example a planar configuration of the nonvolatile memory cell shown in FIG. 9.

FIGS. 6 through 9 illustrate nonvolatile memory cells different from the nonvolatile memory cell shown in FIG. 2, as comparative examples. FIG. 6 illustrates by way of example a device section, operating voltages, and a hierarchical bit line structure related to a stack gate type flash memory cell having a floating gate. FIG. 7 illustrates by way of example a device section, operating voltages, and a hierarchical bit line structure related to a split gate type flash memory cell. FIG. 8 illustrates by way of example a device section, operating voltages, and a hierarchical bit line structure related to a 1Tr (Transistor)/1MC (Memory Cell)-type MONOS (Metal Oxide Nitride Oxide Semiconductor) stack gate type flash memory cell. FIG. 9 illustrates by way of example a device section, operating voltages, and a hierarchical bit line structure related to a 2Tr/1MC-type MONOS type memory cell. A planar configuration of each of the nonvolatile memory cells shown in FIGS. 6 and 8 is illustrated by way of example in FIG. 13, a planar configuration of the nonvolatile memory cell shown in FIG. 7 is illustrated by way of example in FIG. 14, and a planar configuration of the nonvolatile memory cell shown in FIG. 9 is illustrated by way of example in FIG. 15.

The stack gate type, the split gate type and the MONOS type respectively need to apply high voltages as bit line voltages Vd or control gate voltages Vcg upon write and erase operations. Thus, since high voltages are applied to a MOS transistor constituting a word driver for driving a control gate electrode, a MOS transistor section directly below the control gate electrode of a memory cell, a ZMOS connected to its drain, and a MOS transistor constituting a Z driver for driving the ZMOS, as necessary, they are constituted using thick-film high-voltage MOS transistors. These thick-film high-voltage MOS transistors are contained in a read path and rate-control a read speed. Accordingly, the use of those nonvolatile memory cells makes it difficult to execute a high-speed read operation.

The erase operation of the stack gate type nonvolatile memory cell shown in FIG. 6 results in the operation of pulling out electrons from a floating gate FG storing the electrons to a substrate by F-N tunneling. The write operation thereof results in the operation of storing electrons in the floating gate FG by hot electrons. The erase operation of the split gate type nonvolatile memory cell shown in FIG. 7 results in the operation of pulling out electrons from a floating gate FG storing the electrons to a control gate by F-N tunneling. The write operation thereof results in the operation of storing electrons in the floating gate FG by injection of hot electrons produced at the end of the control gate into the source side. The erase operation of the 1Tr/1cell-type MONOS type nonvolatile memory cell shown in FIG. 8 results in the operation of pulling out electrons from a nitride film N of a charge storage layer ONO storing the electrons to a control gate by F-N tunneling. The write operation thereof results in the operation of applying a voltage to a source terminal (interchanging the source and drain in a transistor level) and storing hot electrons in the nitride film N of the charge storage region ONO. The erase operation of the 2Tr/1cell-type MONOS type nonvolatile memory cell results in the operation of applying a negative voltage to a memory gate to thereby pull out F-N tunnel electrons from a nitride film N of a charge storage layer ONO storing the electrons to a substrate. The write operation thereof results in the operation of storing electrons in the nitride film N of the charge storage layer ONO with F-N tunneling by the potential of a channel just below the memory gate.

It is apparent that any of the stack gate type, split gate type and MONOS type mentioned as the comparative examples shown in FIGS. 6 through 9 interposes the high-voltage MOS transistor in a memory information read path and has a limitation of speeding up of the read operation.

Figure 10:
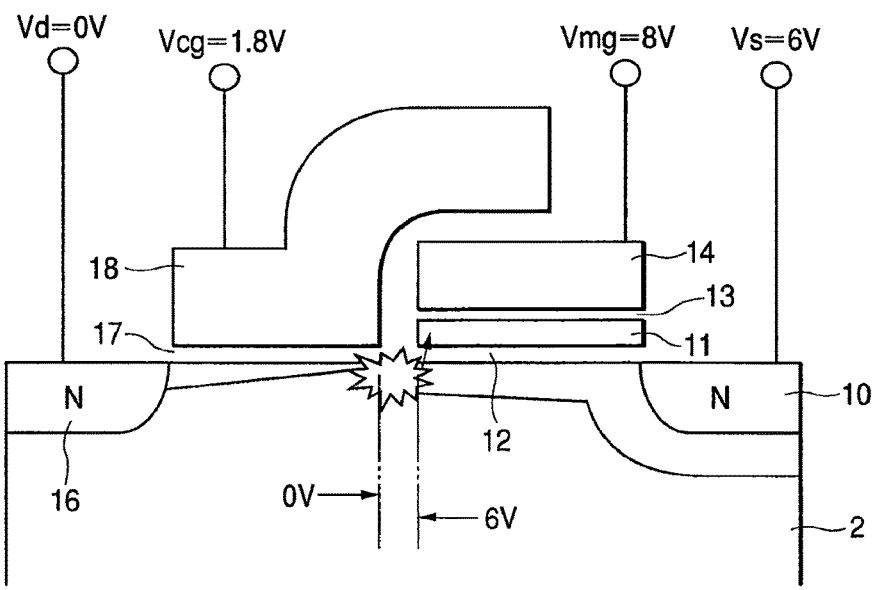
FIG. 10 is a cross-sectional view showing a device section where attention is given to a write operation of the nonvolatile memory cell shown in FIG. 2.

A device section at the time that attention has been given to the write operation of the nonvolatile memory cell shown in FIG. 2, is shown in FIG. 10. In a write voltage state shown in the figure, a channel of 6V is formed up to the neighborhood of the control gate electrode 18 just below the charge storage region 11. On the other hand, a channel just below the control gate electrode 18 is 0V. Thus, a steep electric field (sudden electric field) is formed just below the memory gate electrode 18 of the charge storage region 11 to make it possible to control a current that flows through a source-to-drain channel. Hot electrons are produced by the sudden electric field and stored in the charge storage region 11. Since the channel just below the control gate electrode 18 is 0V, the insulating film 17 of the control gate electrode 18 is guaranteed to be thinned to the extent identical or substantially equal to a majority of MOS transistors such as logic circuits free of high withstand voltages, etc. When the current is narrowed down, the channel just below the control gate electrode 18 is about 0.8V.

Figure 11:
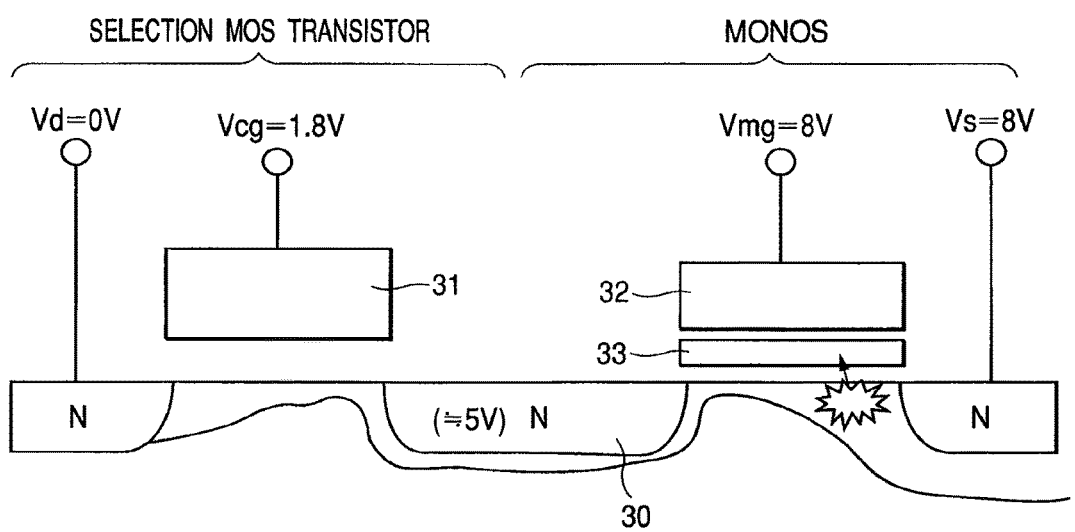
FIG. 11 is a cross-sectional view showing the manner in which a voltage applied state analogous to a write voltage state of FIG. 10 is given to a structure of a nonvolatile memory cell made up of a series circuit of memory holding MONOS and selection MOS transistors.

The reason why the channel just below the control gate electrode 18 is not set to 6V upon the write operation, is that no high-density impurity region, e.g., diffusion layer is formed between the bit line electrode 16 and the source line electrode 10 formed in the well region 2. Assuming that a structure of a nonvolatile memory cell (equivalent to MONOS of FIG. 9) made up of a series circuit of a memory holding MONOS and a selection MOS transistor is configured as one example as illustrated by way of example in FIG. 11, series-connected nodes of both transistors are configured as a diffusion region (source-drain region) 30 common to both. When the common diffusion region 30 common to both the transistors is interposed therebetween, a high voltage at writing is applied to the MONOS to form a channel, so that the high voltage on the MONOS side is applied to the selection MOS transistor from the channel via the diffusion region 30 common to the two transistors. In FIG. 11 showing the voltage applied state analogous to the write voltage state of FIG. 10, a voltage close to 5V is applied to the diffusion layer 30 lying between the control gate electrode 31 and the memory gate electrode 32, and hot electrons are produced at a drain end and taken or brought in a charge storage layer 33. Since the diffusion layer 30 between the control gate electrode 31 and the memory gate electrode 32 results in 5V, an insulating film for the control gate electrode 31 needs to reach the thickness of an insulating film for each high-voltage MOS. Hence the read operation at high speed cannot be performed. As is the case even in FIG. 9, it is essential that the selection MOS transistor is of a high-withstand voltage type in the case of the MONOS type memory cell.

Figure 16:
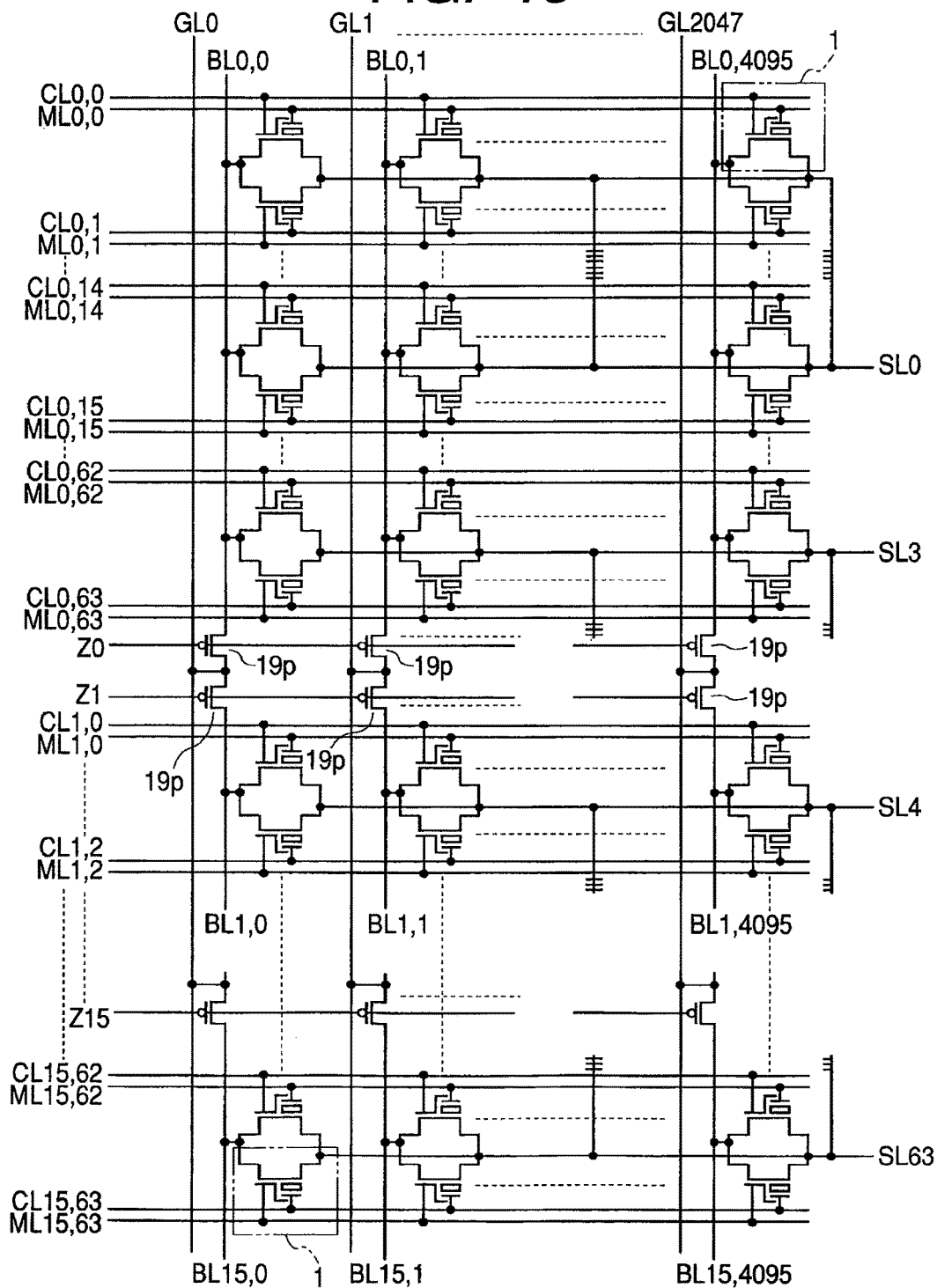
FIG. 16 is a circuit diagram showing one example of a memory cell array which adopts the nonvolatile memory cell shown in FIG. 1.

One example of a memory cell array having adopted the nonvolatile memory cells 1 is shown in FIG. 16. The nonvolatile memory cells 1 are arranged in matrix form with 1024 rows×2048 columns and share source lines SL in units of 16 rows×2048 columns. 64 nonvolatile memory cells corresponding to one column are connected to a sub bit line BL and are respectively connected to a main bit line GL via a p channel ZMOS 19*p*. When a p channel type MOS transistor is adopted as the ZMOS 19*p*, a propagation signal level is not reduced a threshold voltage before and after the ZMOS 19*p*. It is thus possible to satisfactorily cope with a voltage reduction in read signal level to the corresponding bit line LB.

Figure 17:
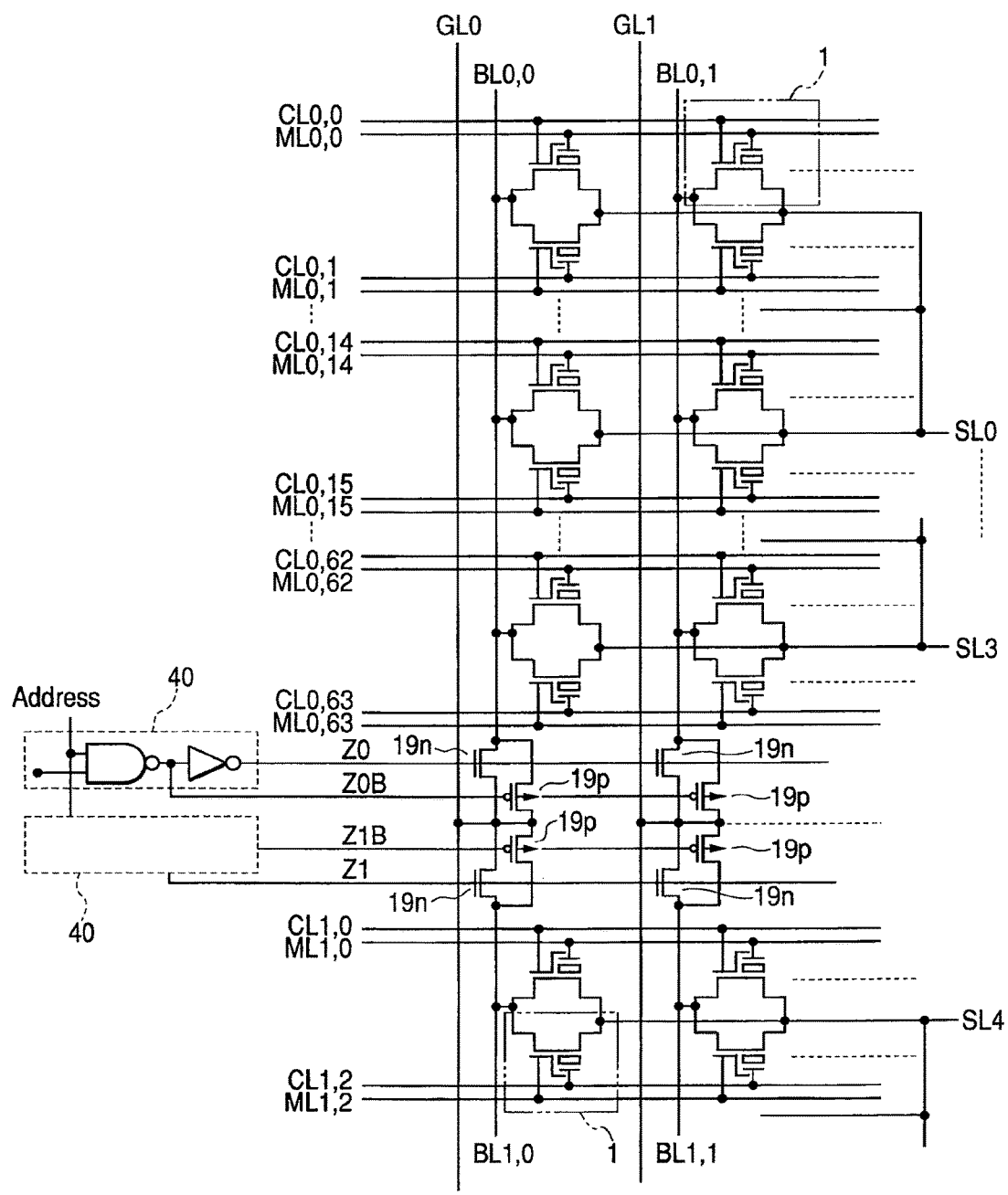
FIG. 17 is a circuit diagram depicting one example of a memory cell array in which ZMOSs are constituted by CMOS transfer gates.

However, even if an attempt to set the bit line LB to a circuit's ground potential (0V) is made when the writing or erasure of the nonvolatile memory cell 1 is performed, the potential of the bit line does not reach a level lower than the threshold voltage of the p channel type ZNOS 19*p*. In order to solve it, CMOS transfer gates may be adopted wherein p channel type ZMOSs 19*p* and n channel type ZMOSs 19*n* are connected in parallel as illustrated by way of example in FIG. 17. The ZMOSs 19*p* and 19*n* constituting the CMOS transfer gates are respectively switch-controlled by decode signals of address decoders. Logic designated at numeral 40 means the final decode output stage of the address decoder.

Figure 18:
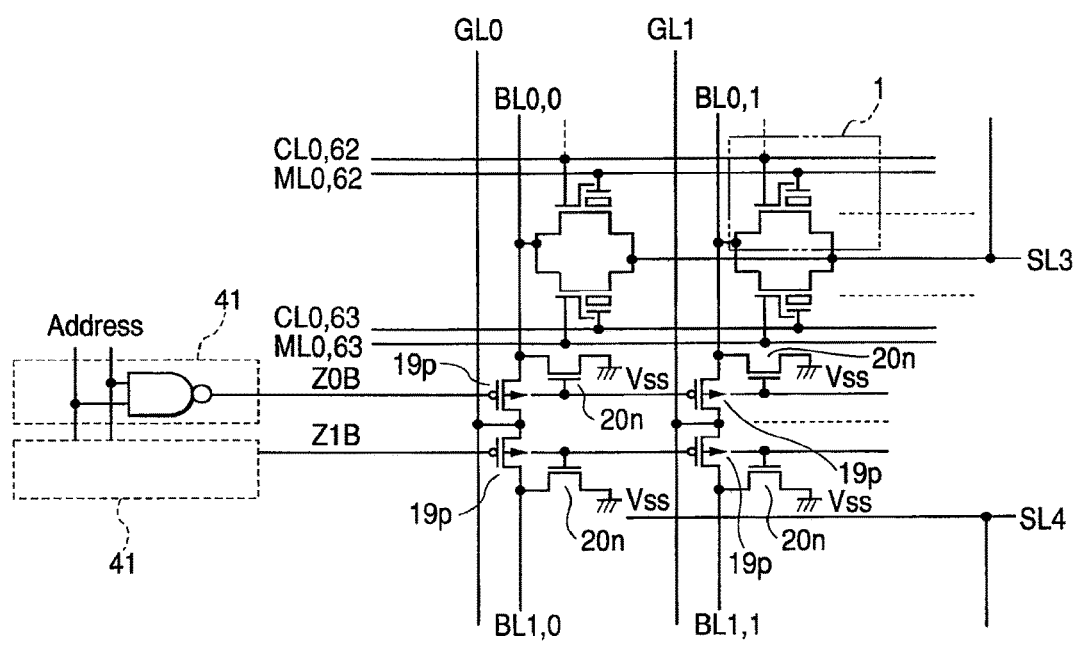
FIG. 18 is a circuit diagram showing one example of a memory cell array which adopts sub bit line discharge transistors.

Another example of a memory cell array having adopted the nonvolatile memory cells 1 is shown in FIG. 18. In the example shown in the same figure, n channel type discharge MOS transistors 20*n* switch-operated complementarily to p channel type ZMOSs 19*p* are provided at their corresponding sub bit lines LB. Thus, when the sub bit line LB is selected via the ZMOS 19*p,* the sub bit line LB is perfectly discharged by the corresponding discharge MOS transistor 20*n*. It is therefore possible to prevent the level of a main bit line GL precharged before the start of reading from undesirably varying, stabilize a sense operation of a read signal by a differential sense amplifier or the like, and make a contribution to the speeding up of a read operation. The ZMOS 19*p* and the discharge MOS transistor 20*n* are switch-controlled by a decode signal of an address decoder. Logic designated at numeral 41 means the final decode output stage of the address decoder.

Figure 19:
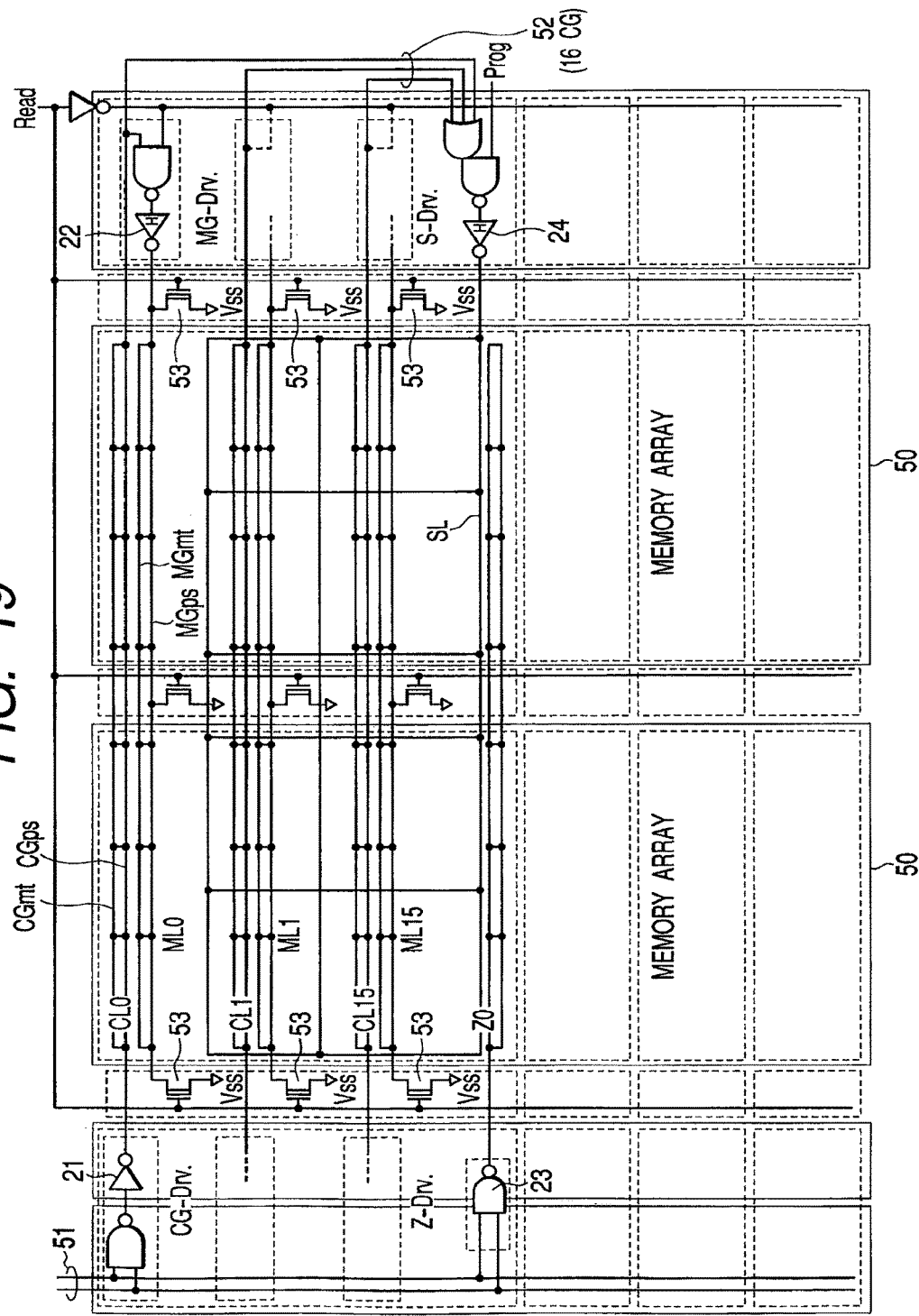
FIG. 19 is a circuit diagram illustrating by way of example the layout of drivers with respect to the memory cell arrays each of which adopts the nonvolatile memory cell shown in FIG. 1.

The layout of drivers associated with the memory cell arrays each having adopted the nonvolatile memory cells 1 is illustrated by way of example in FIG. 19. Each of the memory cell arrays 50 and 50 has such a configuration as explained in FIG. 16, for example. The first driver 21 and third driver 23 are disposed on one side and the second driver 22 and fourth driver 24 are disposed on the other side, with the two memory cell arrays 50 and 50 being interposed therebetween. The first driver 21 and the third driver 23 respectively receive an address decode signal 51 so that their operations are selected. The second driver 22 and the fourth driver 24 respectively receive an output signal 52 of the first driver 21 so that their operations are selected. It is thus possible to separate drivers each operated with a high voltage as an operating source or power supply and circuits each operated with a relatively low voltage as an operating power supply from side to side.

Incidentally, the write operation can be performed in control gate or memory gate units in the configuration shown in FIG. 19. At this time, source lines are shared with memory cells corresponding to 16 rows as units. Further, the source lines are drive-controlled using OR signals on sixteen control gate control lines 52. Prog is a write operation control signal.

Within the memory arrays 50 and 50, memory gate control lines ML are respectively formed integrally with memory gate electrodes and constituted by laminating low resistance metal layers MGmt over polysilicon layers MGps. The polysilicon layers MGps and the low resistance metal layers MGmt are brought into contact at suitable spots. Control gate control lines CL are also formed integrally with control gate electrodes and constituted by laminating low resistance metal layers CGmt on polysilicon layers CGps. The polysilicon layers CGps and the low resistance metal layers CGmt are also brought into contact at suitable positions. With the adoption of a shunt structure wherein polysilicon wirings are backed in the low resistance metal layers, wiring resistance can be reduced.

Discharge MOS transistors 53 for causing the memory gate control lines ML to be conducted to a circuit's ground potential Vss (0V) in response to a read operation are provided at different positions of the memory gate control lines ML. Even if a relatively large delay component produced due to the parasitic capacitance and wiring resistance or the like of each memory gate control line ML exists, the memory gate control line ML can be rapidly discharged to 0V for the purpose of the read operation, so rapid transition to a read operation enable state is enabled.

In the configurations of the memory cell arrays 50 described in FIGS. 16 through 19, byte (8-bit) writing is enabled as a write unit. Further, since the write current is small as compared with the normal hot electrons because of the source side injection as mentioned above, writing in control gate control line (word line) units such as 128 bytes is also enabled. Though erase units are basically used as the word line units, the erase units may be units that use the source lines SL illustrated by way of example in FIG. 16 in common. Alternatively, units of a plurality of source lines SL may be batch-collected.

Incidentally, when defect relief in a word line direction is taken into consideration, the unit of the defect relief results in the unit that uses at least the source line SL in common. In order to carry out the defect relief, although not shown in the drawing in particular, there are provided a relief memory array replaced with a defective portion, a relief address program circuit which stores an address to be relieved through a nonvolatile memory or the like, an address comparator which compares the address stored in the relief address program circuit with an access address, and a relief selection circuit. When the result of comparison by the address comparator indicates that they coincide with each other, the relief selection circuit prohibits accessing based on the access address and operates the relief memory array by use of a relief address related to the coincidence as an alternative to it.

Figure 20:
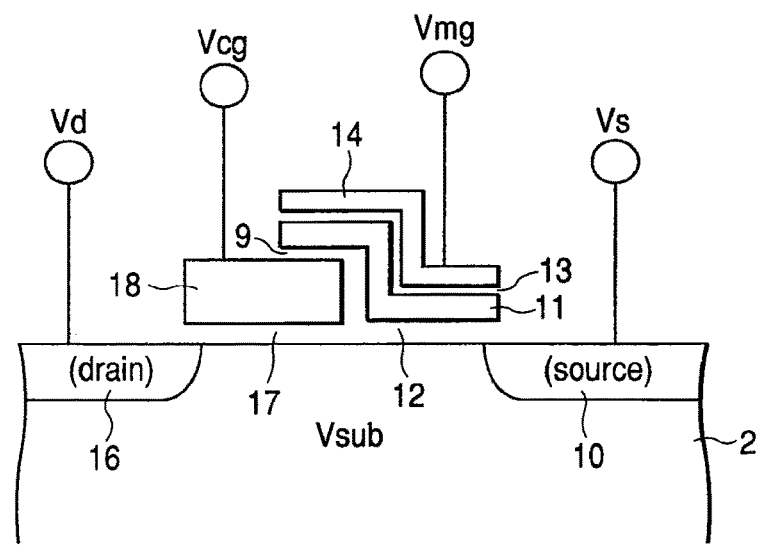
FIG. 20 is a circuit diagram showing one example of a memory cell array.
Figure 21:
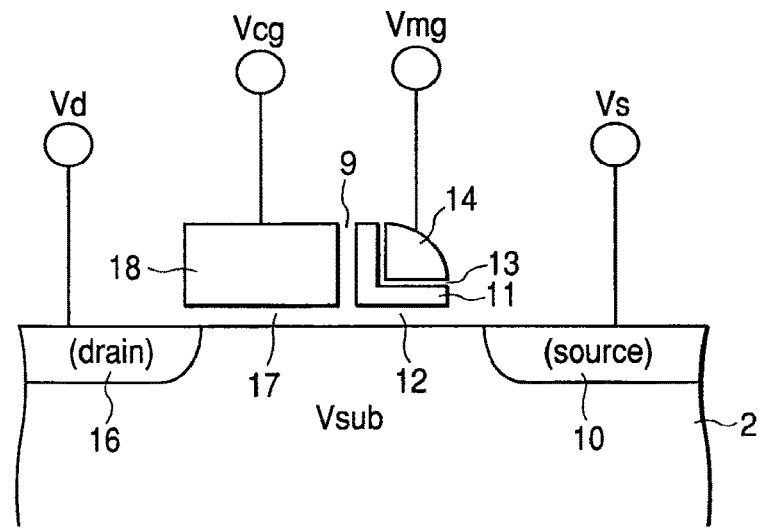
FIG. 21 is a circuit diagram illustrating another example of the memory cell array.
Figure 22:
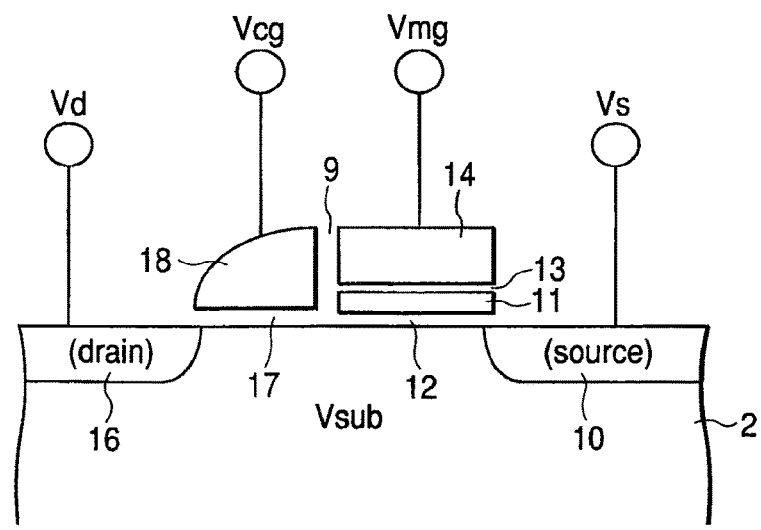
FIG. 22 is a circuit diagram showing a further example of the memory cell array.

FIGS. 20 through 22 show other sectional structures of the nonvolatile memory cell 1 according to the present invention. As illustrated by way of example in FIG. 20, a charge storage region 11 and a memory gate electrode 14 may be disposed above a control gate electrode 18. As shown in FIG. 21, a charge storage region 11 and a memory gate electrode 14 are disposed adjacent to a control gate electrode 18, and the memory gate electrode 14 may be formed as a sidewall gate. Alternatively, as shown in FIG. 22, a control gate electrode 18 may be formed as a sidewall gate.

Although not shown in the figure in particular, the charge storage region 11 is not limited to adoption of a charge trapping insulating film covered with an insulating film, like the above-described silicon nitride film (silicon nitride film). As an alternative to it, a conductive floating gate electrode (e.g., polysilicon electrode) covered with an insulating film, or a conductive particle layer or the like covered with an insulating film may be adopted. The conductive particle layer can be constituted by, for example, nanodots in which polysilicon is formed in dot form.

A whole configuration of a semiconductor device, e.g., a microcomputer in which a nonvolatile memory having adopted the nonvolatile memory cells described above is provided on-chip, is shown in FIG. 24. Although not restricted in particular, the microcomputer 60 is formed on one semiconductor substrate (semiconductor chip) like monocrystal silicon by a CMOS integrated circuit manufacturing technology. The microcomputer 60 includes a CPU (Central Processing Unit) 61, a RAM 62 which serves as a volatile memory, a flash memory module 63 which serves as a nonvolatile memory, a flash memory controller 64, a bus state controller 65, an input/output circuit (I/O) 66 such as an input/output port circuit or the like, and other peripheral circuit 67. Those circuit modules are connected to an internal bus 68. The internal bus 68 includes signal lines respectively used for addresses, data and control signals. The CPU 61 includes an instruction controller and an execution unit, and decodes a fetched instruction and performs arithmetic processing according to the result of decoding. The flash memory module 63 stores an operation program for the CPU 61 and data therein. The RAM 62 serves as a work area or a data temporary storage area for the CPU 61. The operation of the flash memory module 63 is controlled based on control data set to the flash controller 64 by the CPU 61. The bus state controller 65 controls the number of access cycles, waist state insertion, a bus width, etc. with respect to access and external bus access via the internal bus 68.

Figure 24:
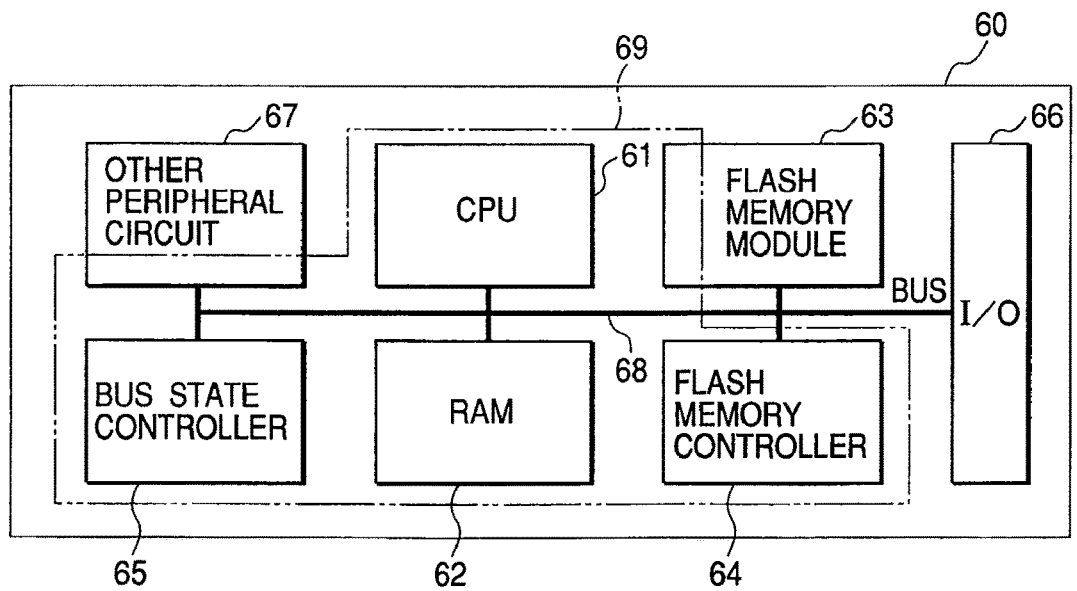
FIG. 24 is a block diagram of a microcomputer in which a nonvolatile memory having adopted the nonvolatile memory cells is provided on-chip.

A circuit indicated by an area 69 surrounded by a chain double-dashed line in FIG. 24 means a circuit portion constituted by MOS transistors relatively thin in gate oxide film. Circuits other than the area 69 result in circuit portions constituted by high-voltage MOS transistors relatively thick in gate oxide film. As the circuit portion, is mentioned, for example, an area formed with high-voltage drivers 22 and 24, etc. in the flash memory module 63.

Figure 25:
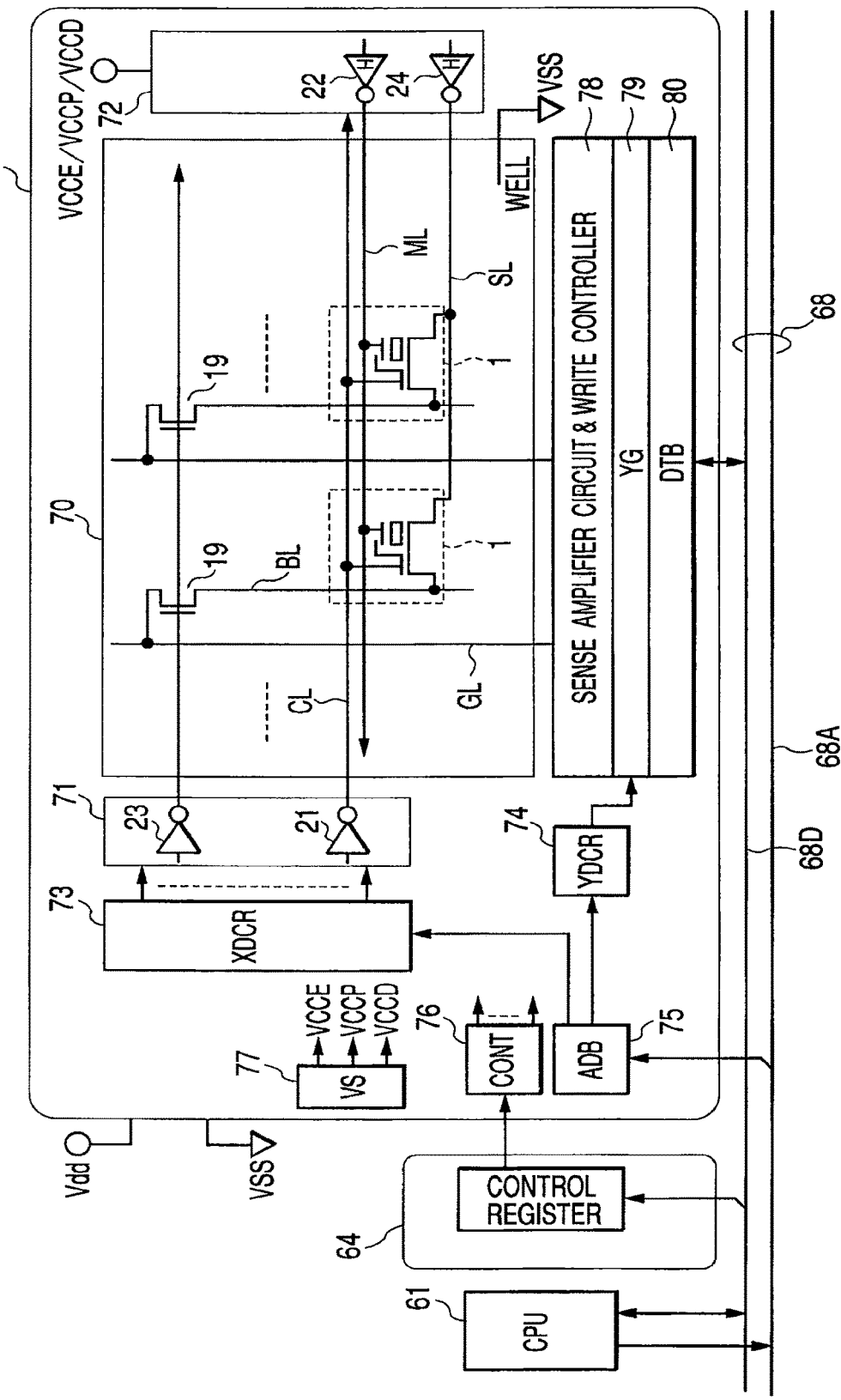
FIG. 25 is a block diagram showing a detailed one example of a flash memory module.

A detailed one example of the flash memory module is shown in FIG. 25. A memory array 70 has such configurations as described in FIGS. 16 and 19 and the like. A driver circuit 71 is a circuit block provided with the drivers 23 and 21, etc. A driver to be output-operated in accordance with a code signal is selected by the corresponding address supplied from an X address decoder (XDCR) 73. A driver circuit 72 includes the drivers 22 and 24, etc. A driver to be output-operated is selected in accordance with a control gate control line CL state or the like. A sense amplifier circuit and write controller 78 is connected to global bit lines GL. The sense amplifier circuit 78 amplifies and latches read data read out into the corresponding global bit line GL. The write controller 78 latches write control information to be supplied to the corresponding global bit line upon a write operation. The sense amplifier circuit and write controller 78 is connected to a data input/output buffer (DTB) 80 via a Y selection circuit (YG) 79 and is hence capable of interfacing with a data bus 68D included in the internal bus 68. Upon a read operation, the Y selection circuit 78 selects read data latched in the sense amplifier circuit 78 in accordance with an address decode signal outputted from a Y address decoder (YDCR) 74. The selected read data can be outputted to the outside via the data input/output buffer 80. Upon the write operation, the Y selection circuit 78 controls to which global bit line write data supplied from the data input/output buffer 80 is caused to correspond and whether the write data is latched in the write controller 78.

An address signal is supplied from an address bus 68A to an address buffer 75 from which it is supplied to the X address decoder 73 and the Y address decoder 74. A voltage generator (VS) 77 generates operating power supplies necessary for reading, erasure and writing, based on external power supplies Vdd and Vss. Considering write operating voltages shown in FIG. 2, for example, they result in Vdd=1.8V, VCCE=12V, VCCP=8V and VCCD=6V.

A controller (CONT) 76 performs a control sequence of a read operation, an erase operation and a write operation of the flash memory module 63 and switching control on the operating power supplies therefor in accordance with the control information set to the flash memory controller 64. The switching control on the operating power supplies corresponds to control for switching the operating power supplies of the drivers 21 through 24 according to the operating modes of FIG. 2 in accordance with the read operation, erase operation and write operation.

Other write voltage conditions and the like with respect to the nonvolatile memory cell are illustrated by way of example in FIG. 31. A basic difference between FIG. 31 and FIG. 2 resides in that the power supply voltage Vdd is changed from 1.8V to 1.5V, and the memory gate voltage Vmg at reading is changed from 0V to Vdd=1.5V. Further, the source voltages Vs and memory gate voltage Vmg at writing (Program) and erasure (Erase) are also changed. A hierarchical structure using ZMOSs 19 is not adopted for each bit line BL in FIG. 31. The adoption of such a bit line hierarchical structure as shown in FIG. 2 is allowed. Even in FIG. 31, an effect similar to FIG. 2 can be obtained.

Figure 32:
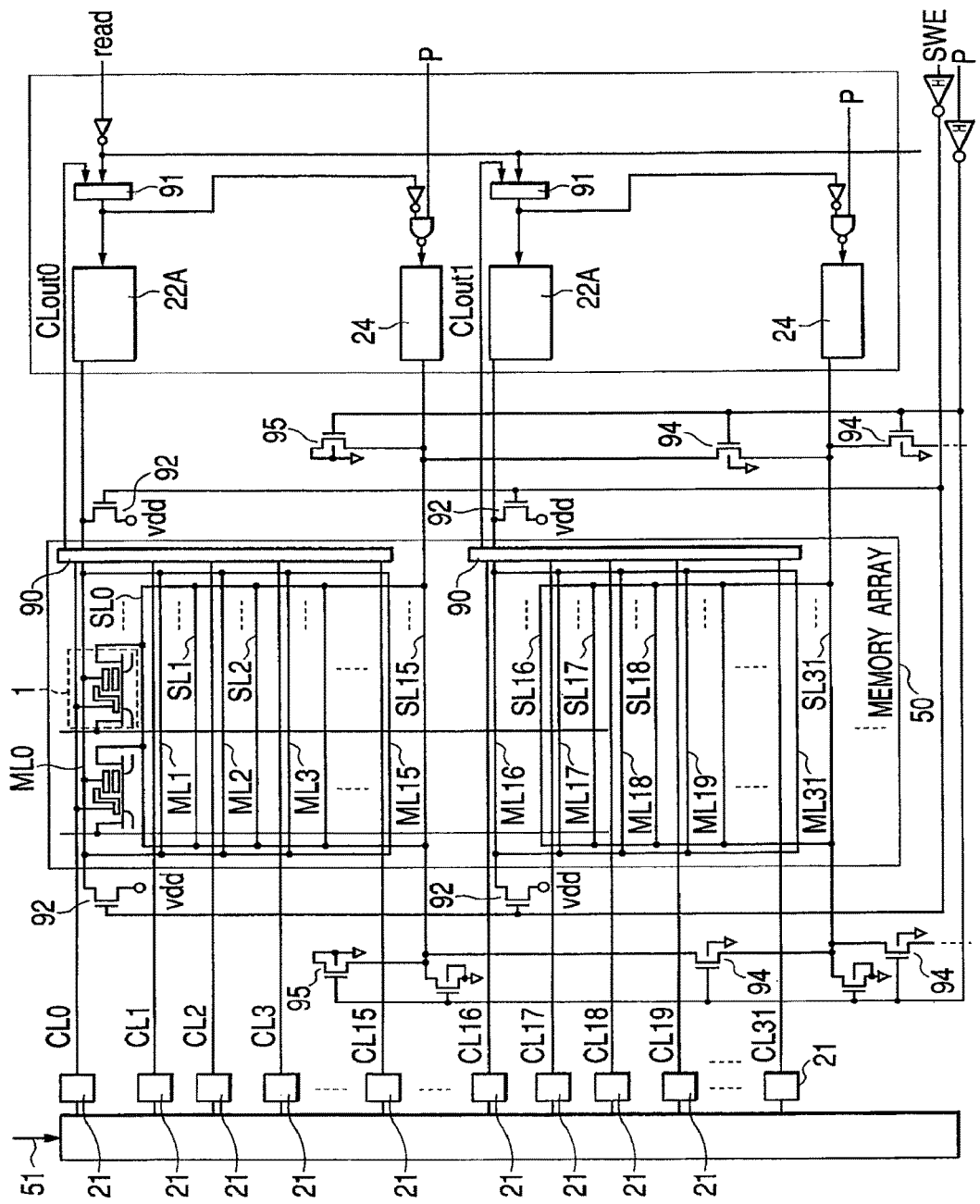
FIG. 32 is a circuit diagram showing another example illustrative of the layout of a memory cell array having adopted the nonvolatile memory cells, and drivers.

Another example related to the layout of a memory cell array having adopted the nonvolatile memory cells 1, and drivers is shown in FIG. 32. In the example of FIG. 32 in a manner similar to FIG. 19, the control gate drivers 21 respectively receive address decode signals so that their operations are selected, whereas memory gate drivers 22A and source drivers 24 are respectively provided so that their operations are selected based on the outputs of the control gate drivers 21. The control gate drivers 21 are disposed on one side and the memory gate drivers 22A and source drivers 24 are disposed on the other side, with a memory array 50 being interposed therebetween. Thus, drivers each operated with a high voltage as an operating power supply and circuits each operated with a relatively low voltage as an operating power supply are separated from one another. A configuration described till here is identical to that shown in FIG. 19, and the points of difference between FIG. 32 and FIG. 19 will be explained below. Incidentally, since the memory gate driver 22A increases in drive load with respect to the memory gate driver 22, it may have drive capacity larger than that of the memory gate driver 22 where the memory gate driver 22A falls short of it.

The first point of difference is that memory gate control lines ML are commonly connected in plural units. That is, the memory gate control lines ML paired with the control gate control lines CL share the use of the memory gate driver 22A in sixteen units, for example. The source lines SL also share the use of the source driver 24 in sixteen units, for example. At this time, the number Nm1 of the memory gate control lines ML shared by the memory gate driver 22A satisfies a condition (Nm1≤Ns1) that it is set less than or equal to the number Ns1 of the source lines SL shared by the source driver 24.

The above conditions result from the following reasons. When the current is caused to flow between the source and drain to thereby apply a high voltage to the memory gate electrode 14 as a write format relative to the nonvolatile memory cell, the electric field between the source and memory gate of a write non-selected nonvolatile memory cell that shares the memory gate control lines ML between the write non-selected nonvolatile memory cell and a write selected memory cell does not increase in particular if the source potential Vs for causing the current to flow between the source and drain of the write selected memory cell is applied to its corresponding source line SL. In the examples shown in FIGS. 31 and 32, the difference in potential between the source and memory gate is about 6V. If the source potential is of a low source potential for write non-selection, then a large potential difference like 12V is formed between the source and memory gate of the write non-selected memory cell that shares the memory gate control lines between the write non-selected memory cell and the write selected memory cell. There is a possibility that this will bring about the action of a large electric field comparable to at erasure. A disturbance occurs that such a large electric field undesirably changes the threshold voltage of a memory cell placed in a write state. The above-relationship between the number of the memory gate control lines ML shared by the memory gate driver 22A and the number of source lines SL shared by the source driver 24 is of use in preventing the fear of such a disturbance beforehand.

Figure 33:
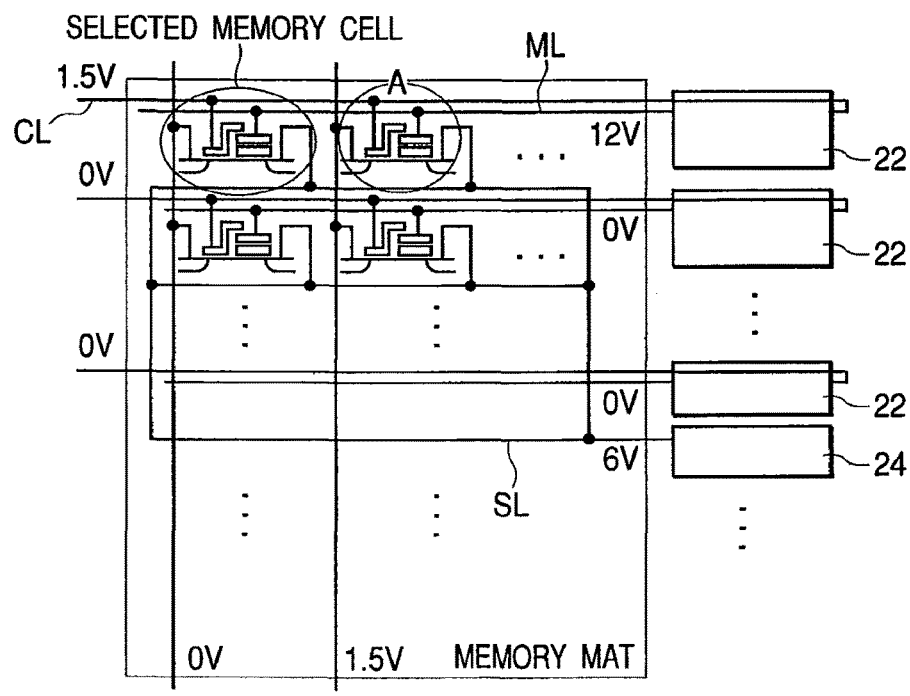
FIG. 33 is a circuit diagram illustrating by way of example a circuit format in which memory gate control lines are individually driven by their corresponding drivers according to the selection of control gate control lines as shown in FIG. 19.
Figure 34:
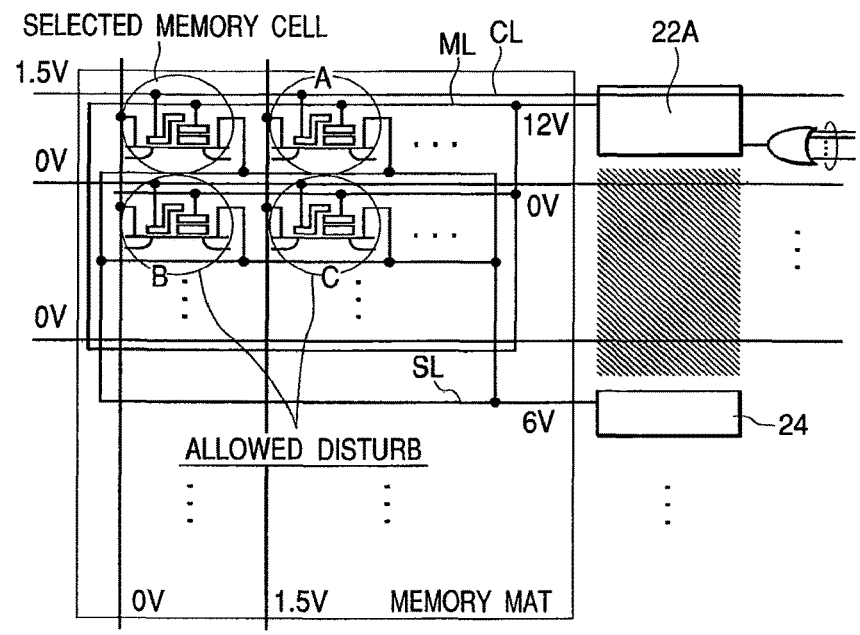
FIG. 34 is a circuit diagram principally showing a drive format of memory gate control lines corresponding to FIG. 32.
Figure 35:
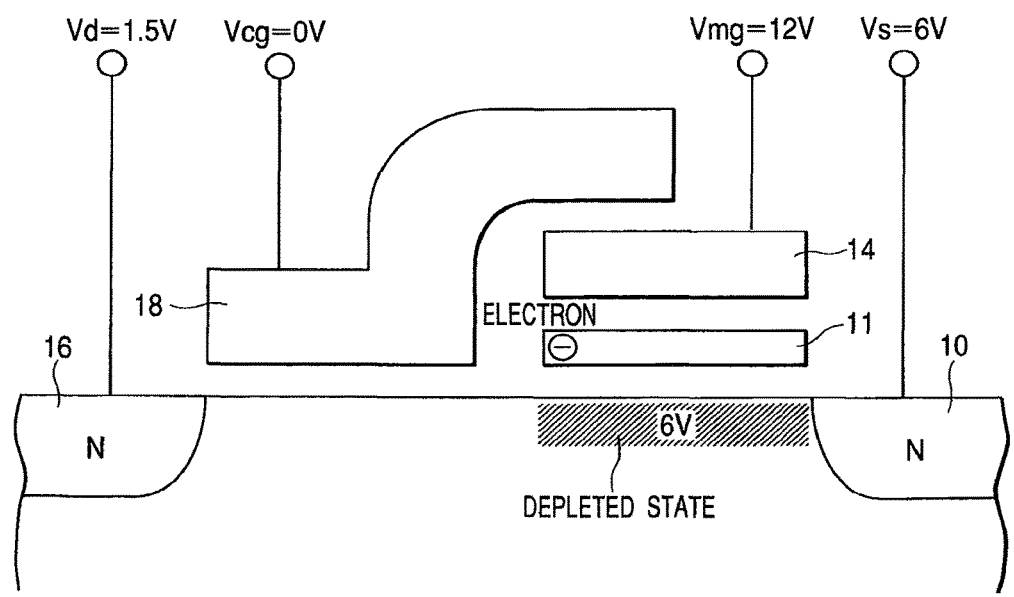
FIG. 35 is an explanatory view showing in detail a state in which voltages are applied to a memory cell in an allowable disturb state.

The reasons thereof will be further described in detail. FIG. 33 illustrates by way of example a circuit format in which memory gate control lines ML are individually driven by their corresponding drivers 22 in a one-to-one correspondence relation between the memory gate control line and the control gate control line as shown in FIG. 19. A disturbed one is only a memory cell designated at A lying in the same row in which the memory gate control line ML is shared with a write selected memory cell. Since 6V is applied to a source line SL in a manner similar to the write selected memory cell even in the case of the memory cell indicated by A, only a potential difference of about 6V occurs between the source and memory gate thereof. Therefore, such a large electric field as produced upon erasure does not occur, so this results in an allowable disturbance. If other memory cells are different from the write selected memory cell in memory gate control line ML even if the source line is commonly connected to each write selected memory cell in FIG. 33, only an electric filed opposite in direction to that at the erasure occurs between the source and memory gate, so that a disturbance at writing does not occur. A voltage applied state of the memory cell in the state of the above-described allowable disturbance is represented as shown in FIG. 35 if described in detail. In the case of FIG. 34 corresponding to FIG. 32, the potential difference of about 6V occurs between the source and memory gate in each of memory cells designated at B and C in a manner similar to the memory cell designated at A. However, this is the same as the memory cell designated at A in FIG. 33 and hence only the allowable disturbance occurs. This is because when the number of memory gate control lines ML selected for writing is larger than the number of source lines for write selection in FIG. 34, a potential difference of 12V is formed, in the direction of the same electric field as at erasure, between the source and memory gate of each memory cell connected to the write non-selected source line and the write selected memory gate control line from the relationship in which 0V is applied to the write non-selected source line and 12V is applied to the write selected memory gate line, whereby the memory cell is placed in a state comparable to that at erasure.

Under the above condition Nm1≤Ns1, the memory gate driver 22A is shared between the memory gate control lines ML and the source driver 24 is shared between the source lines SL, whereby a chip occupied area formed by the drivers 22A and 24 can be significantly reduced as illustrated by way of example in FIG. 34. In FIG. 33, the memory gate drivers 22 are disposed 1024 with respect to 1024 control gate control lines CL, whereas in FIG. 34, they may be provided 64 equal to one-sixteenth the 1024 memory gate drivers.

Figure 36:
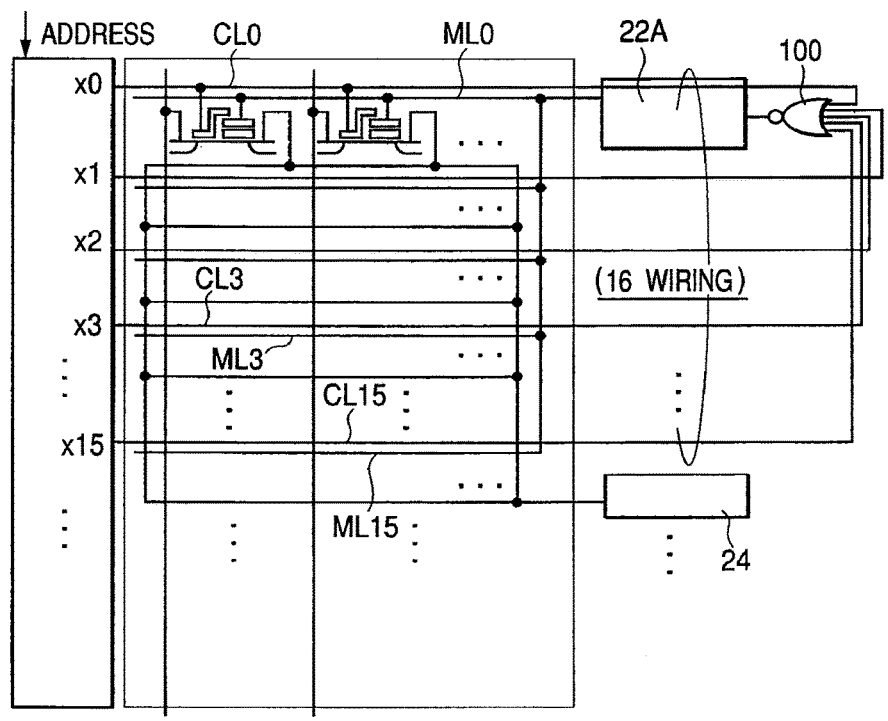
FIG. 36 is a circuit diagram illustrating by way of example a configuration which needs routing of control gate control lines as a drive form of memory gate control lines.

The second point of difference resides in a logic structure for generating drive control signals used for the memory gate driver 22A and the source driver 24. That is, as shown in FIG. 32, the memory gate driver 22A and the source driver 24 are configured so as to be driven based on the output of an OR circuit 90 for forming ORing of selected states corresponding to their corresponding sixteen control gate control lines CL0 through CL15. At this time, in order to reduce the routing of the control gate control lines CL0 through CL15, the OR circuit 90 is disposed close to a memory array 50, and a OR result signal CLout0 thereof is supplied to the drivers 22A and 24. Thus, such wire routing as illustrated by way of example in FIG. 36 becomes unnecessary. Further, there is no need to extend control gate control lines CL0 through CL15 in the vicinity of a driver 22A and input them to an OR circuit 100.

Figure 37:
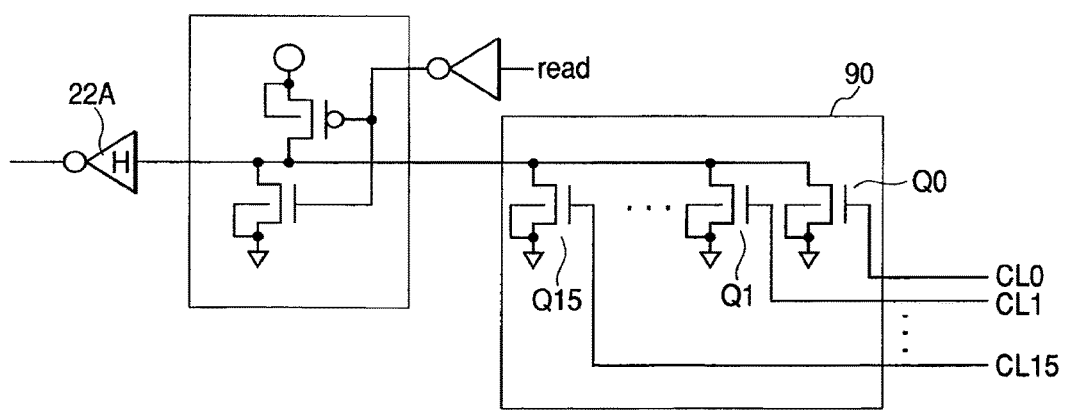
FIG. 37 is a circuit diagram illustrating by way of example a specific configuration of a logic circuit.

A specific configuration of the OR circuit 90 is shown in FIG. 37. The OR circuit 90 comprises a NOR (NOR) gate. In the drawing, a NOR gate 91 is interposed in its subsequent stage. The NOR gate 91 is not used with respect to instructions for a read operation by a signal Read, and a voltage Vdd is applied to all memory gates. In other words, the NOR gate 91 is used for erase and write operations other than the read operation.

Figure 38:
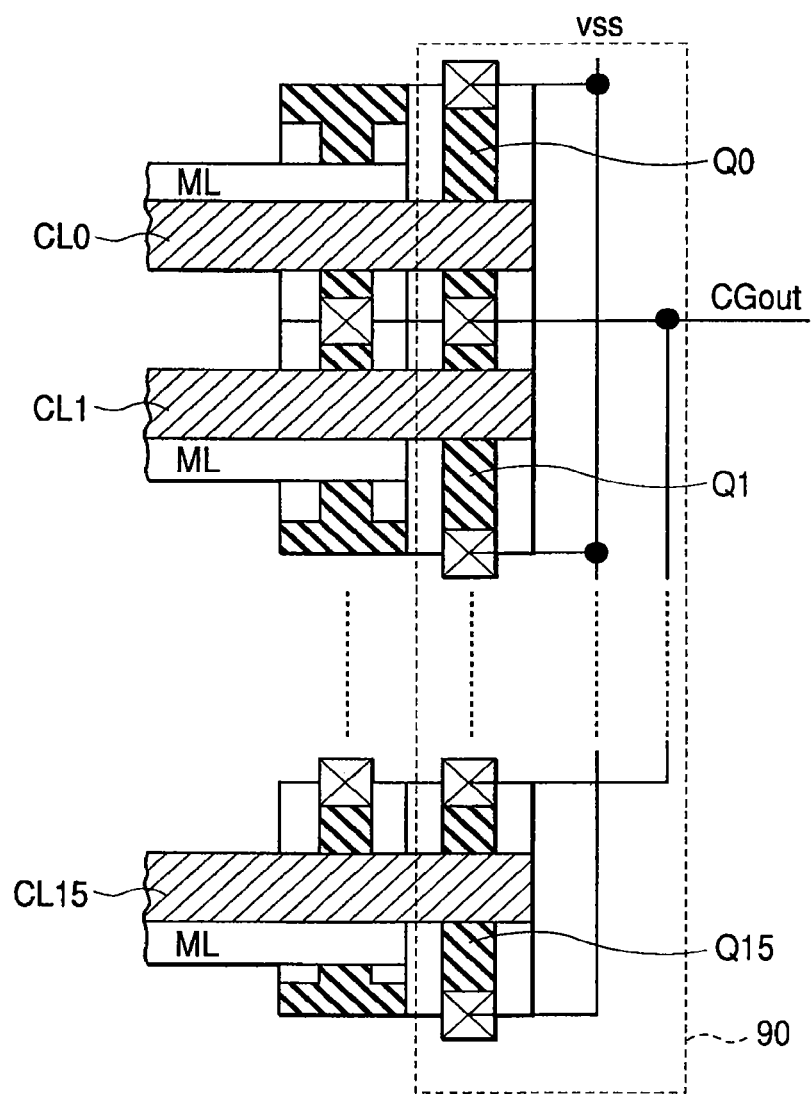
FIG. 38 is a plan view illustrating by way of example a layout configuration of a NOR gate.

In order to reduce a layout area of the NOR gate 90 in particular, extended portions of control gate control lines CL0 through CL15 are constituted using transistors Q0 through Q15 used as gate electrodes. A layout configuration of the NOR gate 90 is illustrated by way of example in FIG. 38.

The third point of difference resides in an improvement made from the viewpoint of speeding up of the read operation. That is, as illustrated by way of example in FIG. 32, a plurality of charge MOS transistors 92 for causing the memory gate control lines ML0, . . . to be conductive to the power supply voltage Vdd in response to the read operation are respectively provided at different positions of the memory gate control lines ML. The time required to cause the corresponding memory gate control line ML to transition to a desirable level from the read operation viewpoint can be shortened. The charge MOS transistor 92 is brought to an on state in response to a state for instructing rewrite disable by a signal SWE.

Figure 39:
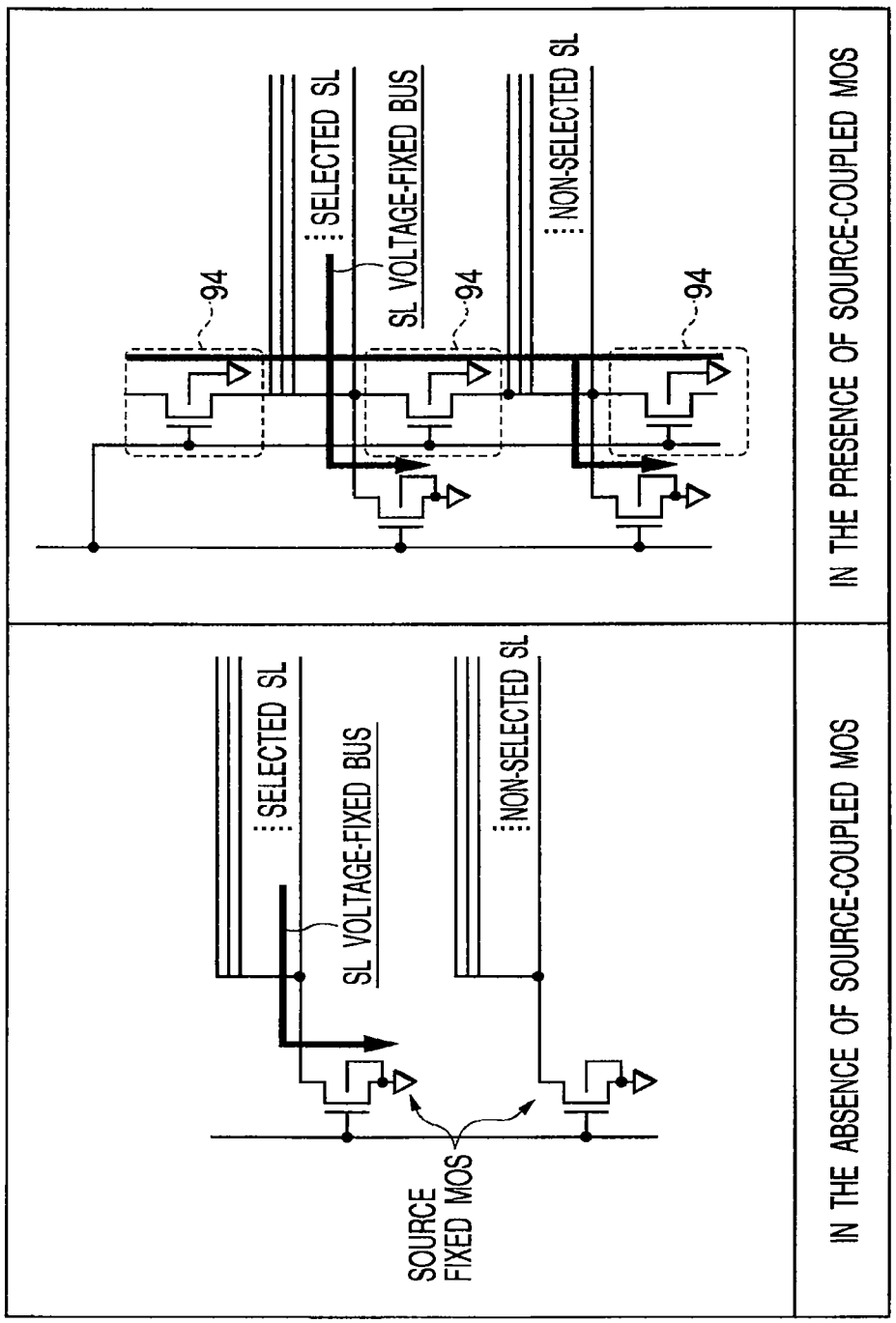
FIG. 39 is an explanatory view illustrating by way of example the difference between effects obtained according to whether source-line coupled MOS transistors are adopted.

Further, as illustrated by way of example in FIG. 32, there are provided MOS transistors 95 for causing the source lines SL0, . . . that share the use of the source driver 24 in sixteen units, to be conducted to a circuit's ground potential in response to the read operation. Furthermore, there are provided coupling MOS transistors 94 for selectively bringing groups of the source lines SL set in sixteen units into conduction. As illustrated by way of example in FIG. 39, the coupling MOS transistors 94 and the MOS transistors 95 are turned on upon the read operation to thereby make it possible to apparently make a resistance reduction in the source line SL. The MOS transistors 94 and 95 are respectively brought to an on state in response to a state for giving instructions for non-writing by a signal P in FIG. 32.

Figures 40, 41:
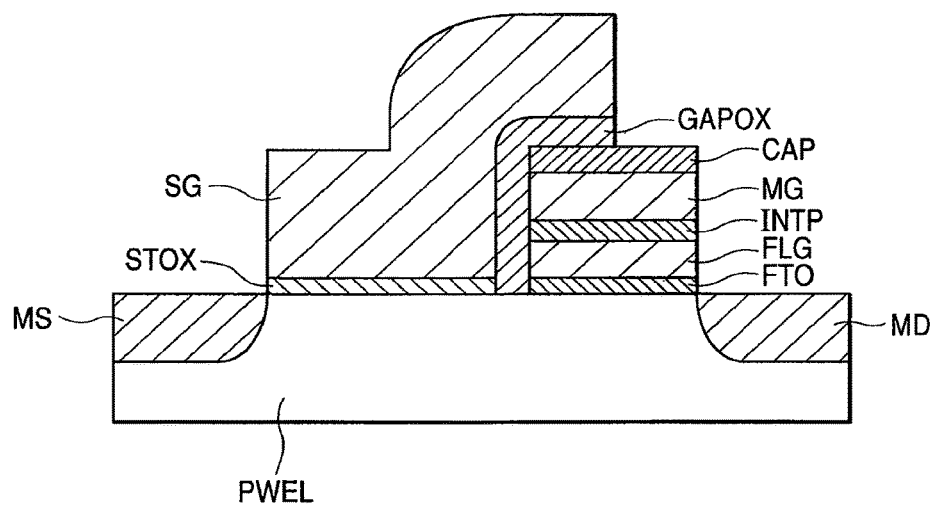
FIG. 40 is a cross-sectional view of a memory cell according to a first embodiment of the present invention.
FIG. 41 is a diagram for describing the operation of the memory cell according to the first embodiment of the present invention and voltages applied thereto.

FIG. 40 is a cross-sectional view showing a first embodiment of the present invention, which is illustrative of a memory cell using a floating gate. The memory cell comprises a p type well region PWEL provided over a silicon substrate, an n type diffusion layer MS which serves as a source region, an n type diffusion layer MD which serves as a drain region, a floating gate FLG, a tunnel oxide film FTO, an interlayer insulating film INTP, a memory gate electrode MG (material: n type polysilicon) for applying a high voltage upon writing/erasure, an oxide film CAP for protection of the memory gate electrode MG, a gate oxide film STOX for a selection MOS type transistor, a selection gate electrode SG made of n type polysilicon, and an insulating film GAPDX for insulating the selection gate electrode SG and the memory gate electrode MG. The gate oxide film STOX is characterized in that the thickness of the gate oxide film STOX is fabricated thinner than that of the insulating film GAPDX and that of a high-voltage MOS type transistor for writing/erasure. The gate oxide film STOX and the insulating film GAPDX are respectively formed by other layers. The interlayer insulating film INTP may be a generally-used laminated structure of oxide film/nitride film/oxide film of silicon in a floating gate type.

FIG. 41 shows the operation of the cell disclosed in FIG. 40 and how to apply voltages thereto. Here, the injection of charges into the floating gate FLG is defined as write (Program). A write system indicates hot electron writing using source side injection. A voltage Vs applied to the source region MS is 5 volts. A voltage Vmg applied to the memory gate electrode MG is 10 volts. A voltage Vsg applied to the gate electrode SG of the selection MOS type transistor is made substantially identical to the threshold value of the MOS type transistor. A generation region of the hot electrons is a channel portion below a GAPDX region by which the two gate electrodes are isolated from each other, in a manner similar to FIG. 40.

In the case of ejection of charges from the floating gate FLG, which functions as an erase operation, such an electric field as to discharge or eject stored charges (electrons) toward the p type well region PWEL is generated. When the potential difference is set as 20V, for example, the voltage Vmg applied to the memory gate electrode MG is set to −20 volts, and the voltage Vwell applied to the p type well region PWEL is set to 0. Alternatively, the voltage Vmg applied to the memory gate electrode MG is set to −10 volts, the voltage Vwell applied to the p type well region PWEL is set to 10V, and the voltage Vsg applied to the gate electrode SG is set to 10 volts. The voltage Vsg applied to the gate electrode SG is a voltage necessary to eliminate the difference in potential between the gate electrode SG and the p type well region PWEL and avoid damage of the gate oxide film STOX.

If the voltage to the source/drain at reading is applied in the direction opposite to that at writing where the operating voltage of mixed core logic is 1.8 volts, then the voltage Vs applied to the source region MS is set to 0 volt, the voltage Vs applied to the drain region MD is set to 1.8 volts, and the voltage Vsg applied to the gate electrode SG is set to 1.8 volts. If, at this time, the threshold value of a memory in an erase state is set enough lower than 0, then the voltage Vmg applied to the memory gate electrode MG can be read at 0 volt. In the case of forward reading, the voltage Vd applied to the drain region MD may be set to 1.8 volts and the voltage Vs applied to the drain region MS may be set to 0. As one having a high potential for being mixed in addition to the core logic, is mentioned, MOS type transistors for I/O each of which handles a signal inputted from outside and outputted to the outside. They cope with voltages higher than those handled by the core logic, e.g., 3.3 volts, 2.5 volts, etc. The thickness of a gate insulating film of each of these MOS type transistors for I/O is thinner than the insulating film GAPDX. In the case of 3.3 volts, the thickness thereof is approximately 8 nanometers, whereas in the case of 2.5 volts, the thickness thereof is about 6 nanometers. Since the thickness thereof is thinner than that of the insulating film GAPDX that needs a high withstand voltage, these may be adopted as the thickness of the gate oxide film STOX. As read voltages to be applied, may be used 1.8 volts mentioned previously, or 3.3 volts or 2.5 volts for I/O.

Figure 42:
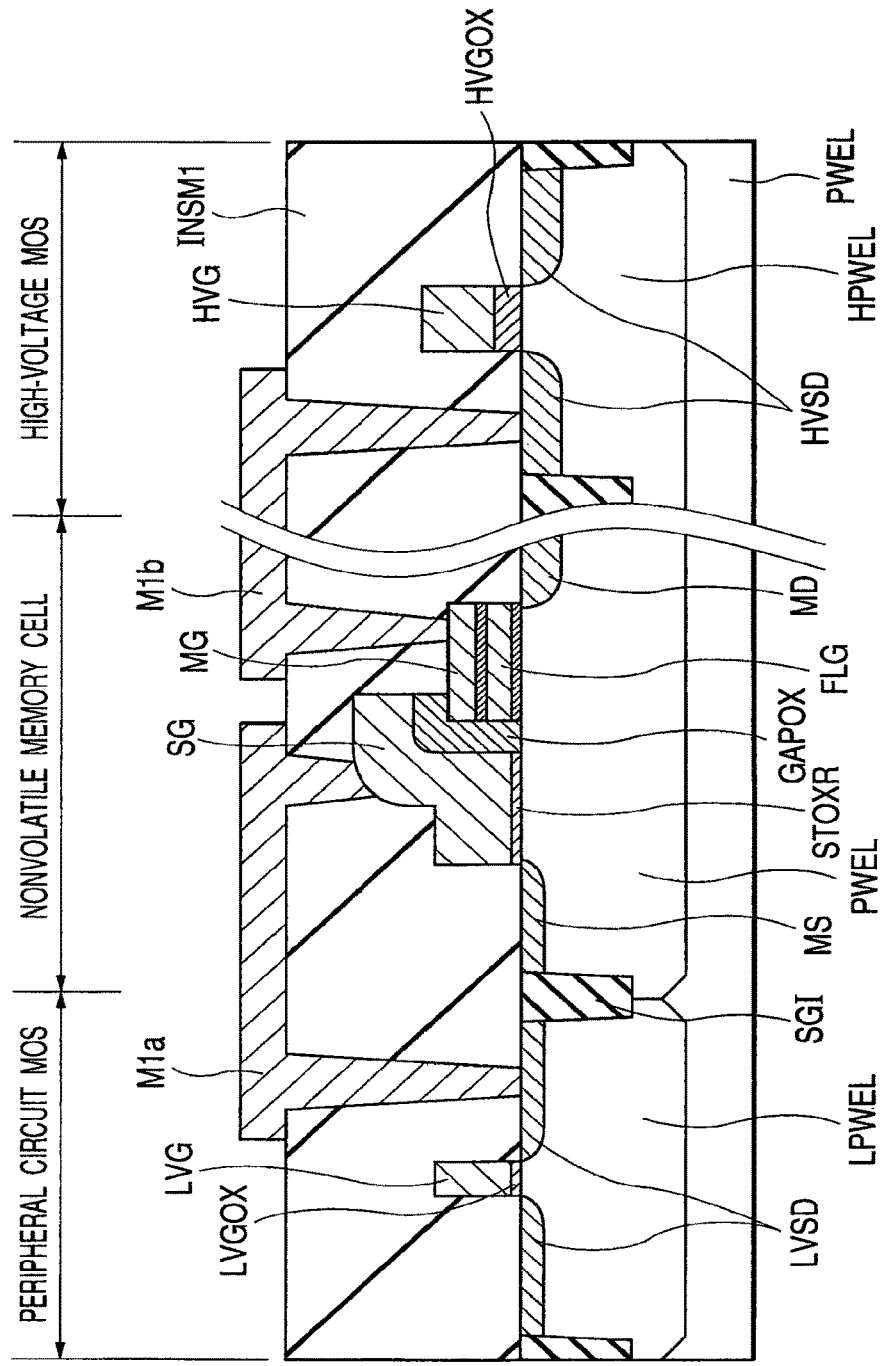
FIG. 42 is a cross-sectional view showing a state in which the memory cell according to the first embodiment of the present invention is mixed with other MOS transistors.

Both the memory cell illustrative of the first embodiment shown in FIG. 40 and other MOS type transistors mixed therein are shown in FIG. 42 in sectional structure. Those newly added to the sectional structure of FIG. 42 as notation are device isolation regions SGI, a p type well LPWEL for a core logic n MOS type transistor (Core Logic MOS), a gate oxide film LVGOX thereof, a gate electrode LVG thereof, a source/drain region LVSD thereof, a p type well HPWEL for a write/erase high-voltage MOS type transistor, a gate oxide film HVGOX thereof, a gate electrode HVG thereof, a source/drain region HVSD thereof, a wiring interlayer insulating film INSM1, a wiring M1a for supplying a low output voltage of the core logic MOS type transistor to the selection gate electrode SG within a first wiring layer, and a wiring M1b for supplying a high output voltage of the write/erase MOS type transistor to the memory gate electrode MG. Although an upper wiring further exists in practice, it is omitted in the present figure.

If the gate oxide films STOX, LVGOX and HVGOX, and a tunnel oxide film FTO are all defined as a silicon oxide film and the physical thicknesses of those are respectively defined as tS, tL, tH and tF, then the relationship of tL≤tS<tF<tH is established in the nonvolatile memory device according to the present invention. Although the description of a sectional view of the MOS type transistor for I/O is omitted, the relationship of tL<tIO<tF is established if the thickness of its gate insulating film is defined as tIO. Even if the same thickness as the thickness tIO is adopted as the thickness tS, the relationship of tL≤tS<tF<tH is maintained and is capable of falling into the scope of the present invention. If theses films are not constituted of the silicon oxide film alone, e.g., a nitride film is used in part thereof, then the thickness relationship that characterizes the present invention can be generalized down to the electrical thickness from the physical thickness. Because the structure and thickness of the gate insulating film are set corresponding to the respective applied voltages and match with the feature of the present invention in which a thickness constitution based thereon is applied even to a cell structure.

Speaking of other feature of the present invention in terms of the relationship of connection between the MOS type transistor and the memory cell, the selection gate electrode SG and the source/drain region LVSD of the MOS type transistor for the core logic are directly connected to each other by the wiring layer M1$a$, and the memory gate electrode MG and the source/drain region HVSD of the write/erase MOS type transistor are directly connected to each other by the wiring layer M1$b$.

Figures 43, 44:
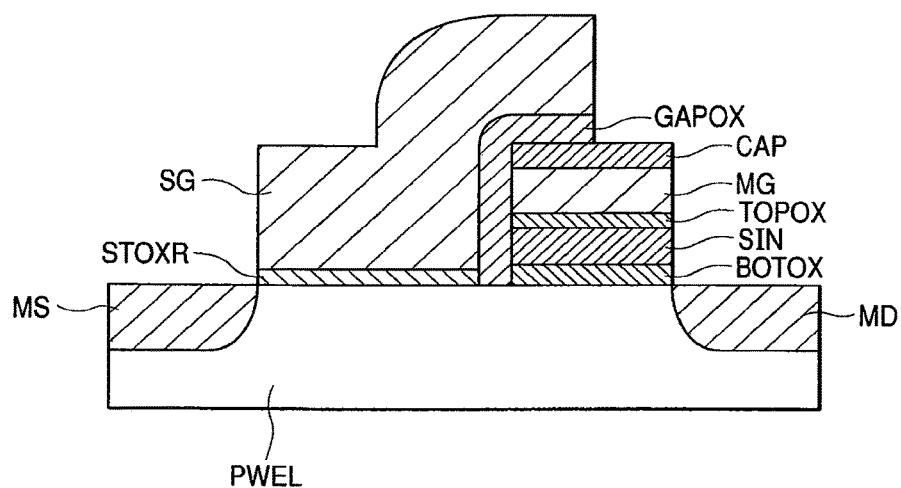
FIG. 43 is a cross-sectional view of a memory cell according to a second embodiment of the present invention.
FIG. 44 is a diagram for describing the operation of the memory cell according to the second embodiment of the present invention and voltages applied thereto.

FIG. 43 is a cross-sectional view showing a second embodiment where the present invention is applied to a MONOS type memory cell that performs discrete charge storage. FIG. 43 is different from FIG. 40 in that a laminated structure is configured wherein the charge storage region results in a nitride film SIN of silicon, an oxide film BOTOX is formed just below the nitride film SIN, and an oxide film TOPDX is formed just above the oxide film BOTOX. The thickness of the nitride film SIN is set to less than or equal to 50 nanometers. Assuming that the thickness of the oxide film TOPDX is defined as tT and the thickness of the oxide film BOTOX is defined as tB, both tT and tB are set so as to reach a relationship of tB>tT where stored charges are pull out via the oxide TOPDX, whereas both tT and tB are set so as to reach a relationship of tB<tT where the stored charges are pulled out via the oxide film BOTOX. The relationship of the film thickness described in FIG. 42, i.e., tL≤tS<tF<tH is similar in either case. While the silicon nitride film has been illustrated by way of example as the charge storage layer in the present embodiment, the present invention can be applied even in the case of other insulating trap film, e.g., alumina or the like.

FIG. 44 shows the operation of the cell disclosed in FIG. 43 and how to apply voltages thereto. FIG. 44 is basically identical to FIG. 41 but the voltage Vmg applied to the memory gate electrode MG is set to 12 volts where electrical charges are ejected toward the memory gate electrode MG and erased. This is a voltage applying method where the thickness of the oxide film BOTOX is thicker than that of the oxide film TOPDX. The voltage Vmg applied to the memory gate electrode MG is set to −12 volts where electrical charges are discharged into the p type well region PWEL and erased. This is a voltage applying method where the thickness of the oxide film BOTOX is thinner than that of the oxide film TOPDX. Incidentally, the absolute value 12 volts of the erase voltage is shown as one example. The present invention is not limited by this numerical value.

Figure 45:
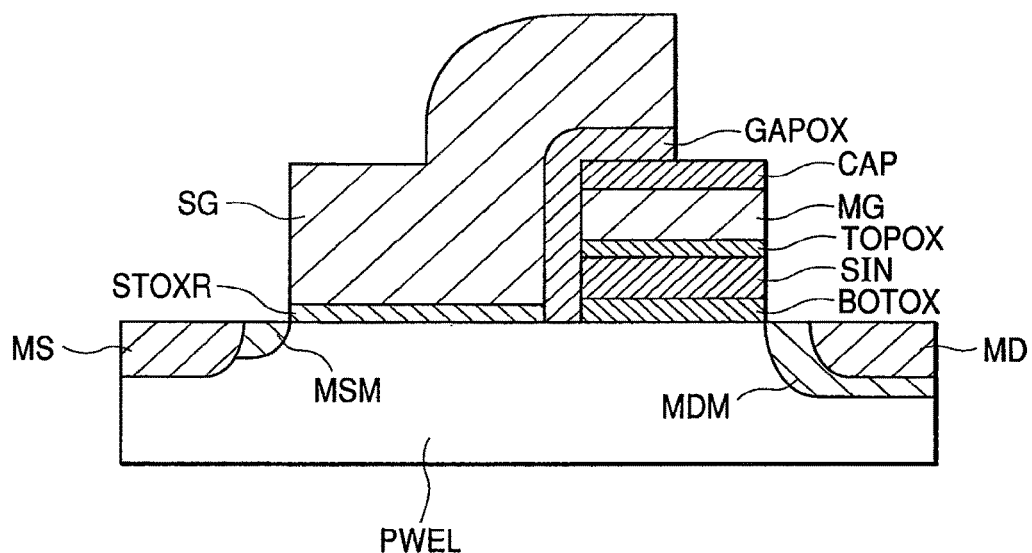
FIG. 45 is a cross-sectional view of a modification of the memory cell according to the second embodiment of the present invention.

FIG. 45 illustrates by way of example a source/drain structure employed in the memory cell shown in FIG. 43. As a premise, the operating voltages correspond to the write, erase and reverse read shown in FIG. 44. In this case, the junction withstand voltage of the drain may be identical to a 1.8V-operated CMOS (MOS type transistor for core logic).

Accordingly, a drain region can adopt the same structure as one for core logic. That is, the drain region is configured as an LDD structure comprising a low density region MDM and a high density region MD and can be shared with a source/drain region of the MOS type transistor for the core logic. Thus, since a short channel effect of a selection MOS type transistor can be suppressed, its gate length can be shortened. This is fit to obtain a large read current under a low voltage. On the other hand, the drain region to which a high voltage is applied upon writing, cannot make use of the same structure as the source/drain region of the core logic transistor and hence results in a double drain structure comprising a high-density region MS and a diffusion layer MSM for an improvement in withstand voltage. A source region thereof can also be shared with a source/drain region of a high-voltage MOS type transistor for write/erase voltage control, and may be configured as a structure dedicated for the memory cell as needed.

Figure 46:
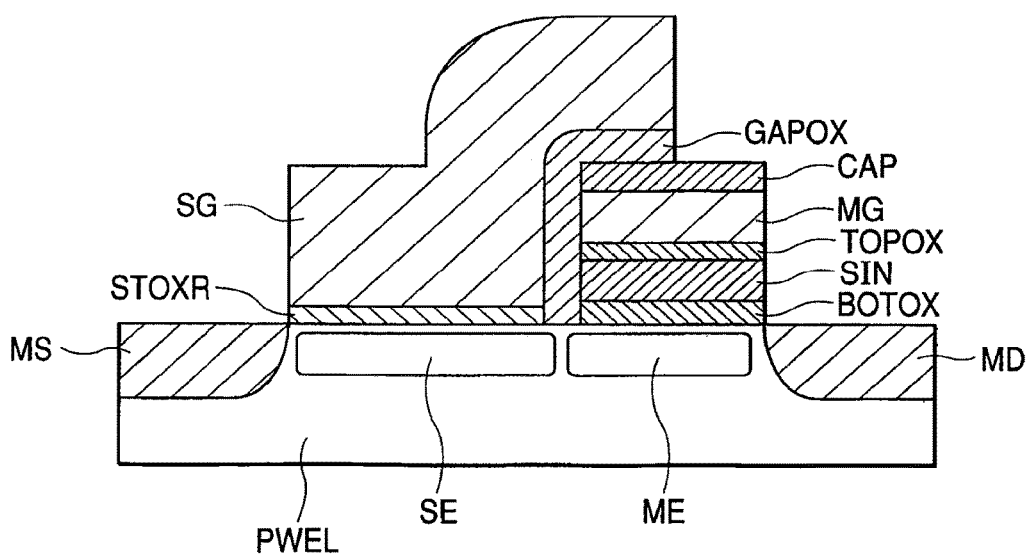
FIG. 46 is a cross-sectional view showing the difference in channel density in the memory cell according to the second embodiment of the present invention.

FIG. 46 shows the difference in channel density between the selection MOS type transistor and memory MOS type transistor in the memory cell shown in FIG. 43. In order to secure a large read current under a low voltage, the lower the threshold value of the MOS type transistor the better. However, when the threshold value of the selection MOS type transistor becomes extremely low, the selection MOS type transistor is not turned off perfectly even where its gate voltage is 0. This leads to the fact that a leak current inhibits a normal read operation. Accordingly, the threshold value of the selection MOS type transistor may preferably be low within a positive range. On the other hand, there is a need to sufficiently lower the threshold value of the memory MOS type transistor in order to set the read current high. In order to enable long-time storage of charges, the voltage of the memory gate electrode MG at reading may preferably be set to 0 volt. Thus, if a premise is made that no leak occurs in the selection MOS type transistor, then there is a need to make negative the threshold value of the memory MOS type transistor placed in an erase state.

The conventional floating gate type is capable of obtaining a sufficient low threshold value by increasing an erase voltage or applying the erase voltage for a long period of time. However, the memory cell using the trap-acting film as in the present embodiment has the characteristic that the threshold value is not reduced to a constant value or less. Therefore, it should be necessary to adjust the channel density and set low the original threshold value in order to lower the threshold value of the memory MOS type transistor. If a channel impurity density is set such that a neutral threshold value becomes negative, then the post-erasure threshold value can be also made negative. If such a setting is done, then a large read current value can be obtained when the selection MOS type transistor is turned on to read a signal. Accordingly, the difference must be inevitably provided between the impurity density of a channel region SE of the selection MOS type transistor and the impurity density of a channel region ME of the memory MOS type transistor. If a comparison is made between a p type impurity density Nse of the channel region SE and a p type impurity density Nme of the channel region ME in the case of the memory cell formed on the p type well region PWEL as shown in FIG. 46, then the respective impurity densities are set such that.the relationship of Nse>Nme is established. Alternatively, the p type impurity densities are set identical but an n type impurity density of the ME region is set higher than an n type impurity density of the SE region. The difference in density is one of the essential points of the present invention, which aims to obtain a large read current under a low voltage.

Incidentally, since the amount of change in threshold value is suppressed low in an uncontrolled state where the threshold value of the memory MOS type transistor is set negative upon the use of the conventional floating gate type, there is a need to suppress low the neutral threshold value of the memory MOS type transistor. When the voltage of the memory gate electrode MG is set to 0 upon reading, the neutral threshold value thereof may also preferably be set negative. Accordingly, the above-described essential point is established regardless of a charge storing method for the memory MOS type transistor.

Figure 47:
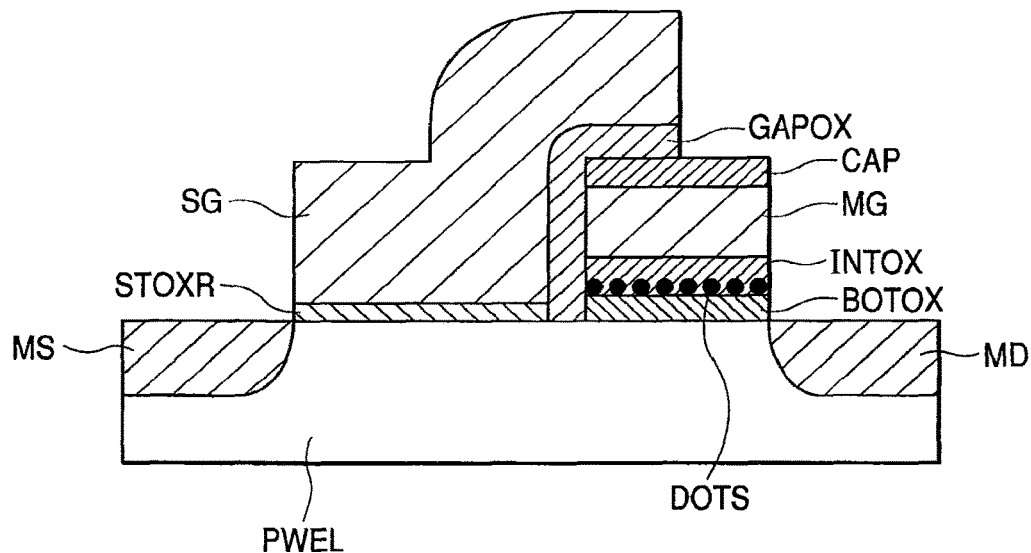
FIG. 47 is a cross-sectional view of a memory cell according to a third embodiment of the present invention.

FIG. 47 is a cross-sectional view showing a third embodiment where the present invention is applied to a memory cell using fine particles as a charge storage portion. Fine particles DOTS are provided on an underbedding oxide film BOTOX. As the material of each fine particle DOTS, may be mentioned polysilicon. Another material may be used. The diameter of the particle may preferably be 10 nanometers or less. An interlayer insulating film INTOX is deposited so as to cover up the fine particles DOTS, and a memory gate electrode MG is mounted just thereabove. The charge storage portion may be considered to be equal to a charge storage film having a trap property in that it becomes discrete. Accordingly, the contents of the present invention described up to now can be applied in any combination thereof or all combination thereof.

The relationship of tL≤tS<tH and the cell structure corresponding to the gist of the present invention have been described above. A specific manufacturing method will be explained below with reference to a sectional view showing a fourth embodiment of FIG. 48. Disclosed herein is a sectional structure wherein a sidewall spacer GAPSW formed by anisotropic dry etching is used as the insulating film GAPDX for insulating the selection gate electrode SG and memory gate electrode MG employed in the second embodiment. The sidewall spacer GAPSW is formed by a technique similar to a method for forming a sidewall spacer used where an LDD (Lightly Doped Drain) structure of a diffusion layer employed in a normal MOS type transistor is formed. However, an oxide film formed immediately after dry etching is reduced in withstand voltage due to etch damage. Since the applied voltage is low and there are not provided electrodes adjacent via the sidewall spacer in the case of the normal CMOS, the reduction in withstand voltage becomes almost trivial. However, when the sidewall spacer is used as the insulating film GAPDX for isolating the selection gate electrode SG and the memory gate electrode MG from each other, it is necessary to ensure a withstand voltage of about 15 volts. It is thus essential to carry out an annealing process in an oxygen atmosphere for the purpose of an improvement in withstand voltage prior to deposition of polysilicon used as the selection gate electrode SG after a silicon oxide film deposited over the whole surface is etchbacked by anisotropic dry etching to form the sidewall spacer GAPSW. This is a process indispensable to the realization of the memory cell structure according to the present embodiment.

Figure 48:
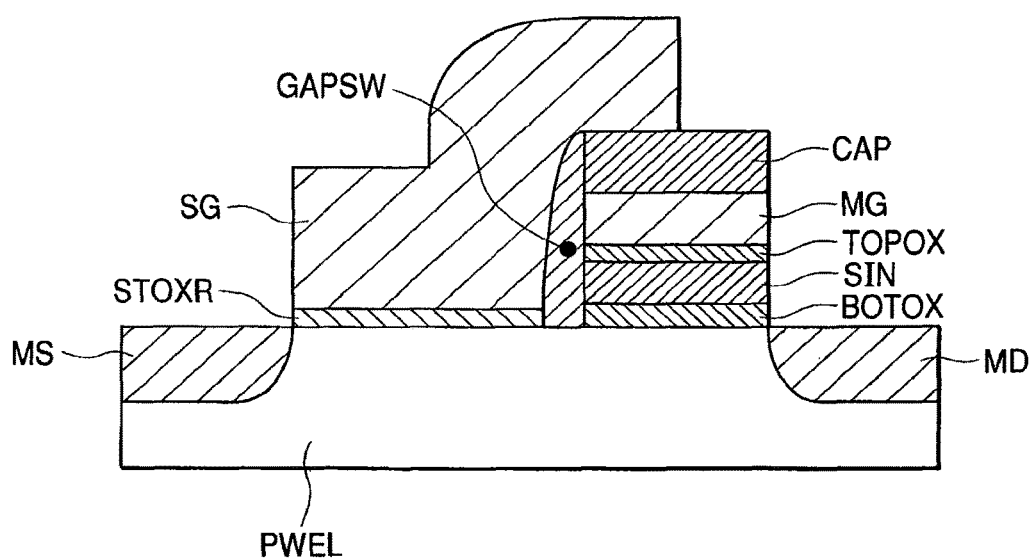
FIG. 48 is a cross-sectional view of a memory cell according to a fourth embodiment of the present invention.
Figure 49:
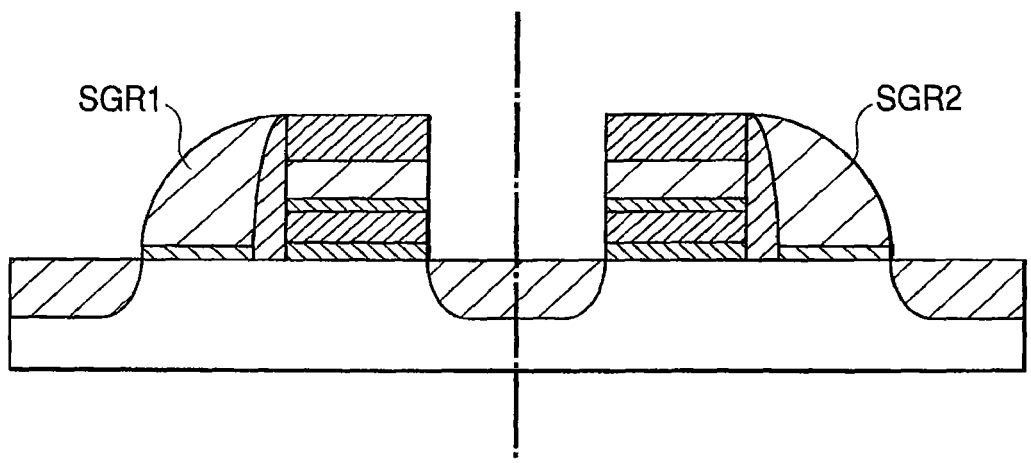
FIG. 49 is a cross-sectional view of a memory cell according to a fifth embodiment of the present invention.

FIG. 49 is a cross-sectional view of a fifth embodiment wherein the gate electrodes of the selection MOS type transistors each shown in FIG. 48 are configured as a structure self-aligned with a memory section. This structure is one formed by depositing a gate electrode material (e.g. polysilicon) over the whole surface and effecting an anisotropic dry etching process on it. Gate electrodes of selection MOS type transistors formed by such a technique correspond to SGR1 and SGR2 in the drawing. They are different in shape from the gate electrode SG of FIG. 48 having the same function but the difference therebeween resides in that point alone. That is, the relationship of tL≤tS<tH and the like corresponding to the gist of the present invention remains unchanged.

Cross-sectional views related to a manufacturing process at the time that the above memory cell according to the present invention and other MOS type transistors are mixed, are disclosed in FIGS. 50 through 56.

Figure 50:
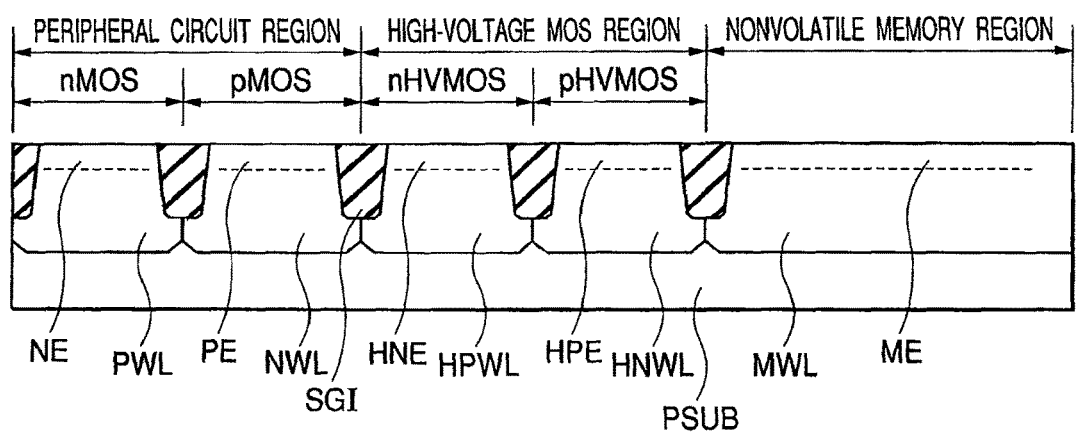
FIG. 50 is a first cross-sectional view related to a process for manufacturing a semiconductor integrated circuit in which a memory cell according to the present invention is mixed with other MOS type transistors.

FIG. 50 will first be explained. Device isolation oxide film regions SGI are formed over a p type silicon substrate PSUB to form a p type well PWL for an n type MOS type transistor (nMOS) for core logic, an n type well NWL for a p type MOS type transistor (pMOS) for the core logic, a p type well HPWL for a high-voltage control n type MOS type transistor (nHVMOS) for writing/erasure, an n type well HNWL for a high-voltage control p type MOS type transistor (pHVMOS), and an n type well MWL for a memory cell region. Next, an impurity for controlling the threshold values of the respective MOS type transistors is introduced into regions which serve as channel surfaces. Consequently, an nMOS impurity layer NE, a pMOS impurity layer PE, an nHVMOS impurity layer HNE, a pHVMOS impurity layer HPE, and an impurity layer ME for a memory MOS type transistor are formed.

Figure 51:
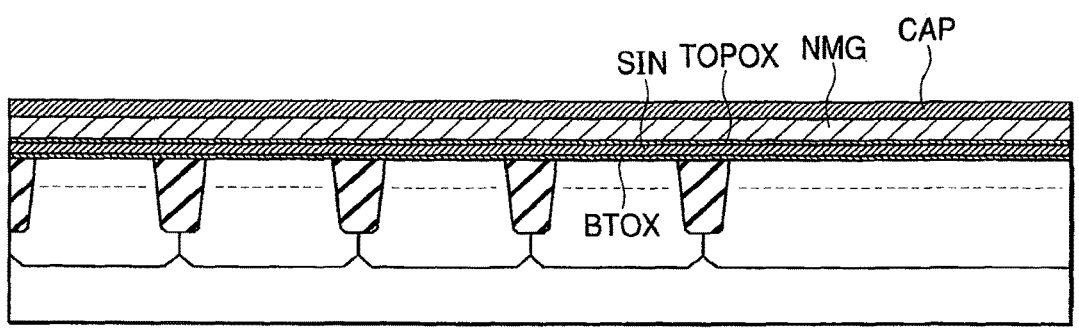
FIG. 51 is a second cross-sectional view related to the process for manufacturing the semiconductor integrated circuit in which the memory cell according to the present invention is mixed with other MOS type transistors.

FIG. 51 will next be described. The surface of the silicon substrate is cleanly processed. Afterwards, a lower oxide film BOTOX (5 nanometers) of the memory MOS type transistor is formed by thermal oxidation, and a silicon nitride film SIN (15 nanometers) is deposited just thereabove by a chemical vapor deposition method. Thereafter, the surface of the silicon nitride film SIN is subjected to thermal oxidation processing to thereby form an upper oxide film TOPDX (2 nanometers). Subsequently, an n type polysilicon layer NMG (100 nanometers) which serves as a memory gate electrode later, and a silicon oxide film CAP (100 nanometers) for protection of the memory gate electrode MG are sequentially deposited.

Figure 52:
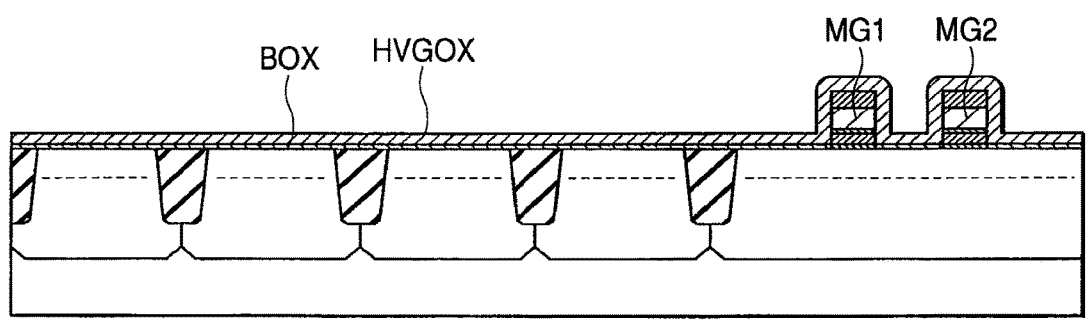
FIG. 52 is a third cross-sectional view related to the process for manufacturing the semiconductor integrated circuit in which the memory cell according to the present invention is mixed with other MOS type transistors.

FIG. 52 will next be explained. The laminated films BOTOX, SIN, TOPDX, NMG and CAP corresponding to the five layers formed over the silicon substrate in FIG. 51 are processed into shapes of gate electrodes MG1 and MG2 of the memory MOS type transistor using a photolithography technology and a dry etching technology. They are represented as linear shapes long in a depth direction as viewed in the figure. They exist by the same number as the number of word lines. However, only two lines are typically shown on the drawing. Upon processing, dry etching is stopped at the stage of exposure of the surface of the lower oxide film BOTOX, and the remaining lower oxide film BOTOX is removed by hydrofluoric acid. This is a method for preventing unwanted etching damage to the substrate surface. Owing to this hydrofluoric acid processing, the substrate surface is exposed. Subsequently, a thermal oxide film BOX (5 nanometers) is formed and a silicon oxide film HVGOX (15 nanometers) is deposited thereon. Afterwards, the oxide films corresponding to the two layers are provided for the gate oxide films of the high-voltage control MOS type transistors. Since only the mere deposited films degrade reliability, a laminated structure is adopted.

Figure 53:
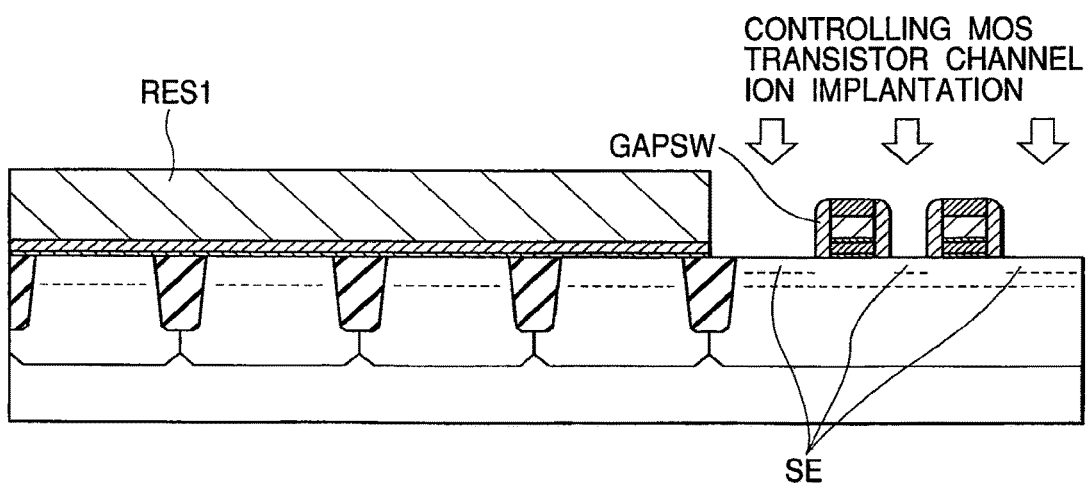
FIG. 53 is a fourth cross-sectional view related to the process for manufacturing the semiconductor integrated circuit in which the memory cell according to the present invention is mixed with other MOS type transistors.

FIG. 53 will next be explained. The resultant structure is processed by the photolithography technology to form a photoresist film RES1 which covers a region for forming the MOS type transistors for the core logic and a region for forming the high-voltage control MOS type transistors.

Thereafter, the oxide film that exists in the channel region of each selection MOS type transistor, is removed by an anisotropic dry etching technology effected on the silicon oxide film HVGOX to thereby expose the substrate surface. According to this process, sidewall spacers GAPSW obtained by processing the silicon oxide film HVGOX is also formed simultaneously on each selection MOS type transistor side of the memory MOS type transistor. Subsequently, an impurity layer SE for threshold-value control is formed in the channel region of each selection MOS type transistor while the photoresist film RES1 is being left behind. The impurity densities of the impurity layer SE and the impurity layer ME satisfy the relationship disclosed in FIG. 46.

Figure 54:
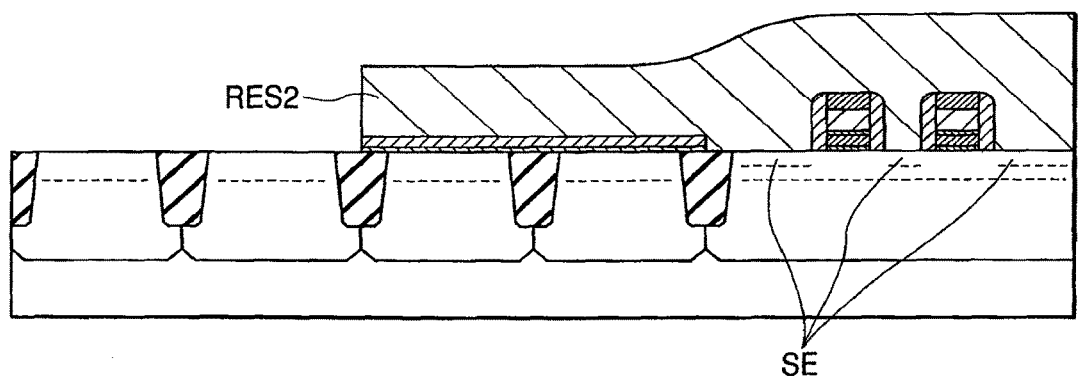
FIG. 54 is a fifth cross-sectional view related to the process for manufacturing the semiconductor integrated circuit in which the memory cell according to the present invention is mixed with other MOS type transistors.

FIG. 54 will next be explained. A photoresist film RES2 is processed by the photolithography technology to open only the region for forming the core-logic MOS type transistors. Afterwards, the oxide films of the laminated structure comprising the thermal oxide film BOX and the silicon oxide film HVGOX are perfectly removed by the hydrofluoric acid processing.

Figure 55:
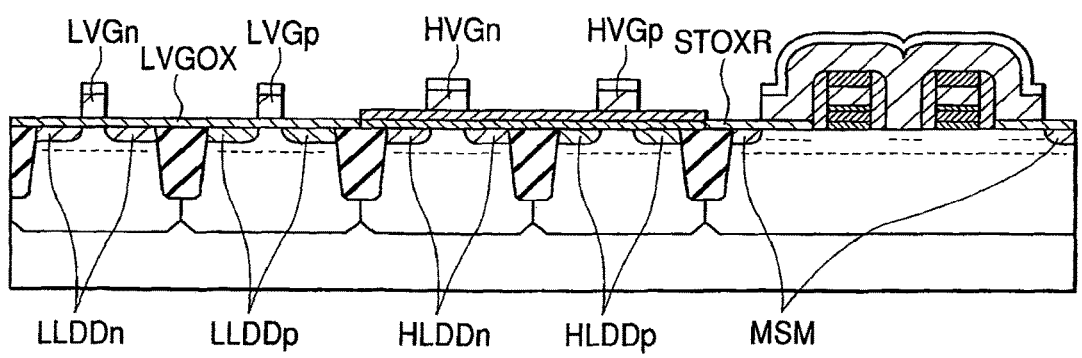
FIG. 55 is a sixth cross-sectional view related to the process for manufacturing the semiconductor integrated circuit in which the memory cell according to the present invention is mixed with other MOS type transistors.

FIG. 55 will next be described. After the photoresist film RES2 described in the previous drawing has been removed and the cleaning process has been completed, a thermal oxide film (4 nanometers) is formed over the exposed silicon substrate surface (core-logic MOS type transistor section and selection MOS type transistor section). The thermal oxide film results in a gate oxide film LVGOX for the core-logic MOS type transistors and a gate oxide film STOX for each selection MOS type transistor. Although the respective gate oxide films for the core-logic MOS type transistors and the selection MOS type transistors are indicated as separate symbols LVGOX and STOX in the present drawing for convenience, the thicknesses of the two become identical if the present manufacturing method is taken. Subsequently, a non-doped polysilicon film (150 nanometers) is deposited over the whole surface. Afterwards, impurities are introduced into the polysilicon film in such a manner that an n type is formed on each of the regions for forming the nMOS and nHVMOS, and a p type is formed on each of the regions for forming the pMOS and pHVMOS. The densities of the impurities are respectively set to $1 \times 10^{20}/cm^3$ or more. Subsequently, a silicon oxide film (20 nanometers) is deposited over the whole surface. Afterwards, the laminated film of the polysilicon film and the silicon oxide film is processed using the photolithography technology and the dry etching technology to thereby form a gate electrode LVGn for the nMOS, a gate electrode LVGp for the pMOS, a gate electrode HVGn for the nHVMOS, and a gate electrode HVGp for the pHVMOS. At this time, only the end of the gate electrode on the source side of each selection MOS type transistor is processed in the memory region. A gate length in a 0.18 μ-generation results in, for example, 0.15 micron in the core-logic MOS type transistors and 1.0 micron in the high-voltage control MOS type transistors HVMOS. This is however a necessary consequence due to the fact that the voltages to be handled are different from one another. Subsequently, an n type source/drain LLDDn having a shallow junction for the nMOS, a p type source/drain LLDDp having a shallow junction for the pMOS, an n type source/drain HLDDp having a high withstand-voltage junction for the nHVMOS, and a p type source/drain HLDDp having a high withstand-voltage junction for the pHVMOS are appropriately formed by using the photolithography technology and an ion-implantation technology using impurity ions. These sources/drains should be designed on the assumption that junction withstand voltages sufficient for the voltages to be used are ensured. The core-logic MOS type transistors become higher than the high-voltage control MOS type transistors HVMOS in the density of each source/drain impurity introduced here. Although an n type diffusion layer MDM is formed at the drain of each selection MOS type transistor, the densities of the impurities for the n type diffusion layer MDM and the n type source/drain LLDDn can be made identical to each other according to the manufacturing method disclosed herein.

Figure 56:
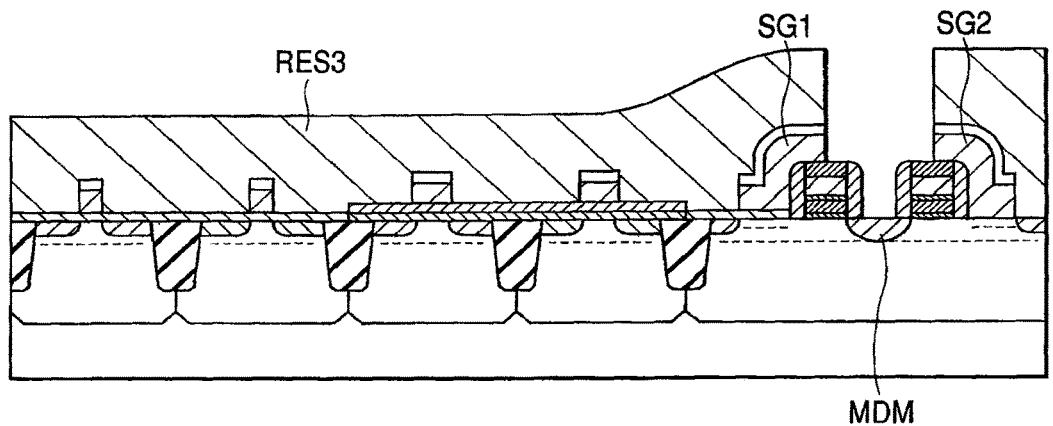
FIG. 56 is a seventh cross-sectional view related to the process for manufacturing the semiconductor integrated circuit in which the memory cell according to the present invention is mixed with other MOS type transistors.

FIG. 56 will next be explained. A drain region of the memory MOS type transistor is formed in the present drawing. A photoresist film RES3 having an opening with respect to the region used as the drain of the memory MOS type transistor and whose opening end is provided on the memory gate electrodes MG1 and MG2, is formed by a photolithography process. Afterwards, the laminated film of the polysilicon film and the silicon oxide film is processed by anisotropic dry etching to thereby form gate electrodes SG1 and SG2 of the two selection MOS type transistors. Subsequently, ion-implantation of an n type impurity is effected without removing the photoresist film RES3 to thereby form a source region MSM of the memory MOS type transistor.

Figure 57:
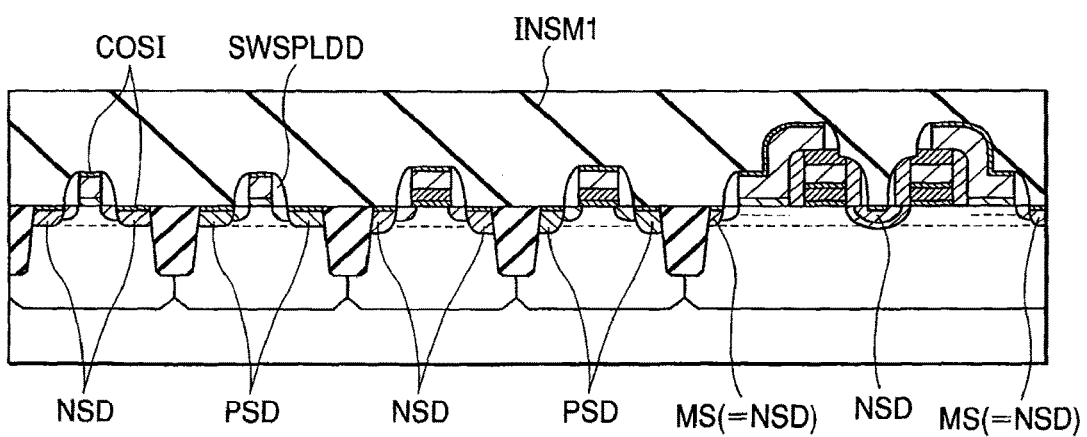
FIG. 57 is an eighth cross-sectional view related to the process for manufacturing the semiconductor integrated circuit in which the memory cell according to the present invention is mixed with other MOS type transistors.

FIG. 57 will next be described. A silicon oxide film (100 nanometers) is deposited over the whole surface and subsequently the anisotropic dry etching is effected on the whole surface. Owing to this processing, spacers SWS-PLDD are formed on their corresponding sidewalls of all the gate electrodes. High-density n type diffusion layers NSD and MS, and high-density p type diffusion layers PSD are respectively formed in sources/drains of all the n type transistors and sources/drains of p type transistors by ion implantation and heat treatment. Subsequently, the oxide films are removed from all the sources/drains NSD, MS and PSD and gate electrodes LVGn, LVGp, HVGn, HVGp, SG1 and SG2 to thereby expose silicon. A metal cobalt (10 nanometers) is deposited over the whole surface and subjected to heat treatment at 700° C. to thereby form a self-aligned cobalt silicide. Unreacted unnecessary cobalt is removed by cleaning, followed by execution of processing at 750° C. again, whereby a low-resistance cobalt silicide layer COSI is formed. Thereafter, an insulating oxide film INSM1 is deposited over the whole surface. A subsequent wiring process is allowed to use the conventional art.

Figure 58:
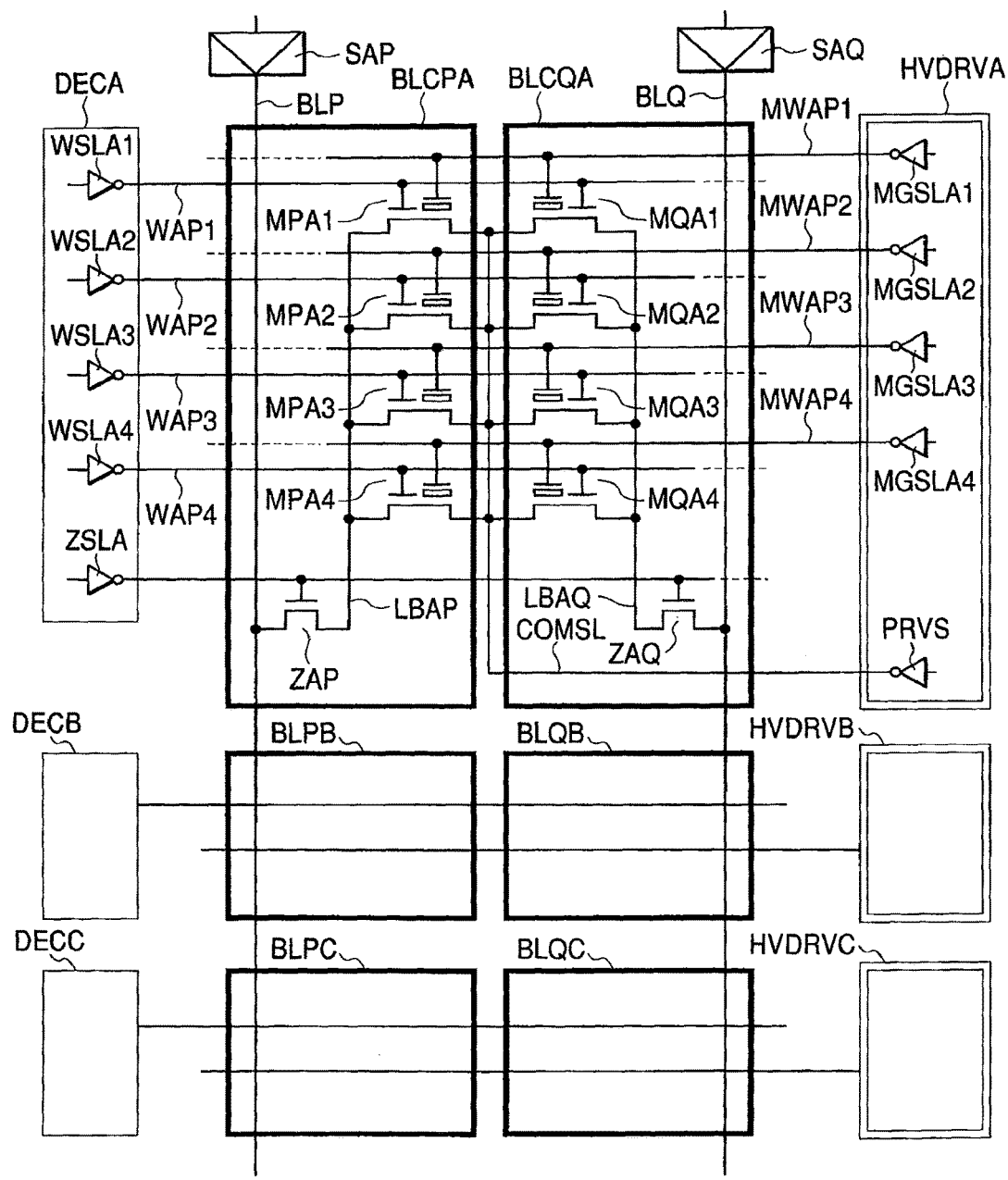
FIG. 58 is a circuit diagram illustrating by way of example a configuration of a memory array to which the memory cells each according to the present invention are applied.

FIG. 58 shows one embodiment of a memory array configured using a memory cell technology of the present invention. A basic configuration thereof is of a NOR type and takes a hierarchical bit line structure. In the present embodiment, two global bit lines are typically shown for simplification. A global bit line BLP is connected to a sense amplifier SAP. The global bit line BLP has branches to local bit lines. ZAP indicates a selection MOS type transistor for selecting a local bit line LBAP. A plurality of memory cells MPA1 through MPA4 are connected to the local bit line LBAP. Although four memory cells are typically shown in the figure, the number of memory cells to be connected might be sixteen, thirty-two or sixty-four. Selection MOS type transistors of the memory cells are connected to the local bit line LBAP. The selection MOS type transistor ZAP and the memory cells MPA1 through MPA4 are collectively referred to as a block BLCPA. In a block BLCQA arranged symmetrically with the block BLCPA, memory cells MQA1 through MQA4 are connected to a local bit line LBAQ, and ZAQ indicates a MOS type transistor for selecting them. A global bit line corresponding to the block BLCQA is designated at BLQ and connected to a sense amplifier SAQ. The selection MOS type transistors ZAP and ZAQ are MOS type transistors each having the same gate oxide-film thickness as each of the core-logic MOS type transistors. A driver for transmitting a signal to gate electrodes of the selection MOS type transistors ZAP and ZAQ is designated at ZSLA. The driver ZSLA is also constituted of a core-logic MOS type transistor. The gate electrodes of the cell selection MOS type transistors are connected to their corresponding word lines which extend across the blocks adjacent to each other in the horizontal direction. For example, the gate electrode of the cell selection MOS type transistor of the memory cell MPA1 that belongs to the block BLCP is connected to a word line WAP1, whereas the gate electrode of the cell selection MOS type transistor of the memory cell MPA2 that belongs to the block BLCQ is connected. One for selecting the word line WAP1 is a driver WSLA1. This also makes use of the core-logic MOS type transistor. Drivers WSLA2 through WSLA4 are associated with word lines WAP2 through word lines WAP4 in a one-to-one relationship. The drivers WSLA1 through WSLA4 and the driver ZSLA are collectively referred to as a driver group DECA. Memory gates also cross in the horizontal direction. MWAP1 is a wiring used in common with the memory gates of the memory cell MPA1 and the memory cell MQA1. In order to apply a high voltage upon writing/erasure, a driver MGSLA1 for supplying the voltage to the wiring MWAP1 is made up of a high-voltage MOS type transistor. Drivers MGSLA2 through MGSLA4 are associated with wirings MWAP2 through MWAP4 in a one-to-one relationship. There is a need to supply 5 volts to a wiring COMSL shared between the block BLCPA and the block BLCQA upon writing. This is done by a driver PRVS constituted of a high-voltage MOS type transistor. The drivers MSGLA1 through MSGLA4 and the driver PRVSA each comprising the high-voltage MOS type transistor are collectively referred to as a driver group HVDRVA. As shown in the figure, other blocks BLPB and BLQB are further connected to the global bit lines BLP and BLQ respectively. Driver groups DECB and HVDRVB corresponding to them exist. Similarly, blocks BLPC and BLQC, and driver groups DECC and HVDRVC exist. Upon reading, the individual drivers contained in the driver groups DECA through DECC select the word lines in accordance with addresses respectively. Since, however, these have performance equivalent to the core logic, the selected word line can be driven at high speed. Accordingly, the reading of information can be performed at high speed. This is a method of constituting the memory array corresponding to the memory cell structure of the present invention.

Figure 59:
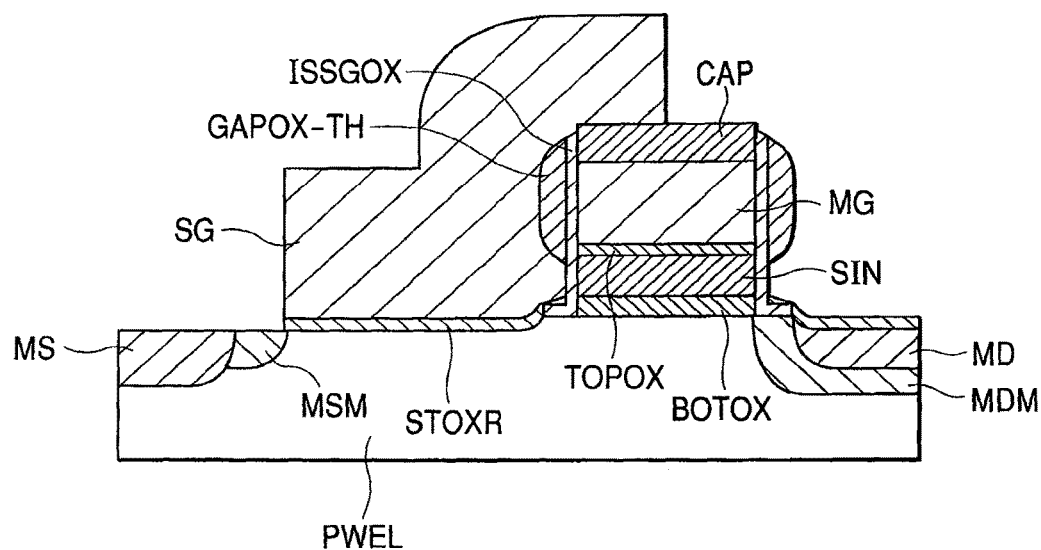
FIG. 59 is a cross-sectional view of a memory cell according to a sixth embodiment of the present invention.

FIG. 59 shows a structure for reducing capturing of electrons at writing into regions other than a trap film in a memory cell of the present invention. While the memory cell of the present invention is basically identical to the memory cell described up to now, the present memory cell is characterized by the shape of an insulating film isolating a selection gate electrode SG and a memory gate electrode MG from each other and its forming method. As shown in the drawing, the shape of the insulating film at a sidewall portion of MG, which isolates SG and MG from each other, is made thick at the sidewall portion of MG, and thin at a sidewall portion of the trap film SIN. The injection of electrons by source side/injection occurs in the vicinity of an MG end close to SG. However, it is not possible to avoid that some of the electrons are stored in the insulating film for separating SG and MG from each other. Since the region for its storage does not corresponds to the original electron storage portion, a necessary electric field cannot be applied upon erasure, so it is hard to discharge or eject the stored electrons. Consequently, there is a possibility that desired write and erase operations will be inhibited. Accordingly, this region corresponds to an allowable range of withstand voltages of SG and MG and may preferably be set as narrow as possible. Thickening only the thickness of the insulating film in the region in which the side surfaces of SG and MG are opposite to each other makes it possible to ensure withstand voltages for SG and MG without impairing the original write and erase operation.

Figure 60:
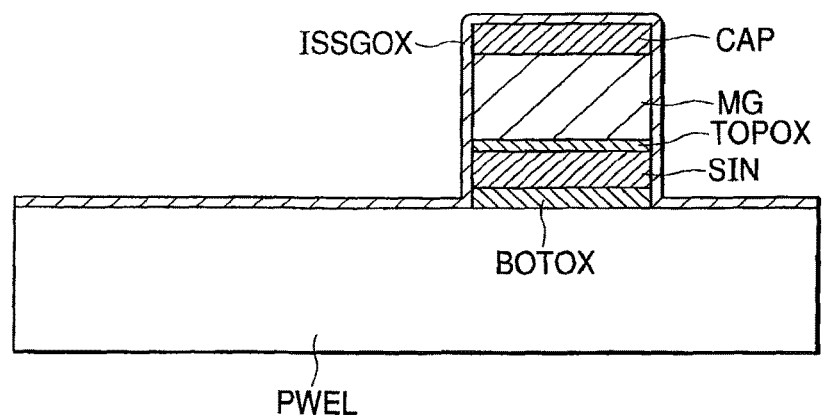
FIG. 60 is a first cross-sectional view related to a process for manufacturing the memory cell according to the sixth embodiment of the present invention.

A method of manufacturing the memory cell will be explained using FIGS. 60 through 62. In FIG. 60, MG is processed by anisotropic dry etching and thereafter an oxide film ISSGOX of abut 10 nanometers is adhered or bonded onto the whole surface by a method called ISSG oxidation. This oxidation method has been described in IEEE Electron Device Letters (IEEE ELECTRON DEVICE LETTERS), Volume 21, No. 9, September 2000, pp 430-432. This is a technology capable of forming a thin oxide film high in withstand voltage and quality. The present technology brings about one characteristic even in that oxide films equal in thickness can be formed not only over a silicon surface but also over the surface of a nitride film. An oxide film excellent in withstand voltage can be adhered even onto an exposed sidewall of a storage trap film.

Figure 61:
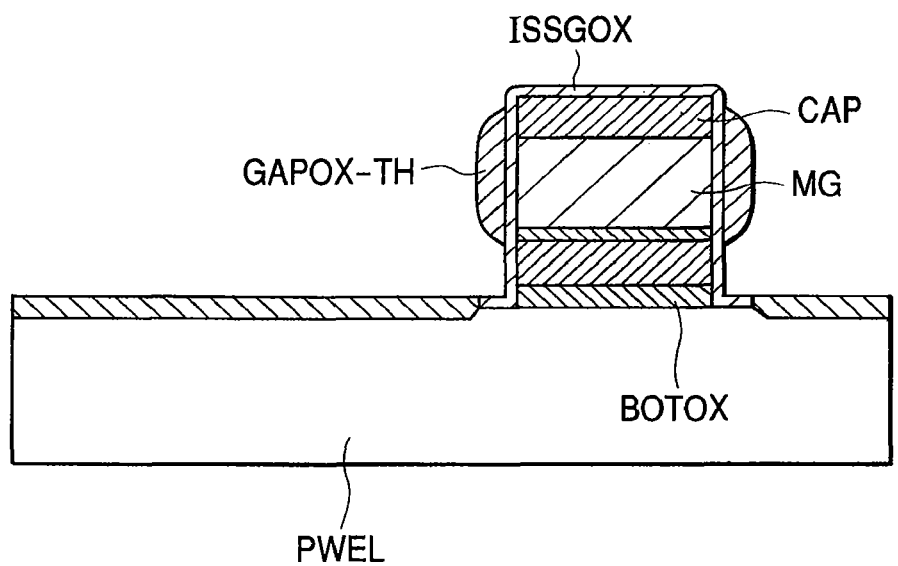
FIG. 61 is a second cross-sectional view related to the process for manufacturing the memory cell according to the sixth embodiment of the present invention.

FIG. 61 is a process following FIG. 60. Although thermal oxidation is added after ISSGOX has been adhered, SIN sidewalls are almost non-oxidized, and the sidewall of MG corresponding to polysilicon is oxidized thick. According to this process, the insulating film between SG and the storage trap film can be made thin, and the insulating film between SG and MG can be made thick.

Figure 62:
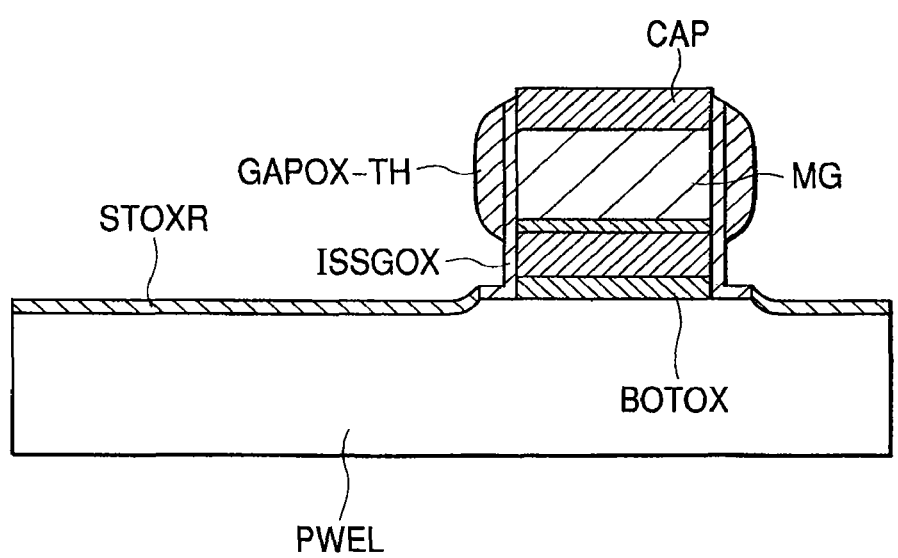
FIG. 62 is a third cross-sectional view related to the process for manufacturing the memory cell according to the sixth embodiment of the present invention.

FIG. 62 is a process following FIG. 61. The surface of the silicon substrate is also thermal-oxidized immediately after the formation of the shape of FIG. 61. When the oxide film is now anisotropically etched, only the oxide film formed over the substrate surface is removed, so that a thick oxide film GAPDX-TH of the MG sidewall can be left as a necessary insulating film shape. The surface of the silicon substrate is retreated by the removed thermal oxide film. Thereafter, a thin gate oxide film STOXR for a selection MOS type transistor may be thermally formed after a cleaning process. Subsequently, SG, a source (MSM and MS), and a drain (MDM and MD) may be formed sequentially. They are similar to other executed items of the present invention. Incidentally, the structure described with reference to FIGS. 59 through 62 can be used even when any of the floating gate, trap film and conductive fine particles is used.

Figure 63:
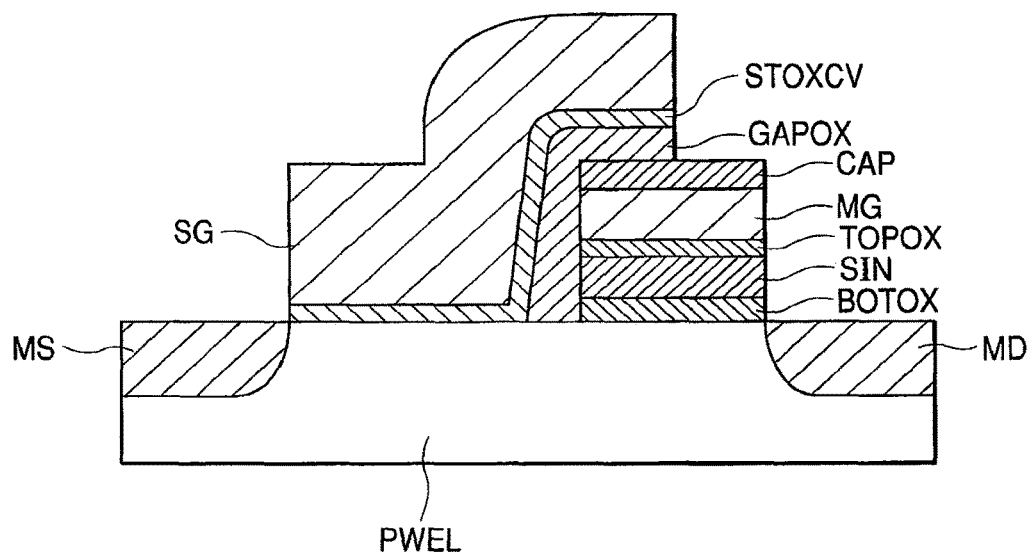
FIG. 63 is a cross-sectional view of a memory cell according to a seventh embodiment of the present invention.

FIG. 63 shows a handling method taken where a deposited oxide film is used for the gate insulating film of the selection MOS type transistor. A large amount of defects normally exist in the deposited oxide film and lead to unwanted charge storage and leak currents. A drawback arises in that when the deposited oxide film is used as the gate insulating film, reliability becomes significantly low. An article of Kamigaki et al. published in "Journal of Applied Physics in 1996" NO. 80, pp 3430 describes that a defect (E' center) in an oxide film can be reduced by heat treatment in an oxygen atmosphere, and an interface state (Pb center) can be reduced by high-temperature heat treatment in a hydrogen atmosphere. If this method is used where the gate insulating film of each selection MOS type transistor constituting the memory cell of the present invention is formed by the deposited oxide film, the selection MOS type transistor can be used as a high-reliable MOS type transistor. GAPDX may be formed using the etchback system described in FIG. 48. Thereafter, a deposited oxide film STOXCV is adhered onto the whole surface. The deposited oxide film STOXCV is provided for insulating the selection gate electrode SG and the memory electrode MG and simultaneously exists even just below SG. Further, the deposited oxide film STOXCV functions even as the gate insulating film of the selection MOS type transistor. A procedure for performing heat treatment in an oxygen atmosphere immediately after the adhering of the STOXCV and subsequently adhering and forming SG is executed. In the present invention, the heat treatment in the oxygen atmosphere, which is effected on the STOXCV, is defined as pyrogenic oxidation at 800° C. to 850° C. for 10 through 20 minutes. Thereafter, diffusion layers such as a source MS, a drain MD, etc. are formed. The high-temperature heat treatment in the hydrogen atmosphere may be performed at 700° C. to 750° C. With application of the heat treatment in the hydrogen atmosphere, electronic conductivity in a silicon nitride film can be significantly reduced. Thus, the system used in the present invention, for locally injecting the hot electrons into the trap film such as the nitride film and storing them therein results in a process important to prevent diffusion of electrons in the horizontal direction by a self-induced electric field. The heat treatment in the hydrogen atmosphere can achieve the most satisfactory effect by application of the heat treatment immediately before a wiring process in which other heat treatments at 700° C. have been all finished. While the STOXCV has been described as the deposited oxide film corresponding to one layer, it may take a laminated structure wherein a deposited oxide film is adhered after the formation of a thermal oxide film or ISSG oxide film.

While the invention made above by the present inventors has been described specifically based on the illustrated embodiments, the present invention is not limited to them. It is needless to say that various changes can be made thereto within the scope not departing from the gist thereof.

For example, the correspondence between the threshold voltage states and the write/erase states with respect to the nonvolatile memory cell is a relative concept, and the definition opposite to the above may be carried out.

It is needless to say that the state of the low threshold voltage of the nonvolatile memory cell is not limited to the depletion type and may be set to the enhancement type.

Further, the write, erase and read operating voltages may suitably be changed without being limited to ones described in FIG. 2. Upon the erase operation, no limitation is imposed on the form that the electrons in the charge storage region 11 are ejected toward the memory gate 14. The direction of the electric field at erasure is reversed and the electrons in the charge storage region 11 may be ejected toward the well region 2.

The bit lines may not adopt the constitution or structure in which they are hierarchized with respect to the global bit lines. The bit lines may be connected to the sense amplifier circuit or write circuit. Only any one of the sense amplifier circuit and the write circuit may be set to the above-described hierarchized structure. Further, the power supply voltage, write and erase high voltages, etc. may suitably be changed to further other voltages.

The film thickness in the ONO structure of the nonvolatile memory cell may take a combination of ones close to 3 nm (nano-meters), 26.5 nm and 0 nm rather than near the channel region or a combination of 5 nm, 10 nm and 3 nm.

INDUSTRIAL APPLICABILITY

The semiconductor device according to the present invention is not limited to a microcomputer in which a volatile memory is provided on-chip. The semiconductor device can be widely applied to a nonvolatile memory LSI such as a unitary flash memory, a further system on-chipped system LSI relatively large in logic scale, etc. In addition, the semiconductor device according to the present invention is applicable even to a memory card based on IDE (Integrated Device Electronics) using a nonvolatile memory, ATA (AT Attachment), etc.

The invention claimed is:

1. A semiconductor device comprising:
a semiconductor substrate;
a nonvolatile memory cell;
a switch MOS transistor; and
a bit line coupled the nonvolatile memory cell and the switch MOS transistor,
where the nonvolatile memory cell includes:
a gate structure disposed over a main surface of the semiconductor substrate,
a first semiconductor region formed in the main surface of the semiconductor substrate, and
a second semiconductor region formed in the main surface of the semiconductor substrate,
wherein the gate structure has a control gate electrode, and a memory gate electrode disposed next to the control gate electrode,
wherein the first semiconductor region is positioned adjacent to the control gate electrode of the gate structure,
wherein the second semiconductor region is positioned adjacent to the memory gate electrode of the gate structure,
wherein the switch MOS transistor is electrically connected to the first semiconductor region through the bit line,
wherein the memory gate electrode is disposed over the main surface of the semiconductor substrate via a first insulating film,
wherein the switch MOS transistor has a first gate electrode disposed over the main surface of the semiconductor substrate via a second insulating film, and
wherein the second insulating film has a thickness less than a thickness of the first insulating film.

2. A semiconductor device according to claim 1,
wherein the control gate electrode is disposed over the main surface of the semiconductor substrate via a third insulating film, and
wherein the third insulating film has the thickness less than a thickness of the first insulating film.

3. A semiconductor device according to claim 1, wherein the first insulating film includes a charge trap insulating film.

4. A semiconductor device according to claim 3, wherein the first insulating film includes a silicon nitride film.

5. A semiconductor device according to claim 1, wherein the first insulating film includes:
a charge trap insulating film,
a fourth insulating film disposed between the memory gate electrode and the charge trap insulating film, and
a fifth insulating film disposed between the charge trap insulating film and the main surface of the semiconductor substrate.

6. A semiconductor device according to claim 1, further including:
a source line electrically connected to the second semiconductor region;
a control gate control line electrically connected to the control gate electrode;
a memory gate control line electrically connected to the memory gate electrode;
a first driver which drives the control gate control line;

a second driver which drives the memory gate control line;
a third driver which drives the first gate electrode of the switch MOS transistor; and
a fourth driver which drives the source line,
wherein the first driver and the third driver use a first voltage as an operating power supply, and the second driver and the fourth driver use a second voltage higher than the first voltage as an operating power supply.

* * * * *